(12) United States Patent
Misaki

(10) Patent No.: US 11,342,666 B2
(45) Date of Patent: May 24, 2022

(54) TFT SUBSTRATE, SCANNING ANTENNA PROVIDED WITH TFT SUBSTRATE, AND METHOD FOR MANUFACTURING TFT SUBSTRATE

(71) Applicant: Sharp Kabushiki Kaisha, Sakai (JP)

(72) Inventor: Katsunori Misaki, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 473 days.

(21) Appl. No.: 16/488,692

(22) PCT Filed: Feb. 20, 2018

(86) PCT No.: PCT/JP2018/006013
§ 371 (c)(1),
(2) Date: Aug. 26, 2019

(87) PCT Pub. No.: WO2018/159389
PCT Pub. Date: Sep. 7, 2018

(65) Prior Publication Data
US 2021/0273331 A1    Sep. 2, 2021

(30) Foreign Application Priority Data
Feb. 28, 2017 (JP) .............................. JP2017-037140

(51) Int. Cl.
*H01L 23/66* (2006.01)
*H01Q 3/34* (2006.01)
(Continued)

(52) U.S. Cl.
CPC .............. *H01Q 3/34* (2013.01); *H01L 23/544* (2013.01); *H01L 23/66* (2013.01); *H01L 27/124* (2013.01);
(Continued)

(58) Field of Classification Search
CPC ........... H01Q 3/34; H01L 23/66; H01L 27/12; H01L 29/66765; H01L 29/78669; H01L 2223/6677
See application file for complete search history.

(56) References Cited

U.S. PATENT DOCUMENTS 7,466,269 B2    12/2008    Haziza
7,847,894 B2    12/2010    Rho
(Continued)

FOREIGN PATENT DOCUMENTS

JP    2002-217640 A    8/2002
JP    2007-116573 A    5/2007
(Continued)

OTHER PUBLICATIONS

Stevenson et al., "Rethinking Wireless Communications: Advanced Antenna Design using LCD Technology", SID 2015 Digest, 55.2, 2015, pp. 827-830.
(Continued)

*Primary Examiner* — Hasan Z Islam
(74) *Attorney, Agent, or Firm* — Keating & Bennett, LLP

(57) ABSTRACT

A TFT substrate includes a transmission and/or reception region including a plurality of antenna unit regions, and a non-transmission and/or reception region located in a region other than the transmission and/or reception region. Each of the antenna unit regions U includes a TFT and a patch electrode electrically connected to a drain electrode of the TFT. The TFT substrate includes a gate metal layer including a gate electrode of the TFT, a gate insulating layer, a source metal layer including a source electrode of the TFT and the drain electrode, a first insulating layer, a patch metal layer including the patch electrode, a second insulating layer, and an upper conductive layer. The upper conductive
(Continued)

layer includes a patch drain connection section electrically connected to the patch electrode and the drain electrode.

18 Claims, 38 Drawing Sheets

(51) Int. Cl.
*H01L 23/544* (2006.01)
*H01L 27/12* (2006.01)
*H01L 29/66* (2006.01)
*H01L 29/786* (2006.01)
*H01Q 9/04* (2006.01)
*G02F 1/1345* (2006.01)
*G02F 1/1368* (2006.01)

(52) U.S. Cl.
CPC ...... *H01L 27/1222* (2013.01); *H01L 27/1255* (2013.01); *H01L 27/1259* (2013.01); *H01L 29/66765* (2013.01); *H01L 29/78669* (2013.01); *H01Q 9/0407* (2013.01); *G02F 1/1368* (2013.01); *G02F 1/13454* (2013.01); *H01L 2223/54426* (2013.01); *H01L 2223/6677* (2013.01)

(56) References Cited

U.S. PATENT DOCUMENTS

| | | |
|---|---|---|
| 2012/0092577 A1 | 4/2012 | Shi et al. |
| 2012/0138922 A1 | 6/2012 | Yamazaki et al. |
| 2012/0194399 A1 | 8/2012 | Bily et al. |
| 2013/0320334 A1 | 12/2013 | Yamazaki et al. |
| 2014/0286076 A1 | 9/2014 | Aoki et al. |
| 2019/0385960 A1* | 12/2019 | Misaki ................ H01L 27/1255 |

FOREIGN PATENT DOCUMENTS

| | | |
|---|---|---|
| JP | 2007-295044 A | 11/2007 |
| JP | 2009-538565 A | 11/2009 |
| JP | 2012-134475 A | 7/2012 |
| JP | 2013-539949 A | 10/2013 |
| JP | 2014-007399 A | 1/2014 |
| JP | 2014-209727 A | 11/2014 |
| WO | 2007/139736 A2 | 12/2007 |
| WO | 2012/050614 A1 | 4/2012 |
| WO | 2014/149341 A1 | 9/2014 |
| WO | 2015/126550 A1 | 8/2015 |
| WO | 2015/126578 A1 | 8/2015 |
| WO | 2016/057539 A1 | 4/2016 |
| WO | 2016/130383 A1 | 8/2016 |
| WO | 2016/141340 A1 | 9/2016 |
| WO | 2016/141342 A1 | 9/2016 |

OTHER PUBLICATIONS

Ando et al., "A Radial Line Slot Antenna for 12 GHz Satellite TV Reception", IEEE Transactions on Antennas and Propagation, vol. AP-33, No. 12, Dec. 1985, pp. 1347-1353.
Wittek et al., "Liquid Crystals for Smart Antennas and Other Microwave Applications", SID 2015 Digest, 55.1, 2015, pp. 824-826.
Kuki, "Novel RF Functional Devices Using Liquid Crystal", Polymer, vol. 55, Aug. 2006, pp. 599-602.
Nakazawa et al., "TFT Substrate, Scanning Antenna Using Same, and Method for Manufacturing TFT Substrate", U.S. Appl. No. 15/542,488, filed Jul. 10, 2017.

* cited by examiner

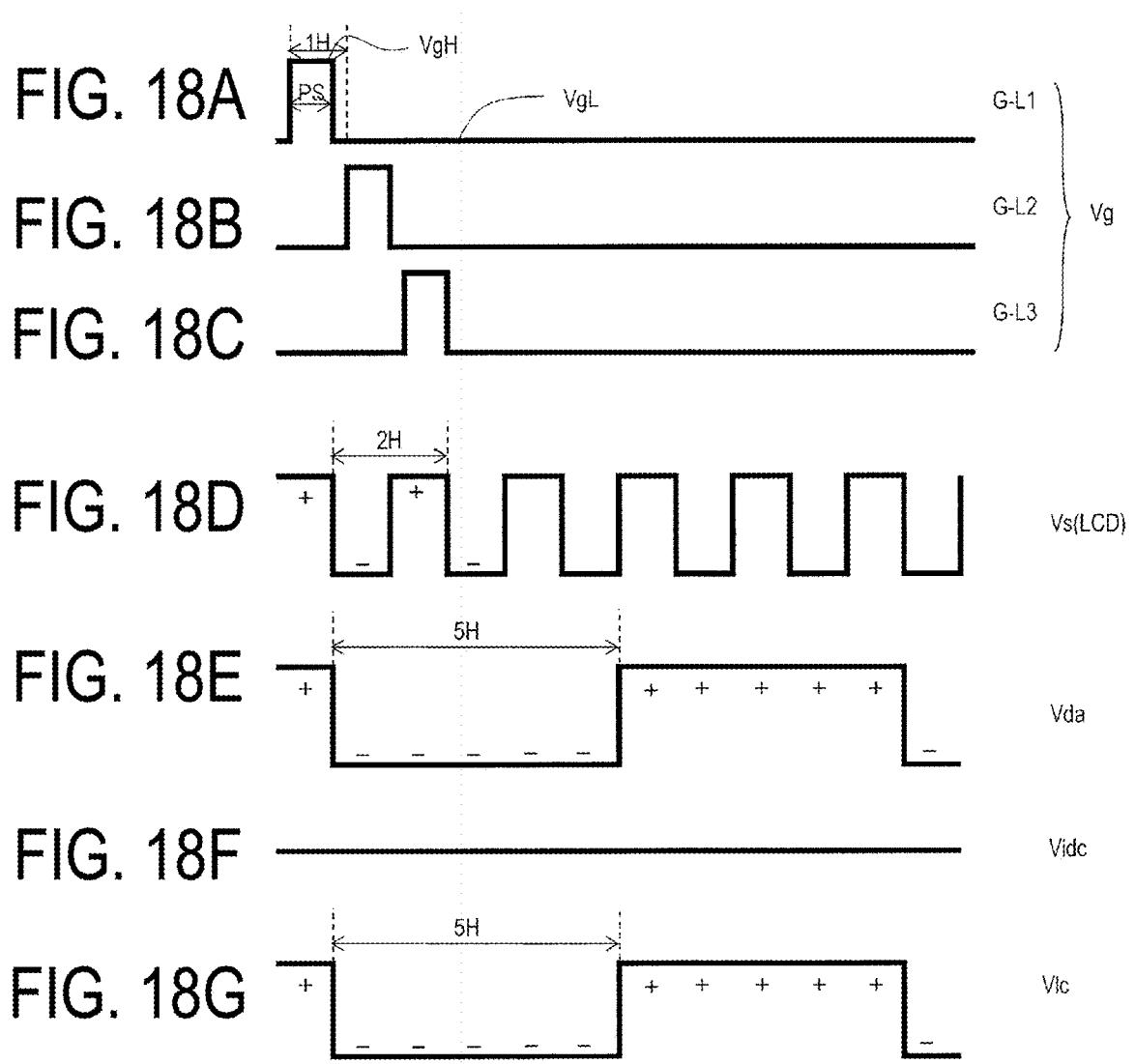

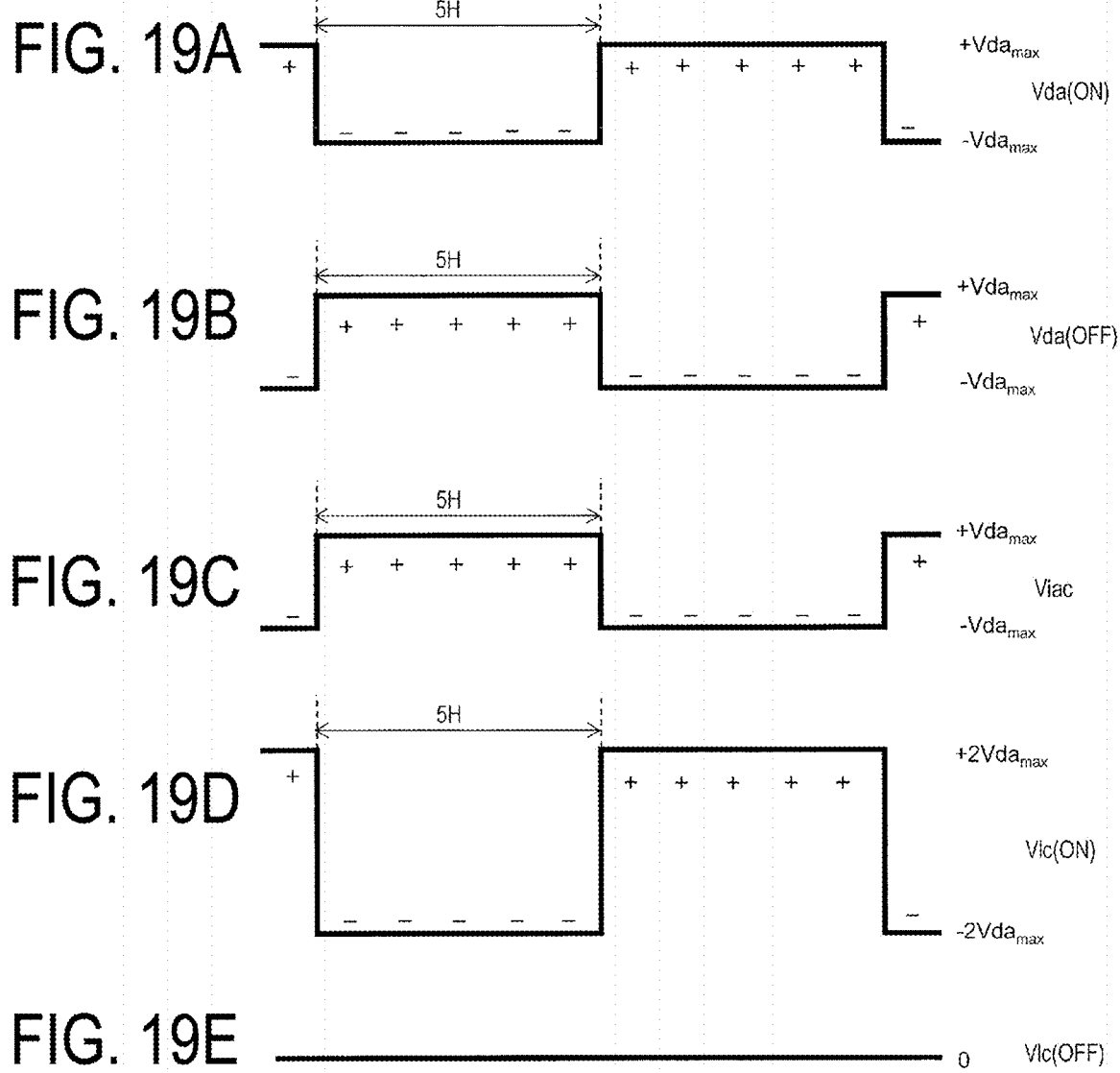

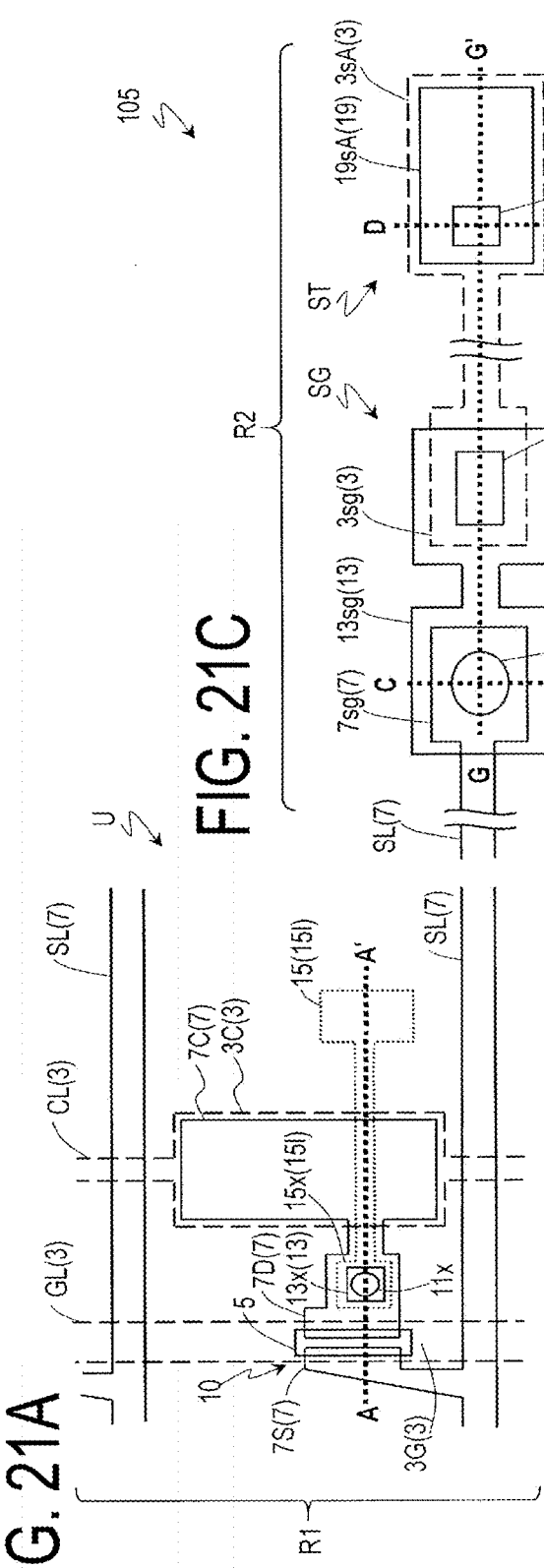
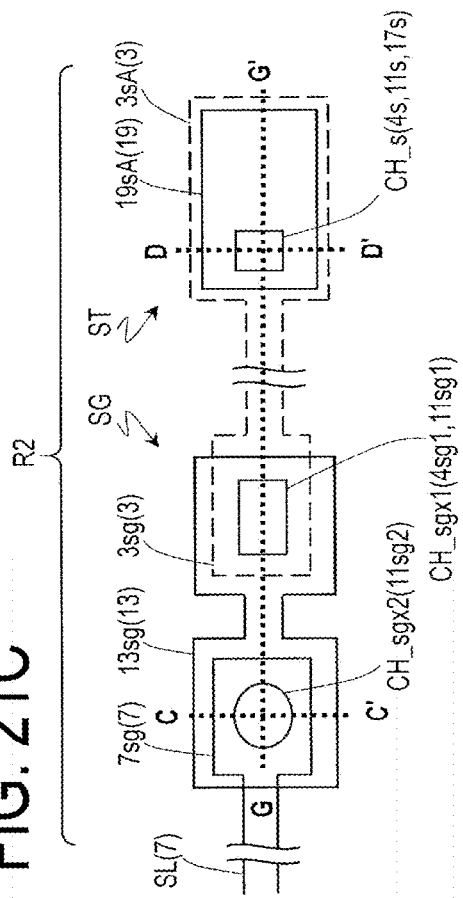
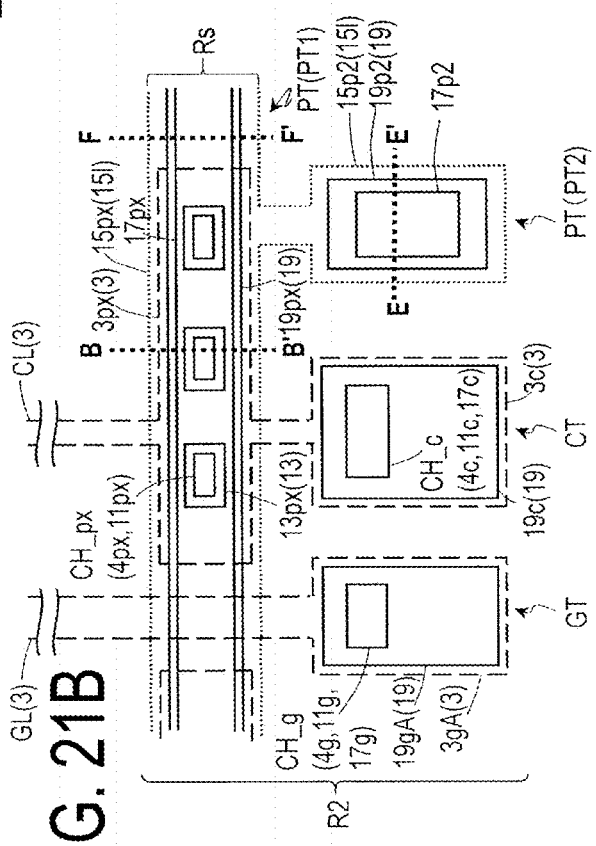
FIG. 21A
FIG. 21B
FIG. 21C

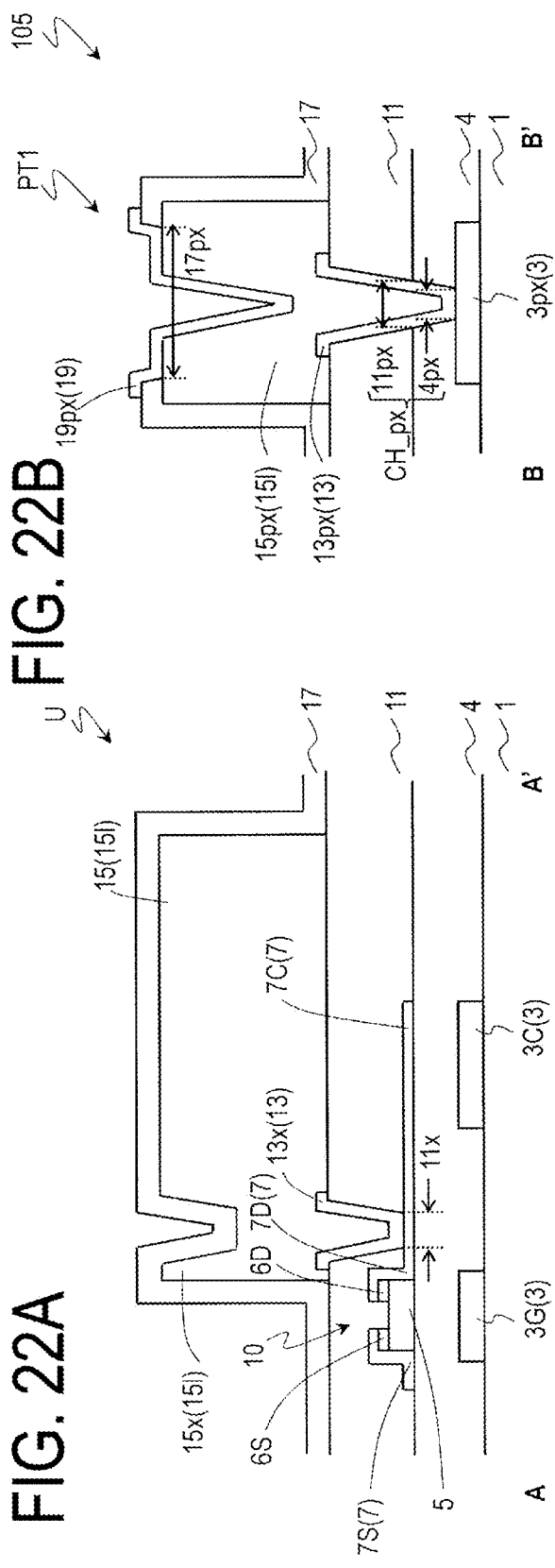
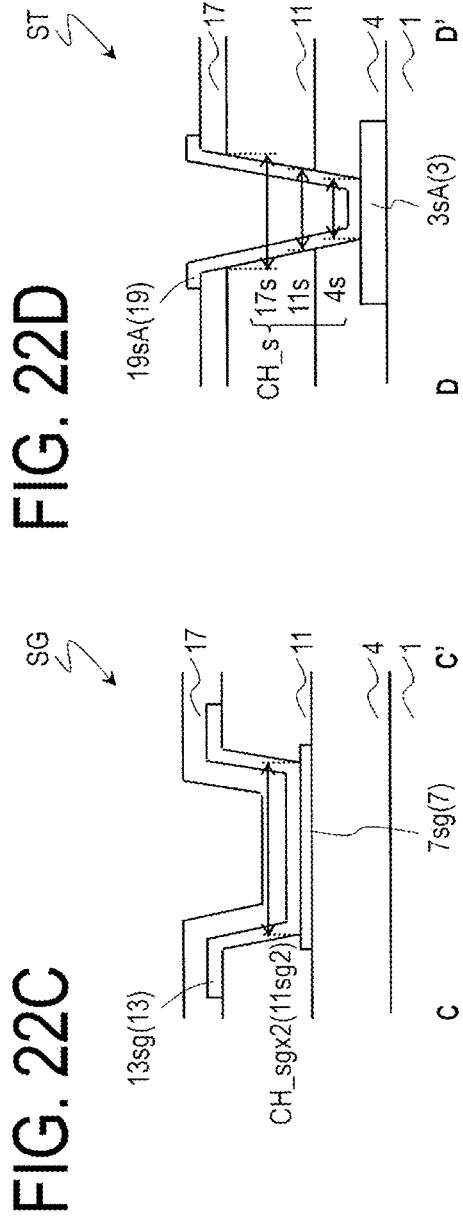

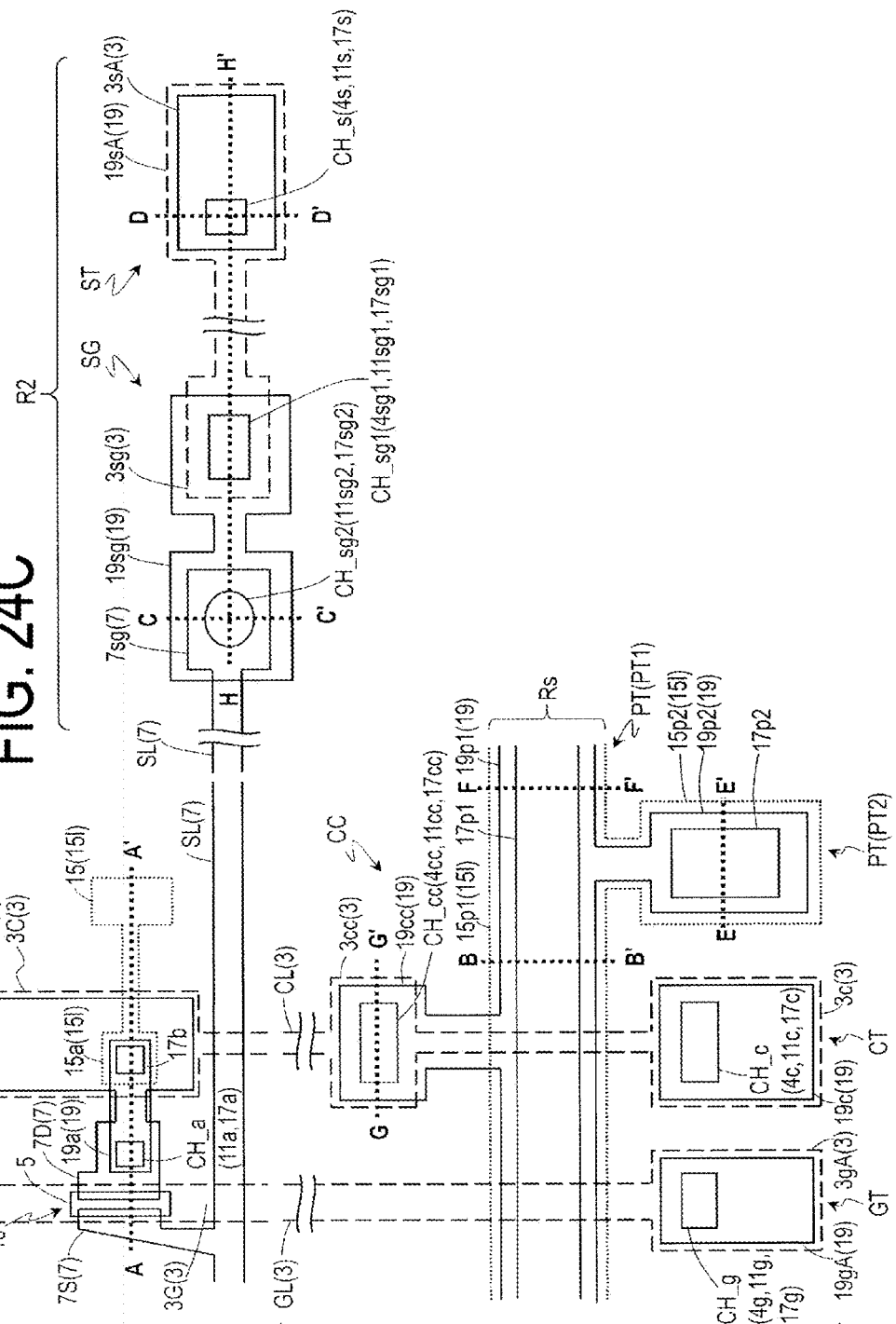

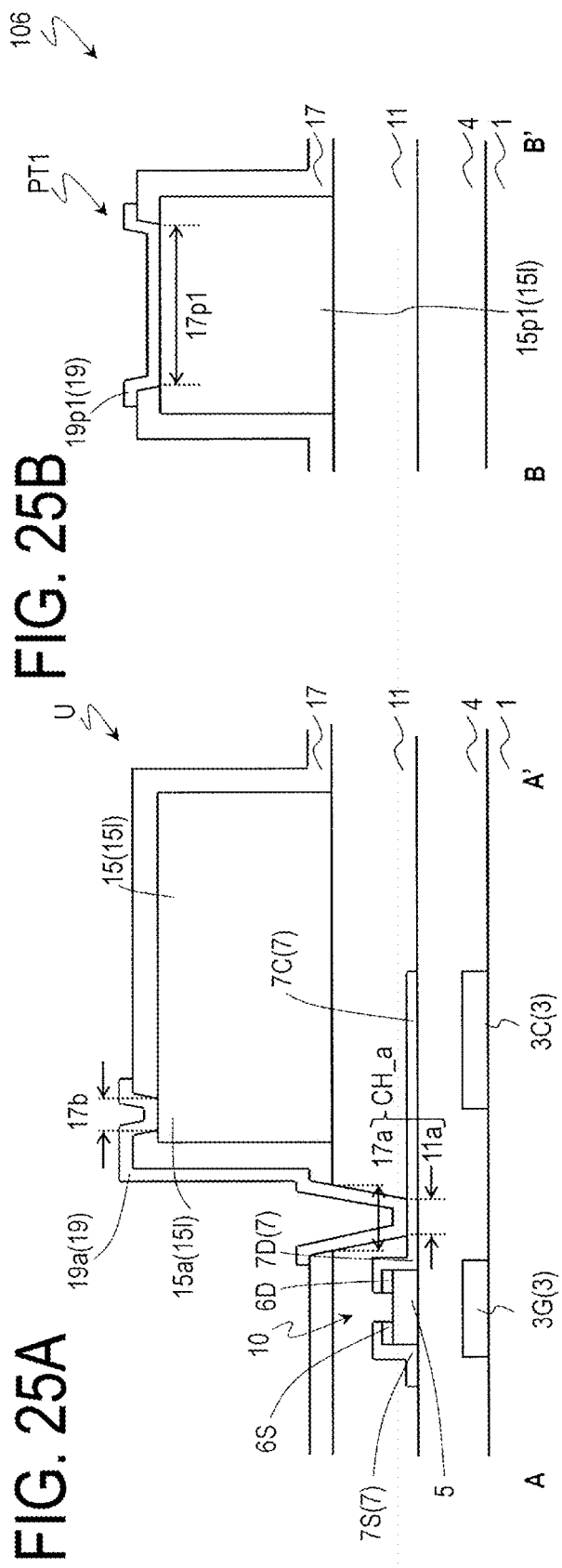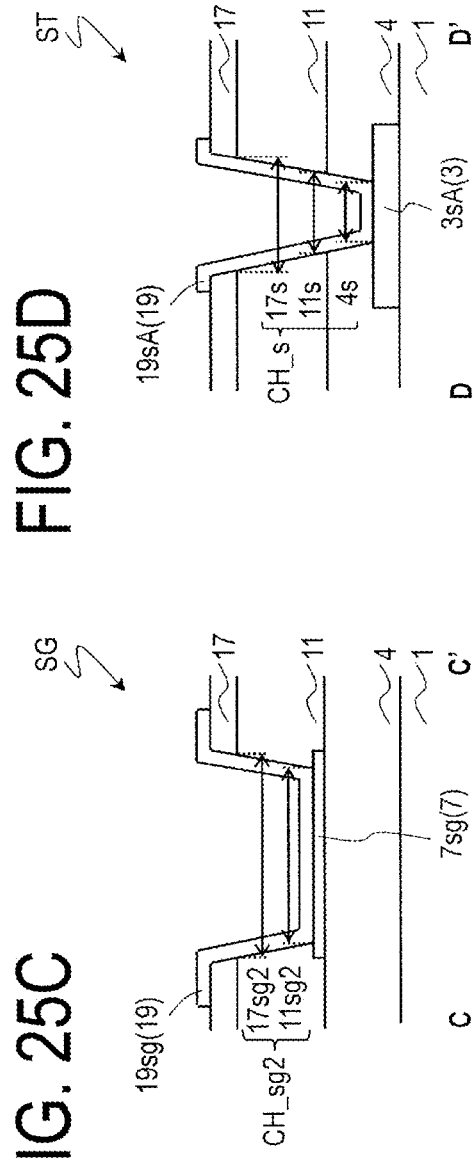

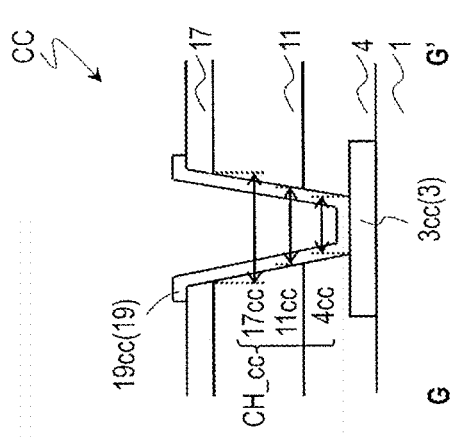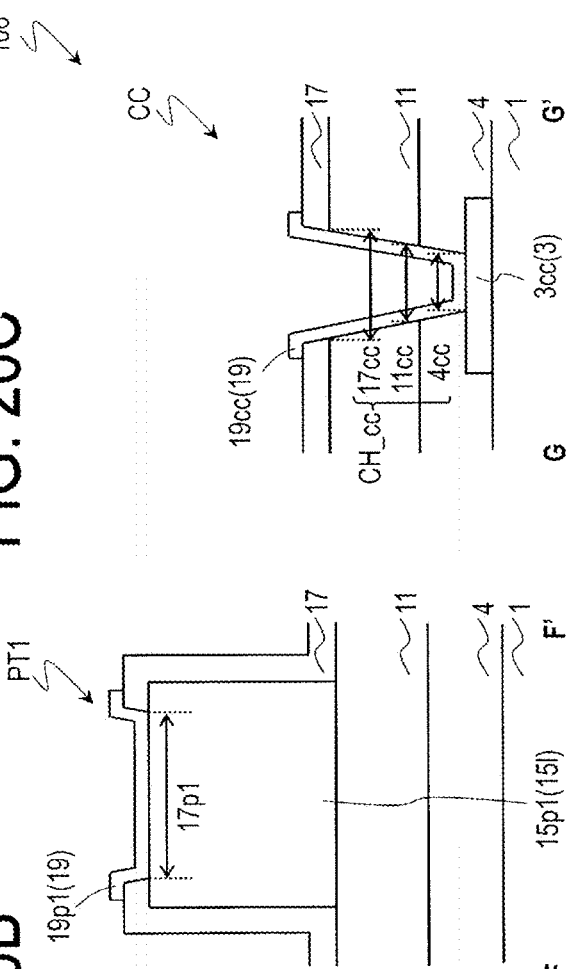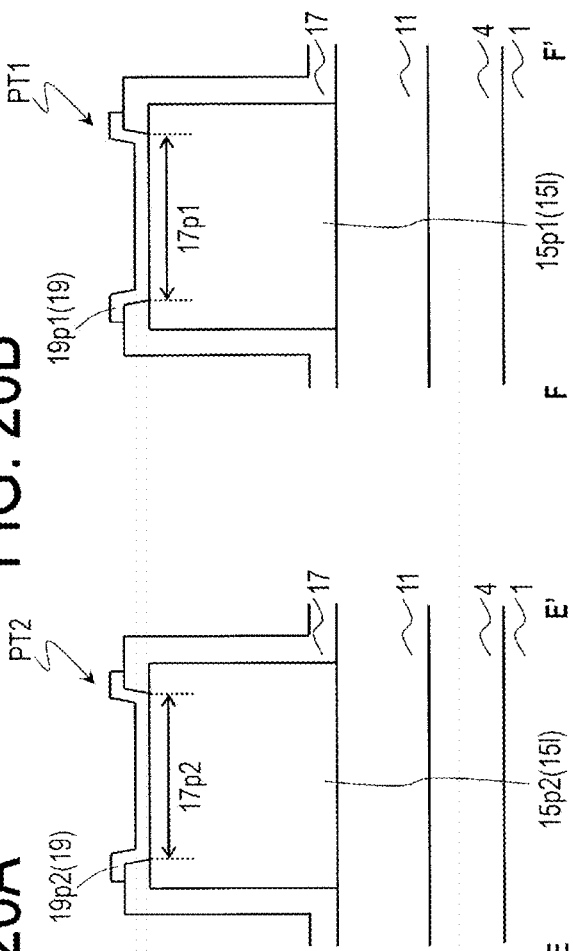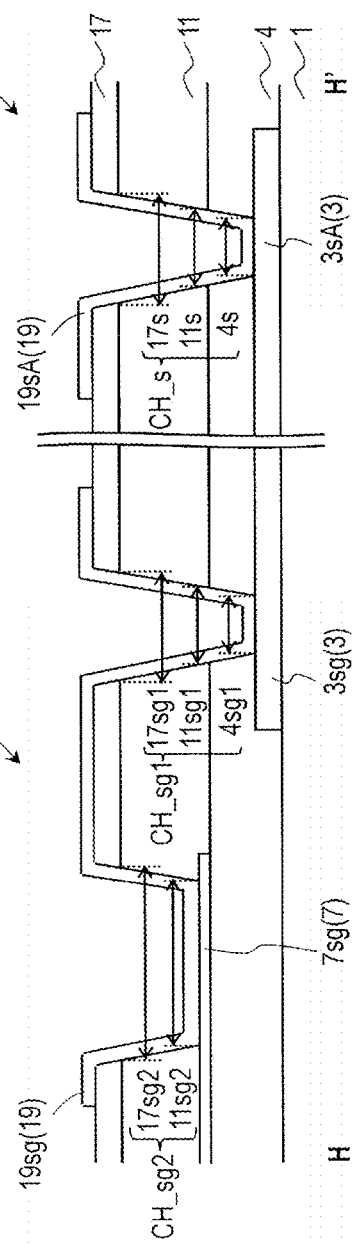
FIG. 26A FIG. 26B FIG. 26C
FIG. 26D

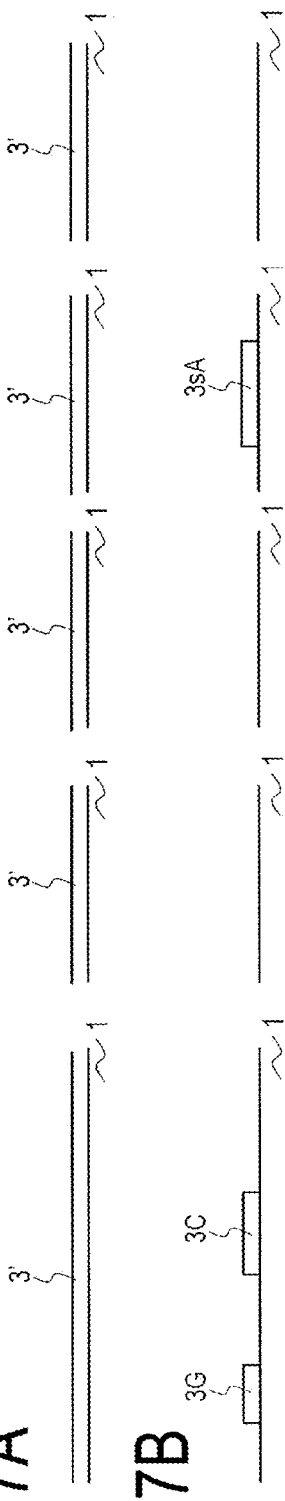
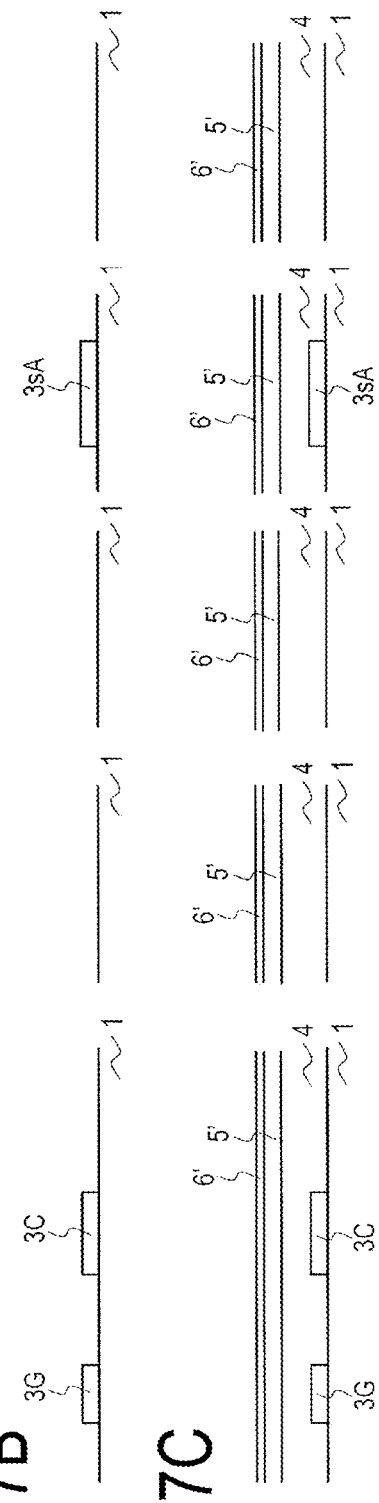
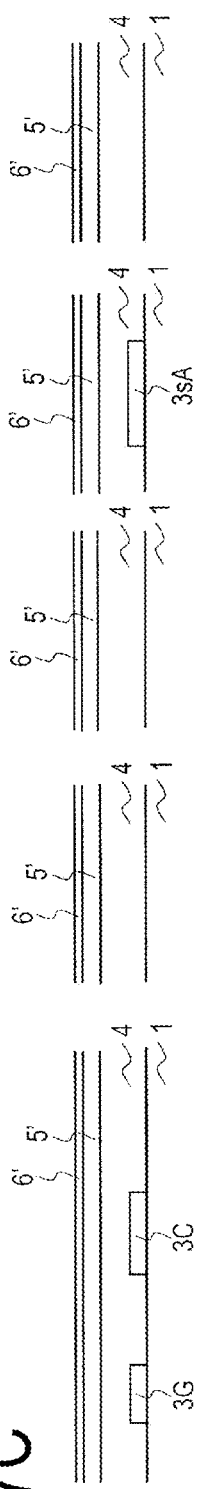
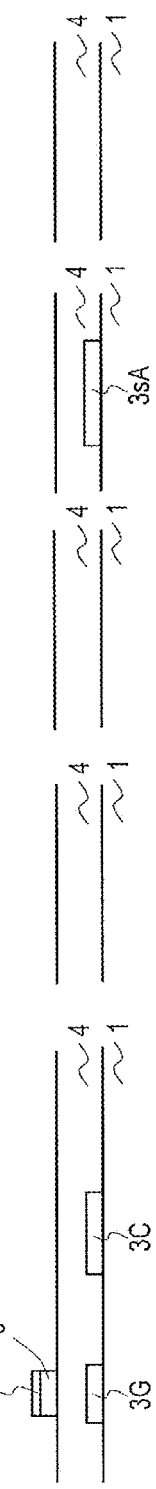
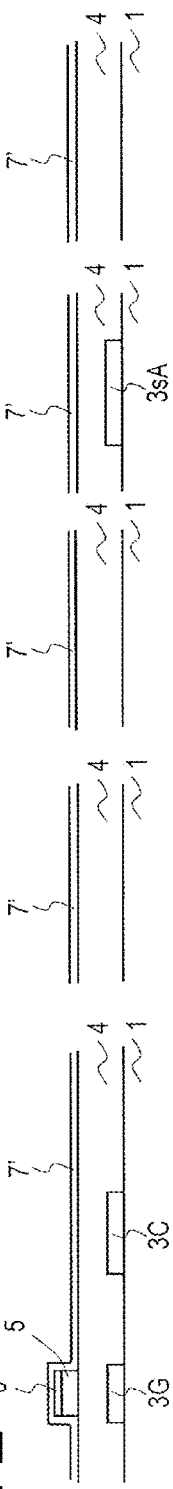

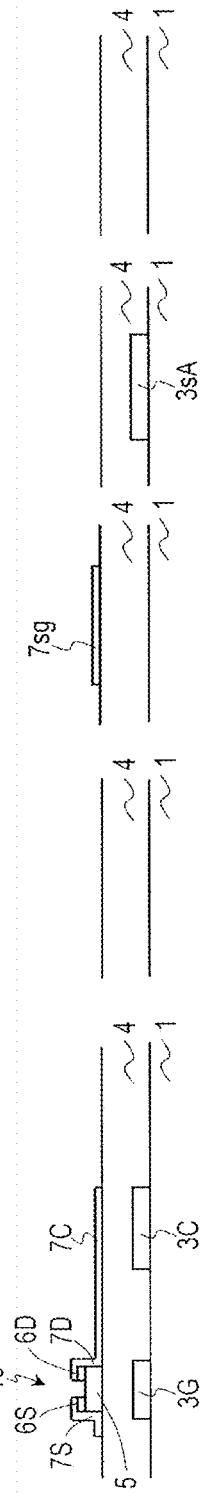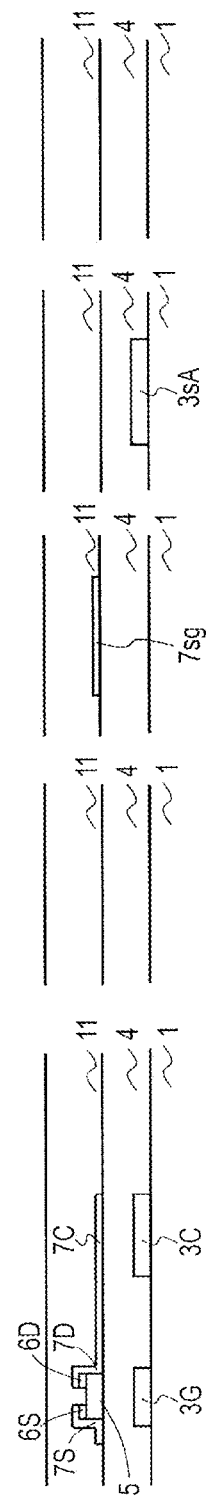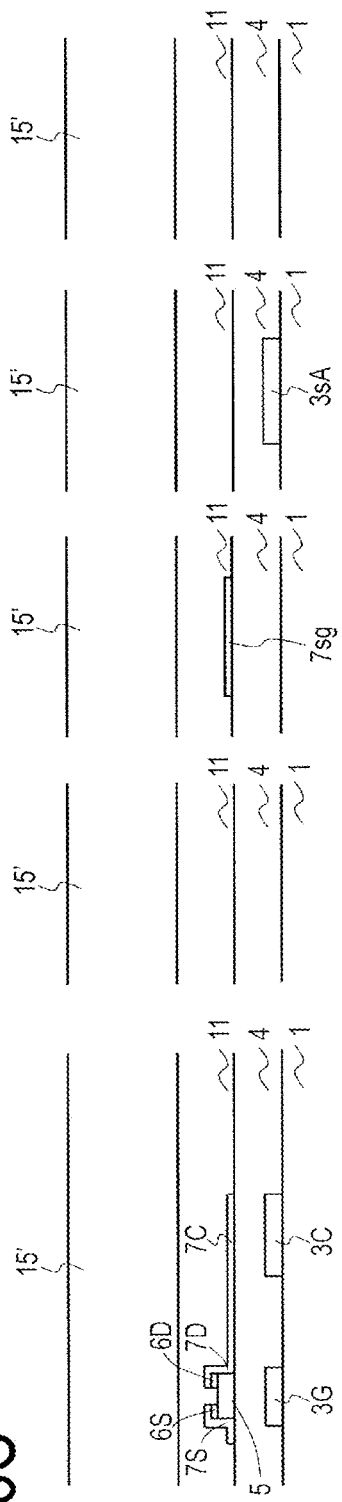

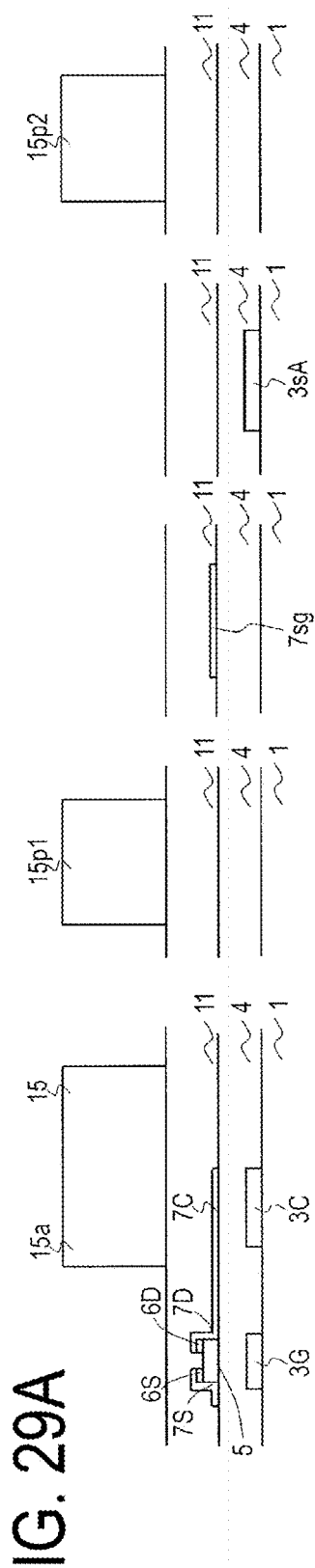

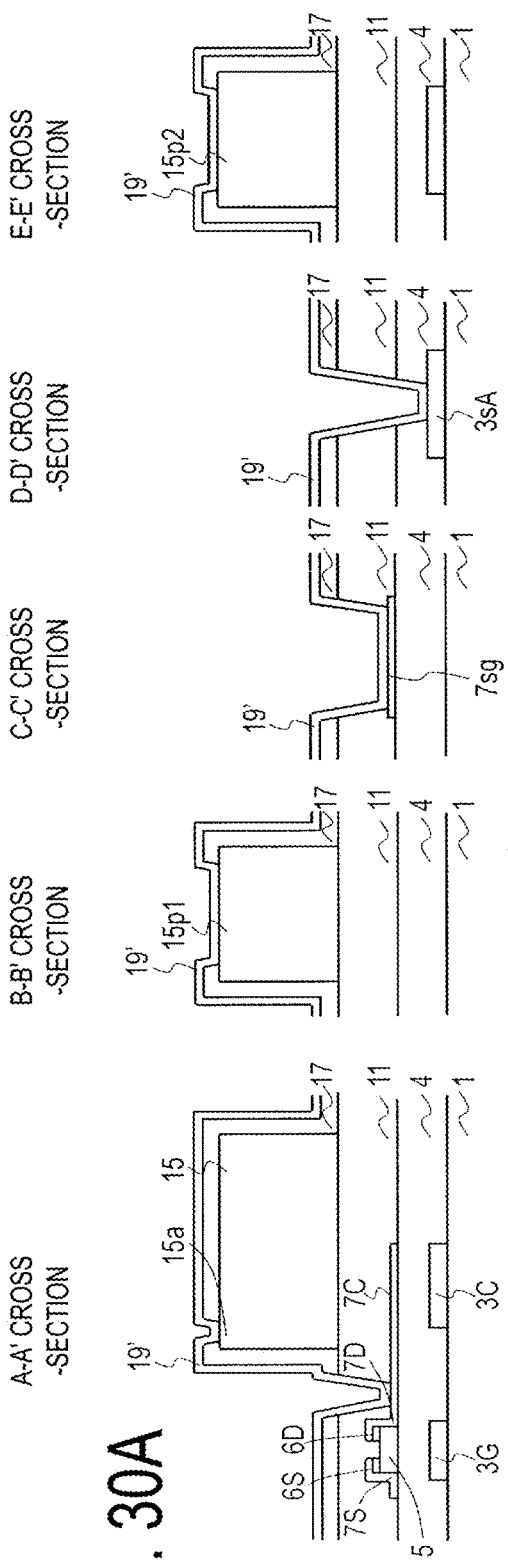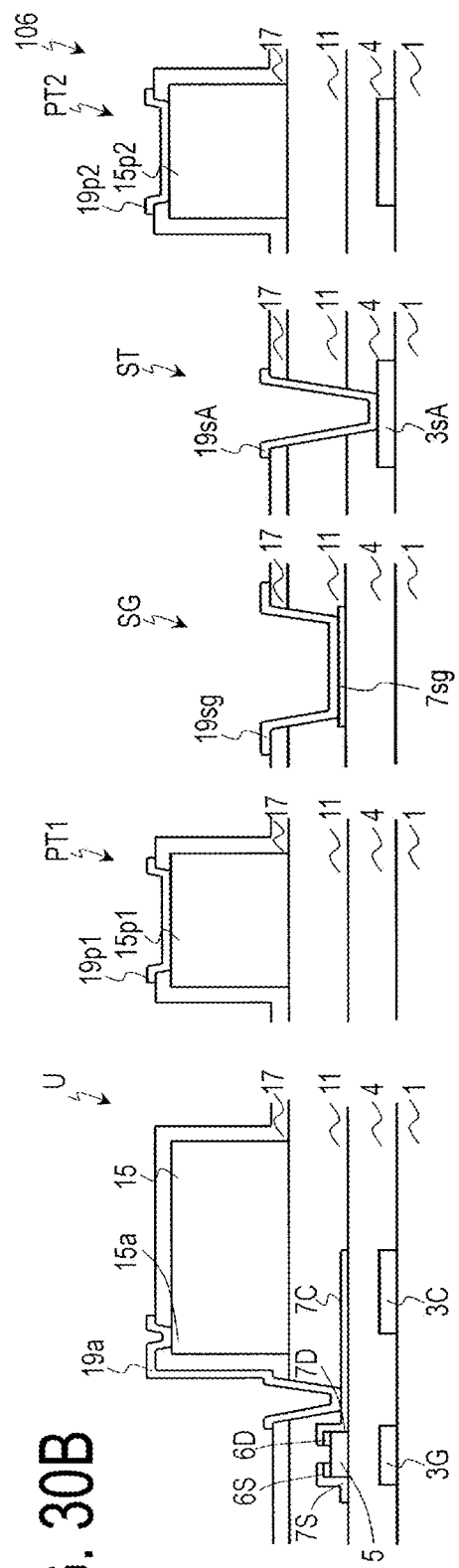

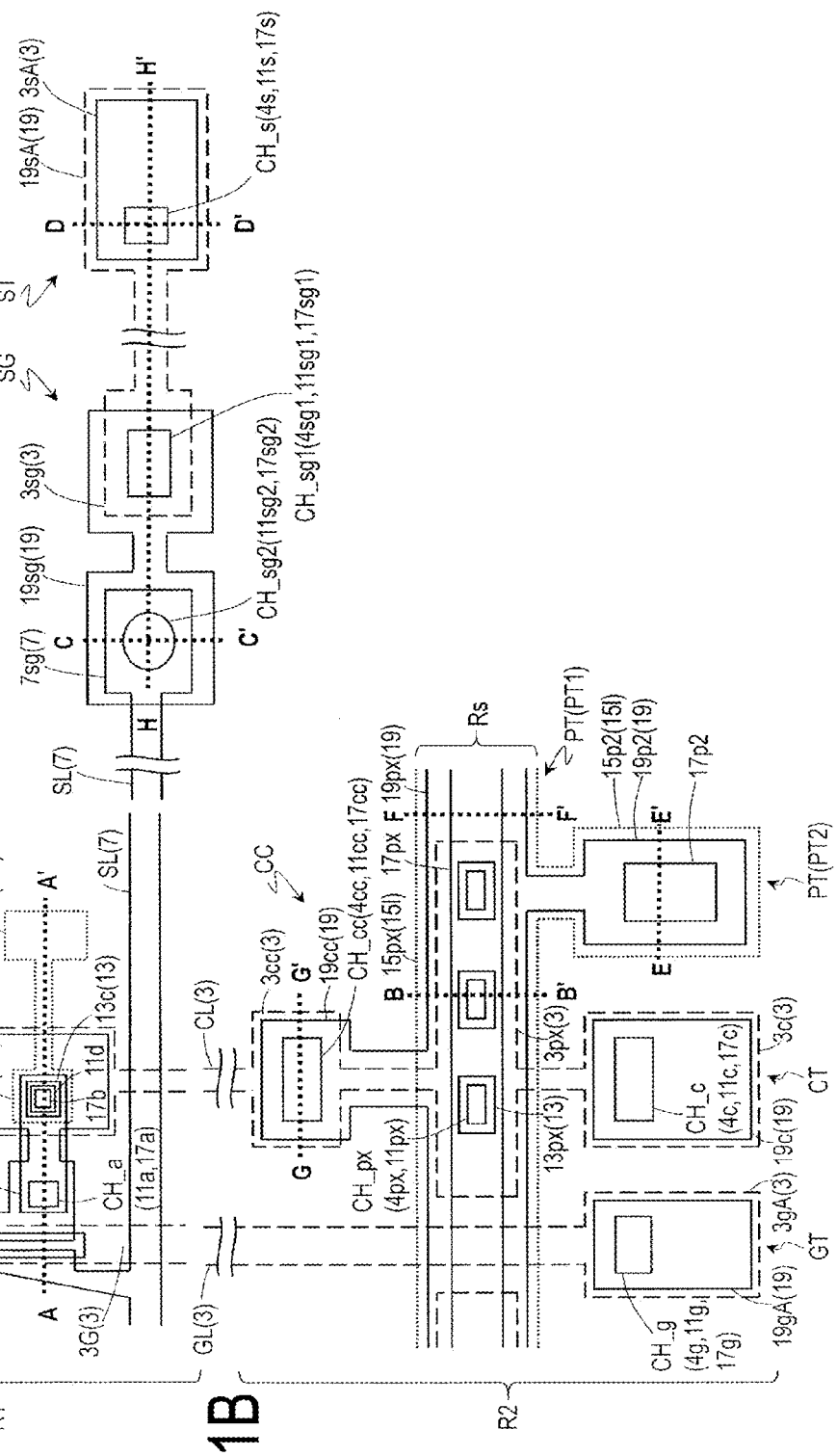

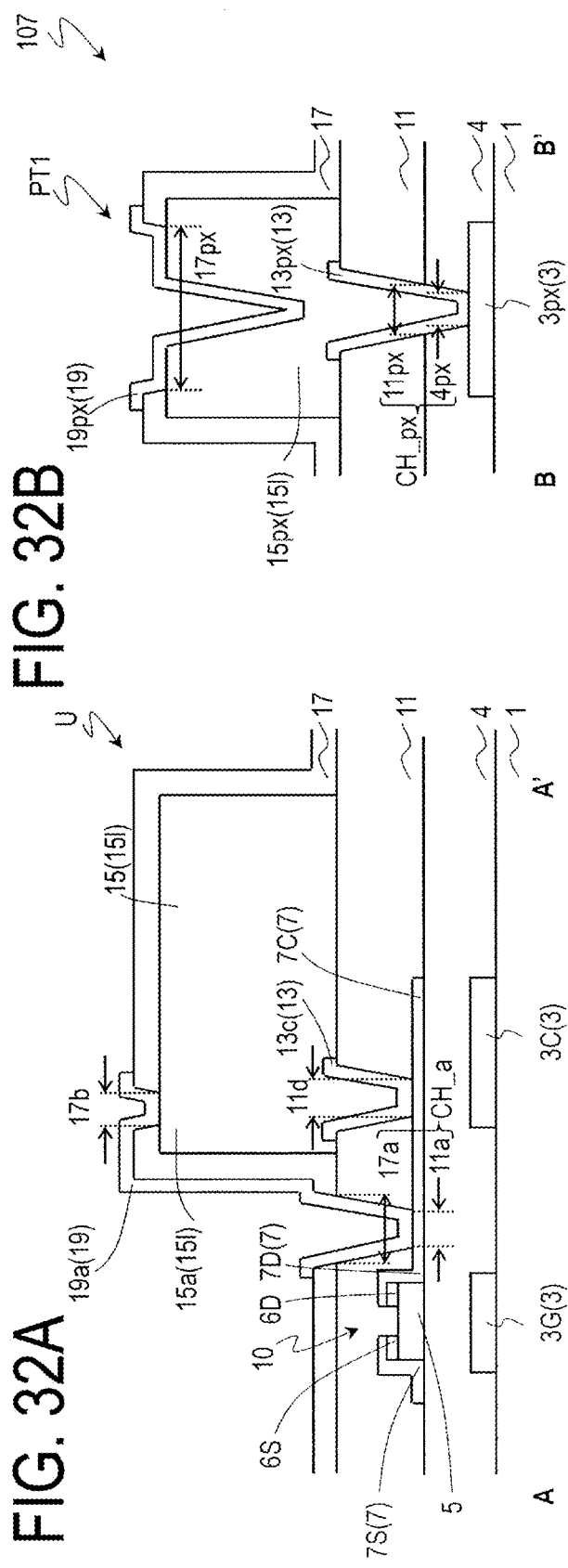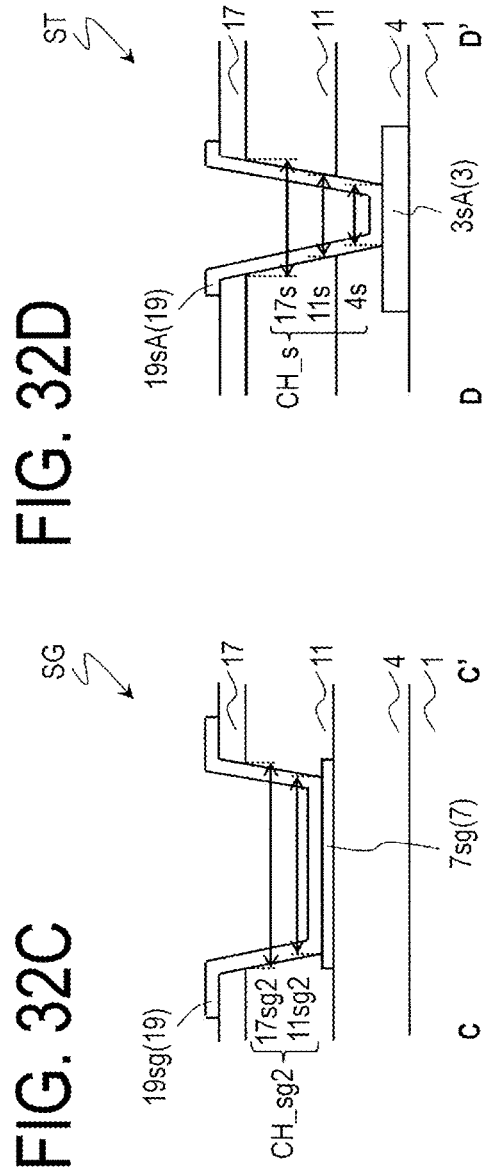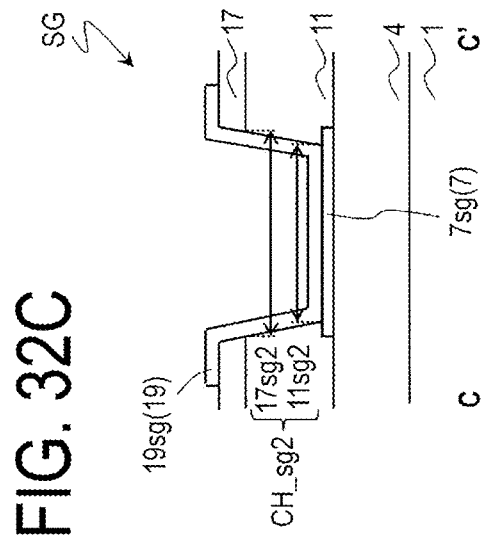

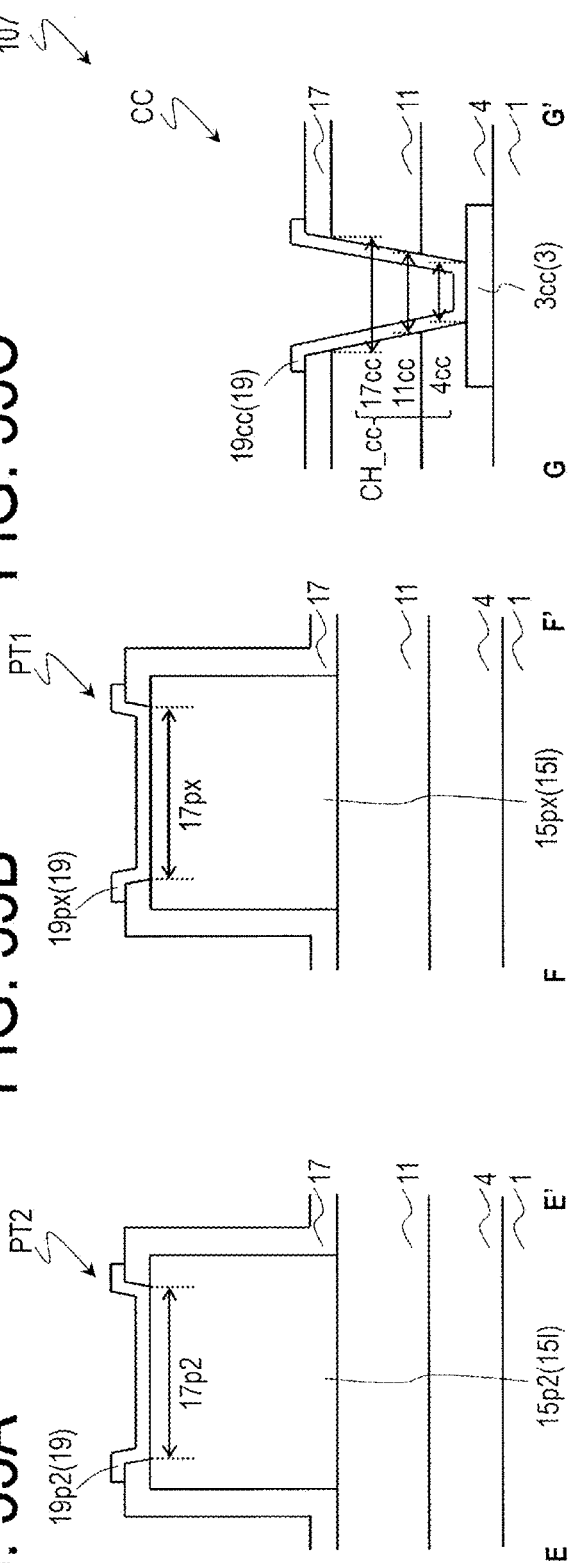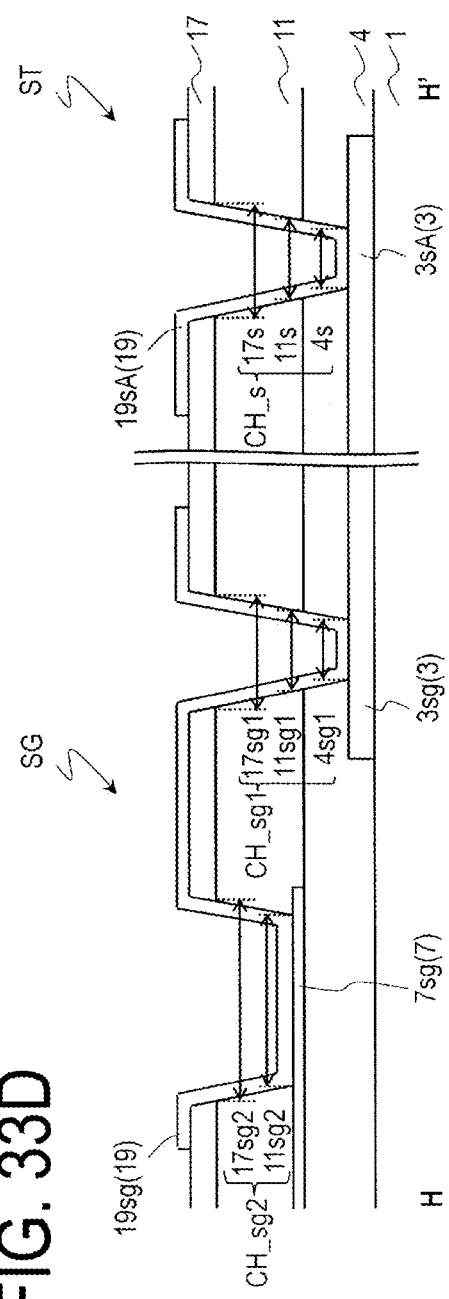

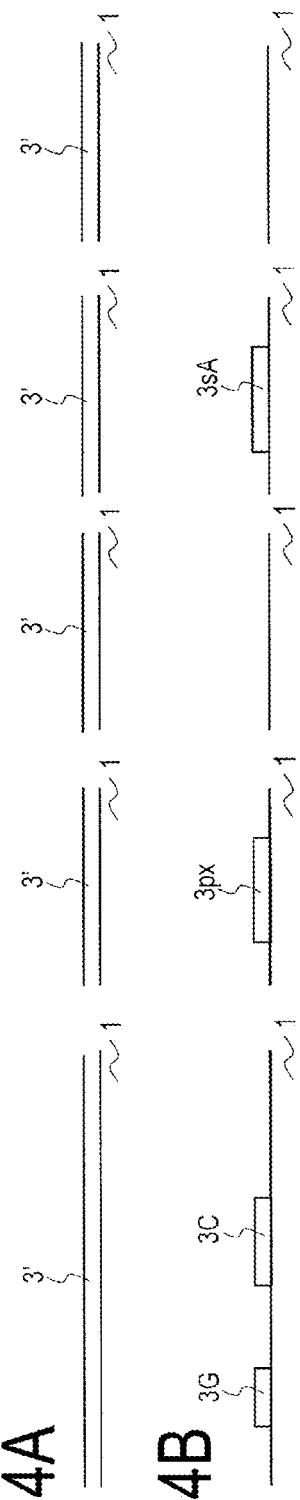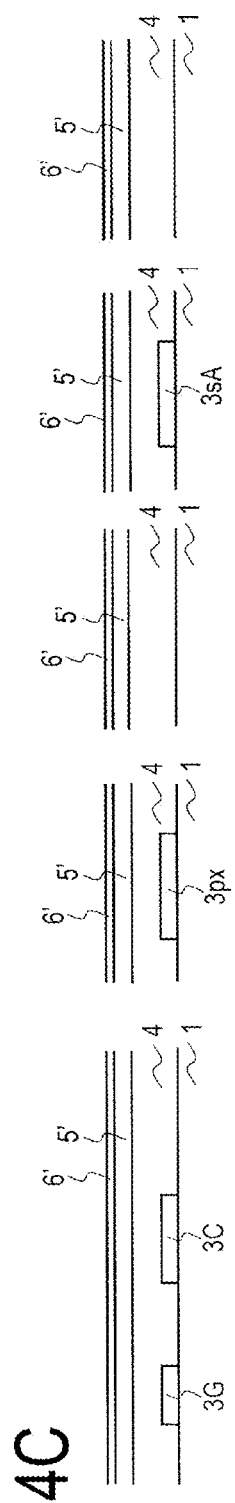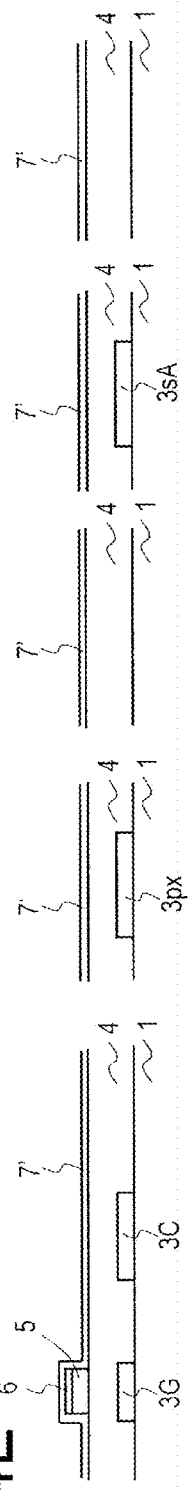
FIG. 34A  
FIG. 34B  
FIG. 34C  
FIG. 34D  
FIG. 34E

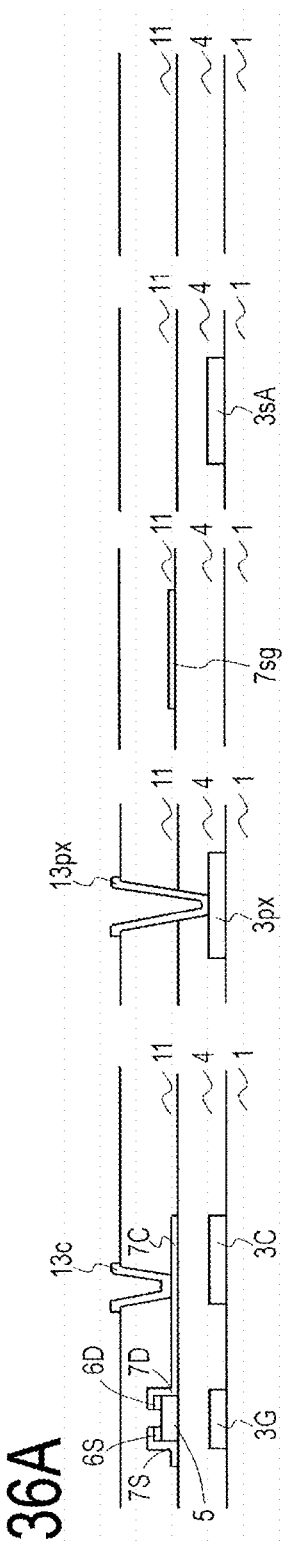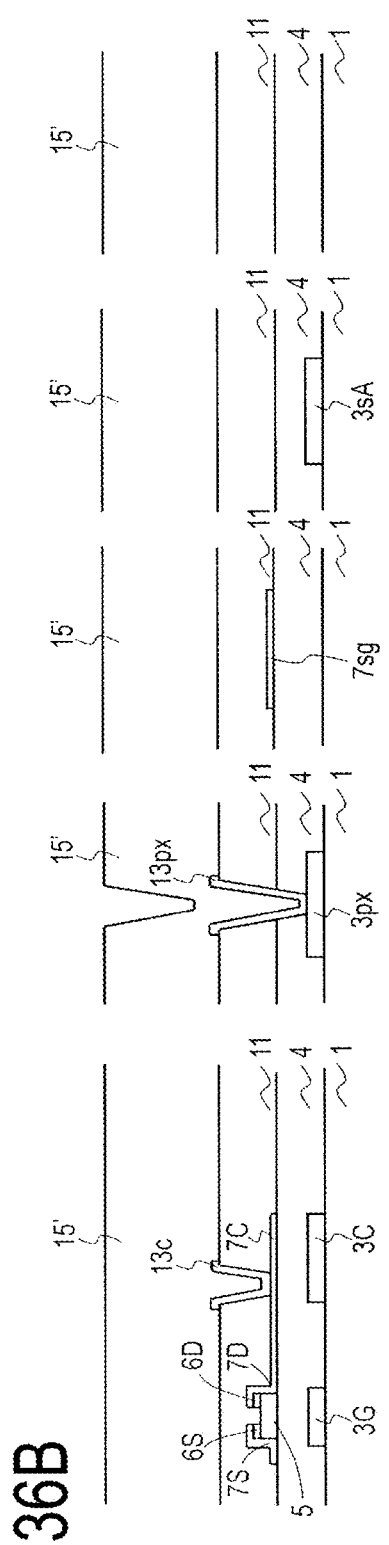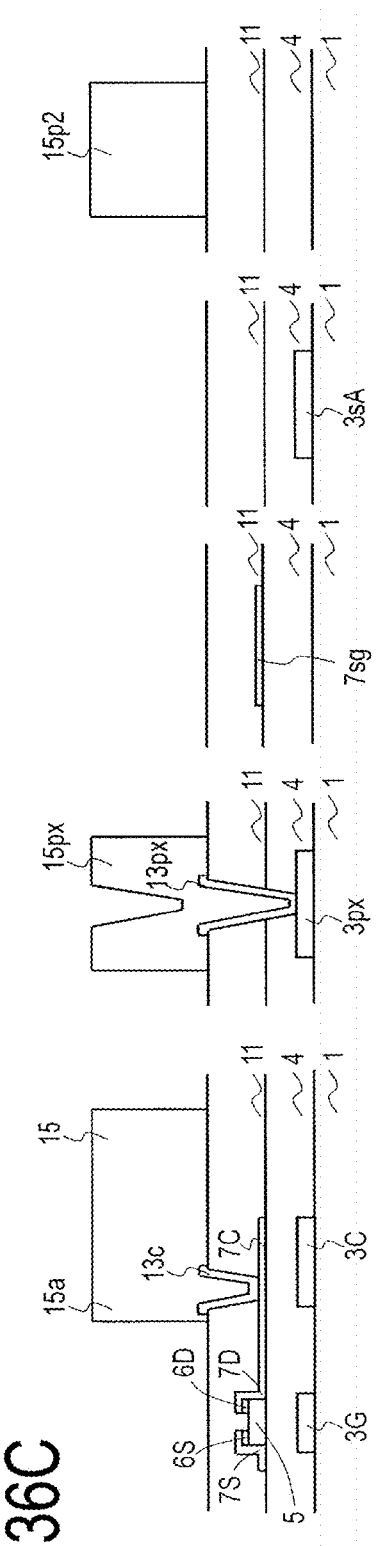

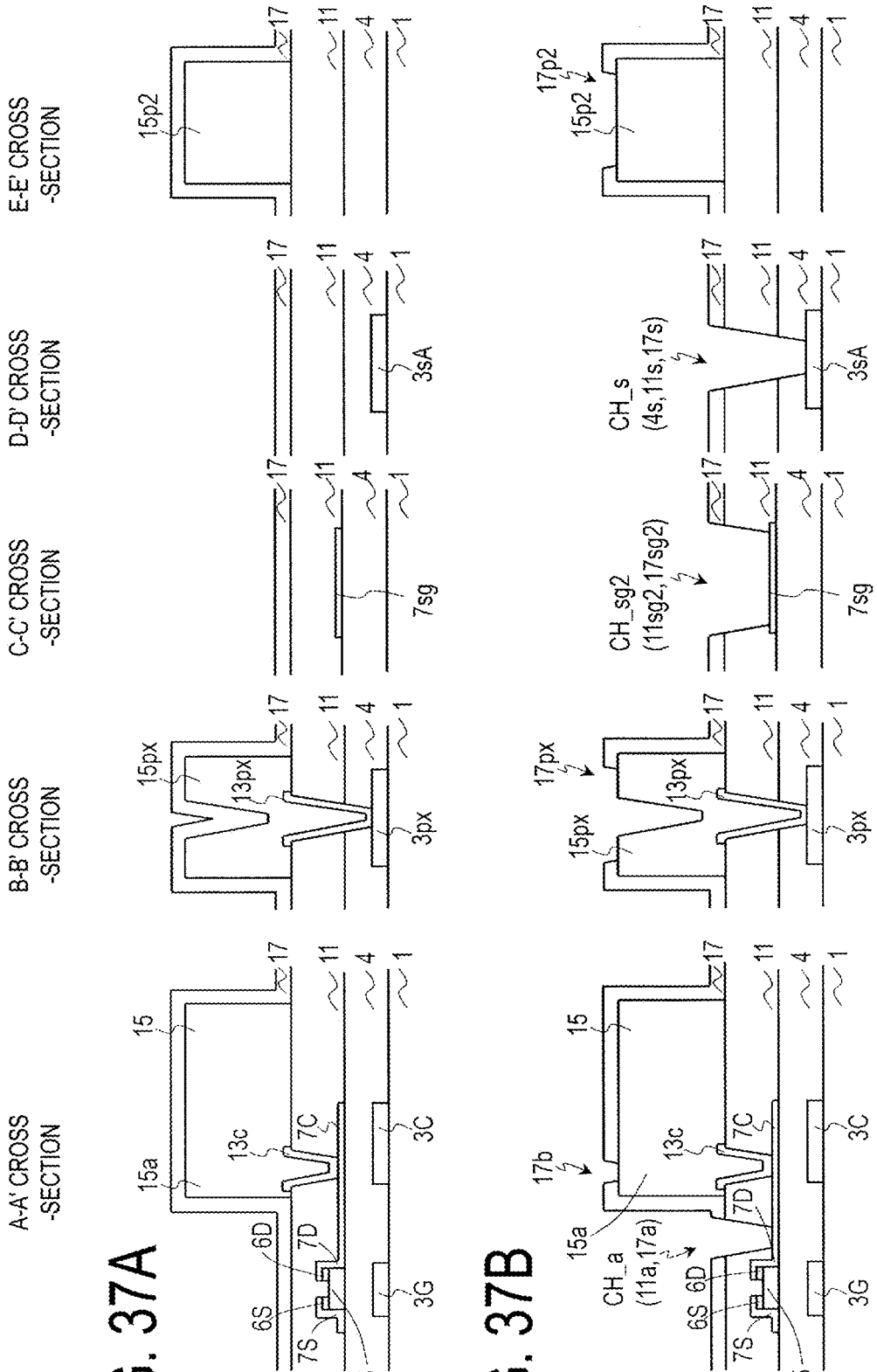

TFT SUBSTRATE, SCANNING ANTENNA PROVIDED WITH TFT SUBSTRATE, AND METHOD FOR MANUFACTURING TFT SUBSTRATE

TECHNICAL FIELD

The disclosure relates to a scanning antenna, and more particularly relates to a scanning antenna in which an antenna unit (also referred to as an "element antenna") has a liquid crystal capacitance (also referred to as a "liquid crystal array antenna"), a TFT substrate used for such a scanning antenna, and a manufacturing method of such a TFT substrate.

BACKGROUND ART

Antennas for mobile communication and satellite broadcasting require functions that can change the beam direction (referred to as "beam scanning" or "beam steering"). As an example of an antenna (hereinafter referred to as a "scanning antenna" (scanned antenna) having such functionality, phased array antennas equipped with antenna units are known. However, known phased array antennas are expensive, which is an obstacle for popularization as a consumer product. In particular, as the number of antenna units increases, the cost rises considerably.

Therefore, scanning antennas that utilize the high dielectric anisotropy (birefringence) of liquid crystal materials (including nematic liquid crystals and polymer dispersed liquid crystals) have been proposed (PTL 1 to PTL 5 and NPL 1). Since the dielectric constant of liquid crystal materials has a frequency dispersion, in the present specification, the dielectric constant in a frequency band for microwaves (also referred to as the "dielectric constant for microwaves") is particularly denoted as "dielectric constant $M(\varepsilon_M)$".

PTL 3 and NPL 1 describe how an inexpensive scanning antenna can be obtained by using liquid crystal display (hereinafter referred to as "LCD") device technology.

CITATION LIST

Patent Literature

PTL 1: JP 2007-116573 A
PTL 2: JP 2007-295044 A
PTL 3: JP 2009-538565 A
PTL 4: JP 2013-539949 A
PTL 5: WO 2015/126550

Non-Patent Literature

NPL 1: R. A. Stevenson et al., "Rethinking Wireless Communications: Advanced Antenna Design using LCD Technology", SID 2015 DIGEST, pp. 827-830.
NPL 2: M. ANDO et al., "A Radial Line Slot Antenna for 12 GHz Satellite TV Reception", IEEE Transactions of Antennas and Propagation, Vol. AP-33, No. 12, pp. 1347-1353 (1985).

SUMMARY

Technical Problem

As described above, although the idea of realizing an inexpensive scanning antenna by applying LCD technology is known, there are no documents that specifically describe a structure, manufacturing method, and driving method of a scanning antennas using LCD technology.

Accordingly, an object of the disclosure is to provide a scanning antenna which can be mass-manufactured by utilizing the manufacturing techniques of LCDs in the related art, a TFT substrate used for such a scanning antenna, and a manufacturing method of such a TFT substrate.

Solution to Problem

A TFT substrate according to an embodiment of the disclosure is a TFT substrate including a dielectric substrate, a plurality of antenna unit regions arranged on the dielectric substrate, each of the plurality of antenna unit regions including a TFT and a patch electrode electrically connected to a drain electrode of the TFT, a transmission and/or reception region including the plurality of antenna unit regions, and a non-transmission and/or reception region located in a region other than the transmission and/or reception region, the TFT substrate including a gate metal layer supported by the dielectric substrate, and including a gate electrode of the TFT, a gate insulating layer formed on the gate metal layer, a source metal layer formed on the gate insulating layer, and including a source electrode of the TFT and the drain electrode, a first insulating layer formed on the source metal layer, a patch metal layer formed on the first insulating layer, and including the patch electrode, a second insulating layer formed on the patch metal layer, and an upper conductive layer formed on the second insulating layer, wherein the upper conductive layer includes a patch drain connection section electrically connected to the patch electrode and the drain electrode.

In an embodiment, the TFT substrate further includes a lower conductive layer formed between the first insulating layer and the patch metal layer.

In an embodiment, the lower conductive layer includes a portion in direct contact with the patch metal layer.

In an embodiment, the lower conductive layer includes an oxide conductive layer.

In an embodiment, the patch metal layer includes a first metal layer including at least one element selected from the group including Ti, W, Mo, Ta, and Nb, and a second metal layer formed on the first metal layer, and including at least one element selected from the group including Cu, Al, Ag, and Au.

In an embodiment, the upper conductive layer includes a first conductive layer including a transparent conductive layer, and a second conductive layer formed under the first conductive layer, and formed of at least one layer selected from a group including a Ti layer, a MoNb layer, a MoNbNi layer, a MoW layer, a W layer, and a Ta layer.

In an embodiment, the gate metal layer further includes a gate bus line connected to the gate electrode of the TFT, the source metal layer further includes a source bus line connected to the source electrode of the TFT, the TFT substrate further includes a source-gate connection section disposed in the non-transmission and/or reception region, and the source-gate connection section includes a source lower connection wiring line included in the gate metal layer, and electrically separate from the gate bus line, a source bus line connection section included in the source metal layer, and electrically connected to the source bus line, a first contact hole formed in the gate insulating layer, the first insulating layer, and the second insulating layer, and at least reaching the source lower connection wiring line, a second contact hole formed in the first insulating layer and the second insulating layer, and at least reaching the source bus line connection section, and a source bus line upper connection section included in the upper conductive layer, connected to the source lower connection wiring line within the first contact hole, and connected to the source bus line connection section within the second contact hole.

In an embodiment, the TFT substrate further includes a source terminal section disposed in the non-transmission and/or reception region, wherein the source terminal section includes a source terminal lower connection section included in the gate metal layer, and electrically connected to the source lower connection wiring line, a third contact hole formed in the gate insulating layer, the first insulating layer, and the second insulating layer, and at least reaching the source terminal lower connection section, and a source terminal upper connection section included in the upper conductive layer, and connected to the source terminal lower connection section within the third contact hole.

In an embodiment, each of the plurality of antenna unit regions further includes an upper auxiliary capacitance electrode included in the source metal layer, and electrically connected to the drain electrode, and a lower auxiliary capacitance electrode included in the gate metal layer, and opposite to the upper auxiliary capacitance electrode via the gate insulating layer, the gate metal layer further includes a CS bus line connected to the lower auxiliary capacitance electrode, the TFT substrate further includes a CS terminal section disposed in the non-transmission and/or reception region, and a transfer terminal section, and the CS terminal section includes a CS terminal lower connection section included in the gate metal layer, and electrically connected to the CS bus line, a fourth contact hole formed in the gate insulating layer, the first insulating layer, and the second insulating layer, and at least reaching the CS terminal lower connection section, and a CS terminal upper connection section included in the upper conductive layer, and connected to the CS terminal lower connection section within the fourth contact hole.

In an embodiment, the transfer terminal section includes a first transfer terminal section, the first transfer terminal section including a first transfer terminal lower connection section included in the patch metal layer, a fifth contact hole formed in the second insulating layer, and at least reaching the first transfer terminal lower connection section, and a first transfer terminal upper connection section included in the upper conductive layer, and connected to the first transfer terminal lower connection section within the fifth contact hole.

In an embodiment, the first transfer terminal lower connection section is electrically connected to the CS bus line.

In an embodiment, the transfer terminal section includes a second transfer terminal section, the second transfer terminal section including a second transfer terminal lower connection section included in the gate metal layer, a sixth contact hole formed in the gate insulating layer and the first insulating layer, and at least reaching the second transfer terminal lower connection section, a first conductive portion for second transfer terminal included in the lower conductive layer, and connected to the second transfer terminal lower connection section within the sixth contact hole, a second conductive portion for second transfer terminal included in the patch metal layer, and formed on the first conductive portion for second transfer terminal, a seventh contact hole formed in the second insulating layer, and at least reaching the second conductive portion for second transfer terminal, and a second transfer terminal upper connection section included in the upper conductive layer, and connected to the second conductive portion for second transfer terminal within the seventh contact hole.

In an embodiment, the second transfer terminal lower connection section is electrically connected to the CS bus line.

In an embodiment, the TFT substrate further includes a common-CS connection section disposed in the non-transmission and/or reception region, wherein the common-CS connection section includes a CS connecting lower connection section included in the gate metal layer, an eighth contact hole formed in the gate insulating layer, the first insulating layer, and the second insulating layer, and at least reaching the CS connecting lower connection section, and a CS connecting upper connection section included in the upper conductive layer, and connected to the CS connecting lower connection section within the eighth contact hole, and the CS connecting lower connection section is electrically connected to the CS bus line, and the CS connecting upper connection section is electrically connected to the first transfer terminal upper connection section.

In an embodiment, the CS connecting lower connection section is electrically connected to the second transfer terminal lower connection section, and the CS connecting upper connection section is electrically connected to the second transfer terminal upper connection section.

A scanning antenna according to an embodiment of the disclosure is a scanning antenna including any TFT substrate described above, a slot substrate disposed to face the TFT substrate, a liquid crystal layer provided between the TFT substrate and the slot substrate, and a reflective conductive plate disposed to face a surface of the slot substrate on a side opposite to the liquid crystal layer via a dielectric layer, wherein the slot substrate includes another dielectric substrate and a slot electrode formed on a surface of the another dielectric substrate on a side of the liquid crystal layer, and the slot electrode includes a plurality of slots, the plurality of slots being arranged corresponding to the patch electrodes of the plurality of antenna unit regions of the TFT substrate.

A manufacturing method of a TFT substrate according to an embodiment of the disclosure is a manufacturing method of any TFT substrate described above, the manufacturing method including a step (a) for forming the gate metal layer including the source lower connection wiring line on the dielectric substrate, a step (b) for depositing a gate insulating film on the gate metal layer, a step (c) for forming the source metal layer including the source bus line connection section on the gate insulating film, a step (d) for depositing a first insulating film on the source metal layer, a step (e) for depositing a patch conductive film on the first insulating film, a step (f) for patterning the patch conductive film to form the patch metal layer, a step (g) for depositing a second insulating film on the patch metal layer, and a step (h) for forming the first contact hole and the second contact hole in the gate insulating film, the first insulating film, and the second insulating film, wherein in the step (f), the source lower connection wiring line is covered by the gate insulating film and the first insulating film, and the source bus line connection section is covered by the first insulating film.

In an embodiment, the step (h) includes collectively etching the gate insulating film, the first insulating film, and the second insulating film.

Advantageous Effects of Disclosure

According to an embodiment of the disclosure, a scanning antenna which can be mass-manufactured by utilizing the known manufacturing techniques of LCDs, a TFT substrate used for such a scanning antenna, and a manufacturing method of such a TFT substrate, are provided.

BRIEF DESCRIPTION OF DRAWINGS

FIGS. 18A to 18C, and FIGS. 18E to 18G are each a diagram illustrating an example of a waveform of each signal used for driving the scanning antenna according to an embodiment, and FIG. 18D is a diagram illustrating a waveform of a display signal of an LCD panel performing dot inversion driving.

FIGS. 19A to 19E are each a diagram illustrating another example of a waveform of each signal used for driving the scanning antenna according to an embodiment.

FIGS. 21A to 21C are schematic plan views illustrating a TFT substrate 105 in a fourth embodiment.

FIGS. 22A to 22D are schematic cross-sectional views of the TFT substrate 105.

FIGS. 24A to 24C are schematic plan views illustrating a TFT substrate 106 in a fifth embodiment.

FIGS. 25A to 25D are schematic cross-sectional views of the TFT substrate 106.

FIGS. 26A to 26D are schematic cross-sectional views of the TFT substrate 106.

FIGS. 27A to 27E are process cross-sectional views illustrating an example of a manufacturing method of the TFT substrate 106.

FIGS. 28A to 28C are process cross-sectional views illustrating an example of the manufacturing method of the TFT substrate 106.

FIGS. 29A to 29C are process cross-sectional views illustrating an example of the manufacturing method of the TFT substrate 106.

FIGS. 30A and 30B are process cross-sectional views illustrating an example of the manufacturing method of the TFT substrate 106.

FIGS. 31A to 31C are schematic plan views illustrating a TFT substrate 107 in Modification Example of the fifth embodiment.

FIGS. 32A to 32D are schematic cross-sectional views of the TFT substrate 107.

FIGS. 33A to 33D are schematic cross-sectional views of the TFT substrate 107.

FIGS. 34A to 34E are process cross-sectional views illustrating an example of a manufacturing method of the TFT substrate 107.

FIGS. 36A to 36C are process cross-sectional views illustrating an example of a manufacturing method of the TFT substrate 107.

FIGS. 37A and 37B are process cross-sectional views illustrating an example of the manufacturing method of the TFT substrate 107.

FIG. 39B is a schematic cross-sectional view of an LCD panel 900a.

DESCRIPTION OF EMBODIMENTS

Hereinafter, a scanning antenna and a manufacturing method thereof according to embodiments of the disclosure will be described with reference to the drawings. In the following description, first, a structure and manufacturing method of a known TFT-type LCD (hereinafter referred to as a "TFT-LCD") will be described. However, the description of matters well-known within the technical field of LCDs may be omitted. For a description of basic TFT-LCD technology, please refer to, for example, Liquid Crystals, Applications and Uses, Vol. 1-3 (Editor: Birenda Bahadur, Publisher: World Scientific Pub Co Inc), or the like. For reference, the entire contents of the disclosures of the above documents are incorporated herein.

The structure and operation of a typical transmissive TFT-LCD (hereinafter simply referred to as an "LCD") 900 will be described with reference to FIGS. 39A and 39B. Here, the LCD 900 with a vertical electric field mode (for example, a TN mode or a vertical alignment mode) in which a voltage is applied in a thickness direction of a liquid crystal layer is provided as an example. The frame frequency (which is typically twice a polarity inversion frequency) of the voltage applied to the liquid crystal capacitance of the LCD is 240 Hz even at quad speed driving, and the dielectric constant E of the liquid crystal layer that serves as the dielectric layer of the liquid crystal capacitance of the LCD is different from the dielectric constant M ($\varepsilon_M$) of microwaves (for example, satellite broadcasting, the Ku band (from 12 to 18 GHz), the K band (from 18 to 26 GHz), and the Ka band (from 26 to 40 GHz)).

Figure 39A:
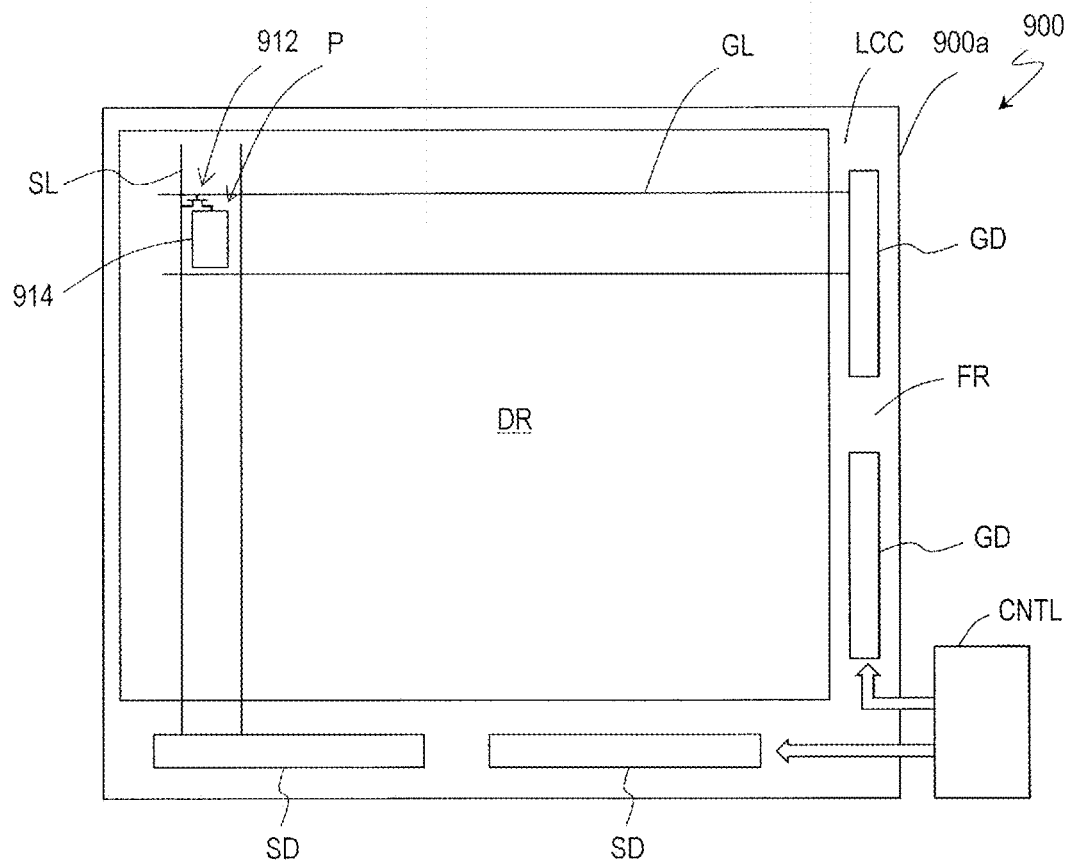
FIG. 39A is a schematic diagram illustrating a structure of a known LCD 900.

As is schematically illustrated in FIG. 39A, the transmissive LCD 900 includes a liquid crystal display panel 900*a*, a control circuit CNTL, a backlight (not illustrated), and a power source circuit (not illustrated). The liquid crystal display panel 900*a* includes a liquid crystal display cell LCC and a driving circuit including a gate driver GD and a source driver SD. The driving circuit may be, for example, mounted on a TFT substrate 910 of the liquid crystal display cell LCC, or all or a part of the driving circuit may be integrated (monolithic integration) with the TFT substrate 910.

Figure 39B:
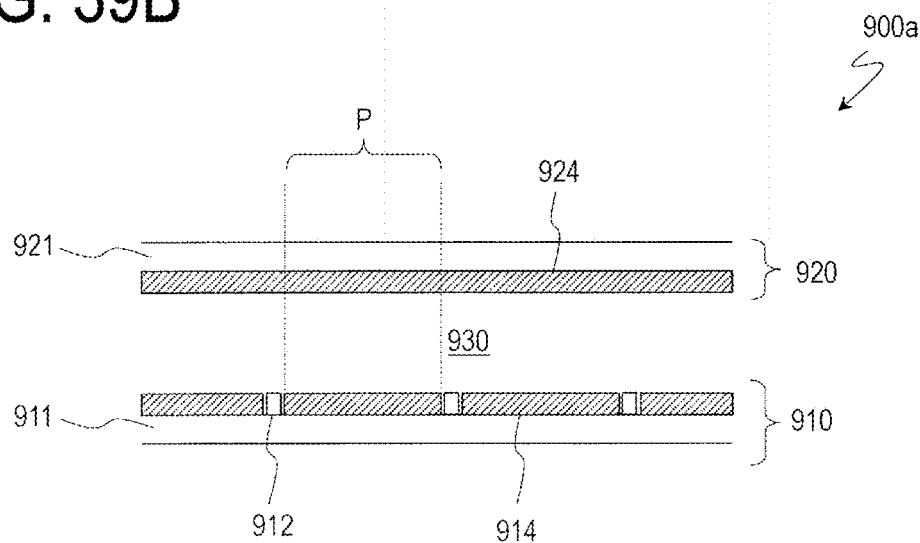

FIG. 39B illustrates a schematic cross-sectional view of the liquid crystal display panel (hereinafter referred to as an "LCD panel") 900*a* included in the LCD 900. The LCD panel 900*a* includes the TFT substrate 910, a counter substrate 920, and a liquid crystal layer 930 provided therebetween. Both the TFT substrate 910 and the counter substrate 920 include transparent substrates 911 and 921, such as glass substrates. In addition to glass substrates, plastic substrates may also be used as the transparent substrates 911 and 921 in some cases. The plastic substrates are formed of, for example, a transparent resin (for example, polyester) and a glass fiber (for example, nonwoven fabric).

A display region DR of the LCD panel 900*a* is configured of pixels P arranged in a matrix. A frame region FR that does not serve as part of the display is formed around the display region DR. The liquid crystal material is sealed in the display region DR by a sealing portion (not illustrated) formed surrounding the display region DR. The sealing portion is formed by curing a sealing member including, for example, an ultraviolet curable resin and a spacer (for example, resin beads or silica beads), and bonds and secures the TFT substrate 910 and the counter substrate 920 to each other. The spacer in the sealing member controls a gap between the TFT substrate 910 and the counter substrate 920, that is, a thickness of the liquid crystal layer 930, to be constant. To suppress an in-plane variation in the thickness of the liquid crystal layer 930, columnar spacers are formed on light blocking portions (for example, on a wiring line) in the display region DR by using an ultraviolet curable resin. In recent years, as seen in LCD panels for liquid crystal televisions and smart phones, a width of the frame region FR that does not serve as part of the display is very narrow.

In the TFT substrate 910, a TFT 912, a gate bus line (scanning line) GL, a source bus line (display signal line) SL, a pixel electrode 914, an auxiliary capacitance electrode (not illustrated), and a CS bus line (auxiliary capacitance line) (not illustrated) are formed on the transparent substrate 911. The CS bus line is provided parallel to the gate bus line. Alternatively, the gate bus line of the next stage may be used as the CS bus line (CS on-gate structure).

The pixel electrode 914 is covered with an alignment film (for example, a polyimide film) for controlling the alignment of the liquid crystals. The alignment film is provided so as to be in contact with the liquid crystal layer 930. The TFT substrate 910 is often disposed on the backlight side (the side opposite to the viewer).

The counter substrate 920 is often disposed on the observer side of the liquid crystal layer 930. The counter substrate 920 includes a color filter layer (not illustrated), a counter electrode 924, and an alignment film (not illustrated) on the transparent substrate 921. Since the counter electrode 924 is provided in common to a plurality of pixels P constituting the display region DR, it is also referred to as a common electrode. The color filter layer includes a color filter (for example, a red filter, a green filter, and a blue filter) provided for each pixel P, and a black matrix (light shielding layer) for blocking light unnecessary for display. The black matrix is arranged, for example, so as to block lights between the pixels P in the display region DR and at the frame region FR.

The pixel electrode 914 of the TFT substrate 910, the counter electrode 924 of the counter substrate 920, and the liquid crystal layer 930 therebetween constitute a liquid crystal capacitance Clc. Individual liquid crystal capacitances correspond to the pixels. To retain the voltage applied to the liquid crystal capacitance Clc (so as to increase what is known as the voltage holding rate), an auxiliary capacitance CS electrically connected in parallel with the liquid crystal capacitance Clc is formed. The auxiliary capacitance CS is typically composed of an electrode having the same potential as the pixel electrode 914, an inorganic insulating layer (for example, a gate insulating layer ($SiO_2$ layer)), and an auxiliary capacitance electrode connected to the CS bus line. Typically, the same common voltage as the counter electrode 924 is supplied from the CS bus line.

Factors responsible for lowering the voltage (effective voltage) applied to the liquid crystal capacitance Clc are (1) those based on a CR time constant which is a product of a capacitance value $C_{Clc}$ of the liquid crystal capacitance Clc and a resistance value R, and (2) interfacial polarization due to ionic impurities included in the liquid crystal material and/or the orientation polarization of liquid crystal molecules. Among these, the contribution of the CR time constant of the liquid crystal capacitance Clc is large, and the CR time constant can be increased by providing an auxiliary capacitance CS electrically connected in parallel with the liquid crystal capacitance Clc. Note that a volume resistivity of the liquid crystal layer 930 that serves as the dielectric layer of the liquid crystal capacitance Clc exceeds the order of $10^{12}$ Ω·cm in the case of widely used nematic liquid crystal materials.

A display signal supplied to the pixel electrode 914 is a display signal that is supplied to the source bus line SL connected to the TFT 912 when the TFT 912 selected by a scanning signal supplied from the gate driver GD to the gate bus line GL is turned on. Accordingly, the TFTs 912 connected to a particular gate bus line GL are simultaneously turned on, and at that time, corresponding display signals are supplied from the source bus lines SL connected to the respective TFTs 912 of the pixels P in that row. By performing this operation sequentially from the first row (for example, the uppermost row of a display surface) to the m-th row (for example, the lowermost row of the display surface), one image (frame) is written in the display region DR composed of m rows of pixels and is displayed. Assuming that the pixels P are arranged in a matrix of m rows and n columns, at least n source bus lines SL are provided in total such that at least one source bus line SL corresponds to each pixel column.

Such scanning is referred to as line-sequential scanning, a time between one pixel row being selected and the next pixel row being selected is called a horizontal scan period, (1H), and a time between a particular row being selected and then being selected a second time is called a vertical scanning period, (1V), or a frame. Note that, in general, 1V (or 1 frame) is obtained by adding the blanking period to the period m·H for selecting all m pixel rows.

For example, when an input video signal is an NTSC signal, 1V (=1 frame) of a known LCD panel is 1/60 of a second (16.7 milliseconds). The NTSC signals are interlaced signals, the frame frequency is 30 Hz, and the field frequency is 60 Hz, but in LCD panels, since it is necessary to supply display signals to all the pixels in each field, they are driven with 1V=(1/60) second (driven at 60 Hz). Note that, in recent years, to improve the video display characteristics, there are LCD panels driven at double speed drive (120 Hz drive, 1V=(1/120 second)), and some LCD panels are driven at quad speed (240 Hz drive, 1V=(1/240 second)) for 3D displays.

When a DC voltage is applied to the crystal layer 930, the effective voltage decreases and the luminance of the pixel P decreases. Since the above-mentioned interface polarization and/or the orientation polarization contribute to the decrease in the effective voltage, it is difficult for the auxiliary capacitance CS to prevent the decrease in the effective voltage completely. For example, when a display signal corresponding to a particular intermediate gray scale is written into every pixel in every frame, the luminance fluctuates for each frame and is observed as flicker. In addition, when a DC voltage is applied to the liquid crystal layer 930 for an extended period of time, electrolysis of the liquid crystal material may occur. Furthermore, impurity ions segregate at one side of the electrode, so that the effective voltage may not be applied to the liquid crystal layer and the liquid crystal molecules may not move. To prevent this, the LCD panel 900a is subjected to so-called AC driving. Typically, frame-reversal driving is performed in which the polarity of the display signal is inverted every frame (every vertical scanning period). For example, in the known LCD panels, the polarity inversion is performed every 1/60 second (a polarity inversion cycle is 30 Hz).

In addition, dot inversion driving, line reversal driving, or the like is performed in order to uniformly distribute the pixels having different polarities of applied voltages even within one frame. This is because it is difficult to completely match the magnitude of the effective voltage applied to the liquid crystal layer between a positive polarity and a negative polarity. For example, in a case where the volume resistivity of the liquid crystal material exceeds the order of $10^{12}$ Ω·cm, flicker is hardly recognizable in a case where the dot inversion or line reversal driving is performed every 1/60 second.

With respect to the scanning signal and the display signal in the LCD panel 900a, on the basis of the signals supplied from the control circuit CNTL to the gate driver GD and the source driver SD, the gate driver GD and the source driver SD supply the scanning signal and the display signal to the gate bus line GL and the source bus line SL, respectively. For example, the gate driver GD and the source driver SD are each connected to corresponding terminals provided on the TFT substrate 910. The gate driver GD and the source driver SD may be mounted on the frame region FR of the TFT substrate 910 as a driver IC, for example, or may be monolithically formed in the frame region FR of the TFT substrate 910.

The counter electrode 924 of the counter substrate 920 is electrically connected to a terminal (not illustrated) of the TFT substrate 910 with a conductive portion (not illustrated) known as a transfer therebetween. The transfer is formed, for example, so as to overlap the sealing portion, or alternatively so as to impart conductivity to a part of the sealing portion. This is done to narrow the frame region FR. A common voltage is directly or indirectly supplied to the counter electrode 924 from the control circuit CNTL. Typically, the common voltage is also supplied to the CS bus line as described above.

Basic Structure of Scanning Antenna

By controlling the voltage applied to each liquid crystal layer of each antenna unit corresponding to the pixels of the LCD panel and changing the effective dielectric constant M ($\varepsilon_M$) of the liquid crystal layer for each antenna unit, a scanning antenna equipped with an antenna unit that uses the anisotropy (birefringence index) of a large dielectric constant M ($\varepsilon_M$) of a liquid crystal material forms a two-dimensional pattern by antenna units with different electrostatic capacitances (corresponding to displaying of an image by an LCD). An electromagnetic wave (for example, a microwave) emitted from an antenna or received by an antenna is given a phase difference depending on the electrostatic capacitance of each antenna unit, and gains a strong directivity in a particular direction depending on the two-dimensional pattern formed by the antenna units having different electrostatic capacitances (beam scanning). For example, an electromagnetic wave emitted from an antenna is obtained by integrating, with consideration for the phase difference provided by each antenna unit, spherical waves obtained as a result of input electromagnetic waves entering each antenna unit and being scattered by each antenna unit. It can be considered that each antenna unit functions as a "phase shifter". For a description of the basic structure and operating principles of a scanning antenna that uses a liquid crystal material, refer to PTL 1 to PTL 4 as well as NPL 1 and NPL 2. NPL 2 discloses the basic structure of a scanning antenna in which spiral slots are arranged. For reference, the entire contents of the disclosures of PTL 1 to PTL 4 as well as NPL 1 and NPL 2 are incorporated herein.

Note that although the antenna units in the scanning antenna according to the embodiments of the disclosure are similar to the pixels of the LCD panel, the structure of the antenna units is different from the structure of the pixel of the LCD panel, and the arrangement of the plurality of antenna units is also different from the arrangement of the pixels in the LCD panel. A basic structure of the scanning antenna according to the embodiments of the disclosure will be described with reference to FIG. 1, which illustrates a scanning antenna 1000 of a first embodiment to be described in detail later. Although the scanning antenna 1000 is a radial in-line slot antenna in which slots are concentrically arranged, the scanning antennas according to the embodiments of the disclosure are not limited to this. For example, the arrangement of the slots may be any of various known arrangements. In particular, with respect to the slot and/or antenna unit arrangements, the entire disclosure of PTL 5 is incorporated herein by reference.

Figure 1:
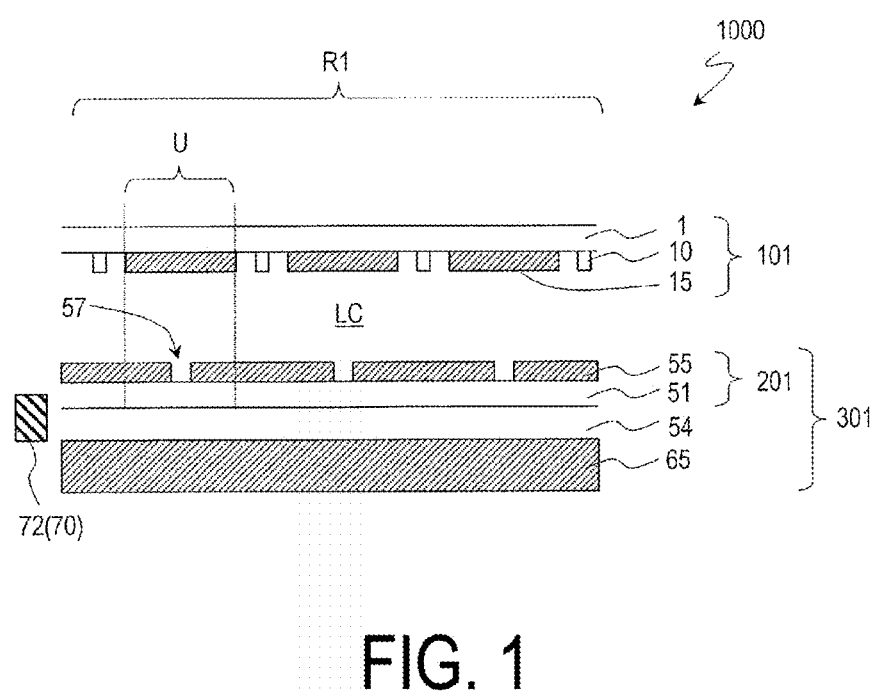
FIG. 1 is a cross-sectional view schematically illustrating a portion of a scanning antenna 1000 according to a first embodiment.

FIG. 1 is a cross-sectional view schematically illustrating a portion of the scanning antenna 1000 of the present embodiment, and schematically illustrates a part of the cross-section along the radial direction from a power feed pin 72 (see FIG. 2B) provided near the center of the concentrically arranged slots.

The scanning antenna 1000 includes a TFT substrate 101, a slot substrate 201, a liquid crystal layer LC provided therebetween, and a reflective conductive plate 65 opposing the slot substrate 201 with an air layer 54 interposed between the slot substrate 201 and the reflective conductive plate 65. The scanning antenna 1000 transmits and receives microwaves from a side closer to the TFT substrate 101.

The TFT substrate 101 includes a dielectric substrate 1 such as a glass substrate, a plurality of patch electrodes 15 and a plurality of TFTs 10 formed on the dielectric substrate 1. Each patch electrode 15 is connected to a corresponding TFT 10. Each TFT 10 is connected to a gate bus line and a source bus line.

The slot substrate 201 includes a dielectric substrate 51 such as a glass substrate and a slot electrode 55 formed on a side of the dielectric substrate 51 closer to the liquid crystal layer LC. The slot electrode 55 includes a plurality of slots 57.

The reflective conductive plate 65 is disposed opposing the slot substrate 201 with the air layer 54 interposed between the reflective conductive plate 65 and the slot substrate 201. In place of the air layer 54, a layer formed of a dielectric (for example, a fluorine resin such as PTFE) having a small dielectric constant M for microwaves can be used. The slot electrode 55, the reflective conductive plate 65, and the dielectric substrate 51 and the air layer 54 therebetween function as a waveguide 301.

Figure 17:
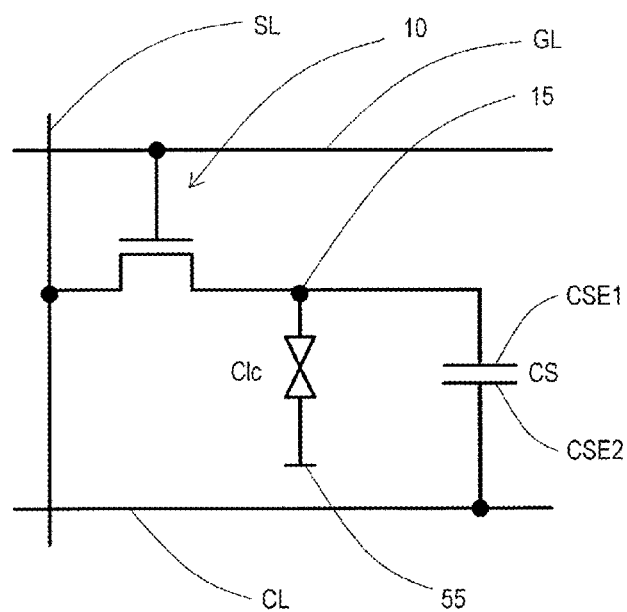
FIG. 17 is a diagram illustrating an equivalent circuit of one antenna unit in a scanning antenna according to an embodiment of the disclosure.

The patch electrode 15, the portion of the slot electrode 55 including the slot 57, and the liquid crystal layer LC therebetween constitute an antenna unit U. In each antenna unit U, one patch electrode 15 is opposed to a portion of the slot electrode 55 including one slot 57 with a liquid crystal layer LC interposed therebetween, thereby constituting the liquid crystal capacitance. The structure in which the patch electrode 15 and the slot electrode 55 oppose each other with the liquid crystal layer LC interposed therebetween is similar to the structure illustrated in FIGS. 39A and 39B in which the pixel electrode 914 and the counter electrode 924 of the LCD panel 900a oppose each other with the liquid crystal layer 930 interposed therebetween. That is, the antenna unit U of the scanning antenna 1000 and the pixel P of the LCD panel 900a have a similar configuration. In addition, the antenna unit has a configuration similar to that of the pixel P in the LCD panel 900a in that the antenna unit has an auxiliary capacitance electrically connected in parallel with the liquid crystal capacitance (see FIG. 13A and FIG. 17). However, the scanning antenna 1000 has many differences from the LCD panel 900a.

First, the performance required for the dielectric substrates 1 and 51 of the scanning antenna 1000 is different from the performance required for the substrate of the LCD panel.

Generally, transparent substrates that are transparent to visible light are used for LCD panels. For example, glass substrates or plastic substrates are used. In reflective LCD panels, since the substrate on the back side does not need transparency, a semiconductor substrate may be used in some cases. In contrast to this, it is preferable for the dielectric substrates 1 and 51 used for the antennas to have small dielectric losses with respect to microwaves (where the dielectric tangent with respect to microwaves is denoted as tan $\delta_M$). The tan $\delta_M$ of each of the dielectric substrates 1 and 51 is preferably approximately less than or equal to 0.03, and more preferably less than or equal to 0.01. Specifically, a glass substrate or a plastic substrate can be used. Glass substrates are superior to plastic substrates with respect to dimensional stability and heat resistance, and are suitable for forming circuit elements such as TFTs, a wiring line, and electrodes using LCD technology. For example, in a case where the materials forming the waveguide are air and glass, as the dielectric loss of glass is greater, from the viewpoint that thinner glass can reduce the waveguide loss, it is preferable for the thickness to be less than or equal to 400 µm, and more preferably less than or equal to 300 µm. There is no particular lower limit, provided that the glass can be handled such that it does not break in the manufacturing process.

The conductive material used for the electrode is also different. In many cases, an ITO film is used as a transparent conductive film for pixel electrodes and counter electrodes of LCD panels. However, ITO has a large tan $\delta_M$ with respect to microwaves, and as such cannot be used as the conductive layer in an antenna. The slot electrode 55 functions as a wall for the waveguide 301 together with the reflective conductive plate 65. Accordingly, to suppress the transmission of microwaves in the wall of the waveguide 301, it is preferable that the thickness of the wall of the waveguide 301, that is, the thickness of the metal layer (Cu layer or Al layer) be large. It is known that in a case where the thickness of the metal layer is three times the skin depth, electromagnetic waves are attenuated to 1/20 (−26 dB), and in a case where the thickness is five times the skin depth, electromagnetic waves are attenuated to about 1/150 (−43 dB). Accordingly, in a case where the thickness of the metal layer is five times the skin depth, the transmittance of electromagnetic waves can be reduced to 1%. For example, for a microwave of 10 GHz, in a case where a Cu layer having a thickness of greater than or equal to 3.3 µm and an Al layer having a thickness of greater than or equal to 4.0 µm are used, microwaves can be reduced to 1/150. In addition, for a microwave of 30 GHz, in a case where a Cu layer having a thickness of greater than or equal to 1.9 µm and an Al layer having a thickness of greater than or equal to 2.3 µm are used, microwaves can be reduced to 1/150. In this way, the slot electrode 55 is preferably formed of a relatively thick Cu layer or Al layer. There is no particular upper limit for the thickness of the Cu layer or the Al layer, and the thicknesses can be set appropriately in consideration of the time and cost of film formation. The usage of a Cu layer provides the advantage of being thinner than the case of using an Al layer. Relatively thick Cu layers or Al layers can be formed not only by the thin film deposition method used in LCD manufacturing processes, but also by other methods such as bonding Cu foil or Al foil to the substrate. The thickness of the metal layer, for example, ranges from 2 µm to 30 µm. When the thin film deposition methods are used, the thickness of the metal layer is preferably less than or equal to 5 µm. Note that aluminum plates, copper plates, or the like having a thickness of several mm can be used as the reflective conductive plate 65, for example.

Since the patch electrode 15 does not configure the waveguide 301 like the slot electrode 55, a Cu layer or an Al layer can be used that has a smaller thickness than that of the slot electrode 55. However, to avoid losses caused by heat when the oscillation of free electrons near the slot 57 of the slot electrode 55 induces the oscillation of the free electrons in the patch electrode 15, it is preferable that the resistance be low. From the viewpoint of mass production, it is preferable to use an Al layer rather than a Cu layer, and the thickness of the Al layer is preferably greater than or equal to 0.3 µm and less than or equal to 2 µm, for example.

In addition, an arrangement pitch of the antenna units U is considerably different from that of a pixel pitch. For example, considering an antenna for microwaves of 12 GHz (Ku band), the wavelength λ is 25 mm, for example. Then, as described in PTL 4, since the pitch of the antenna unit U is less than or equal to 2λ/4 and/or less than or equal to λ/5, the arrangement pitch becomes less than or equal to 6.25 mm and/or less than or equal to 5 mm. This is ten times or greater than the pixel pitch of the LCD panel. Accordingly, the length and width of the antenna unit U are also roughly ten times greater than the pixel length and width of the LCD panel.

Of course, the arrangement of the antenna units U may be different from the arrangement of the pixels in the LCD panel. Herein, although an example is illustrated in which the antenna units U are arranged in concentric circles (for example, refer to JP 2002-217640 A), the present disclosure is not limited thereto, and the antenna units may be arranged in a spiral shape as described in NPL 2, for example. Furthermore, the antenna units may be arranged in a matrix as described in PTL 4.

The properties required for the liquid crystal material of the liquid crystal layer LC of the scanning antenna 1000 are different from the properties required for the liquid crystal material of the LCD panel. In the LCD panel, a change in a refractive index of the liquid crystal layer of the pixels allows a phase difference to be provided to the polarized visible light (wavelength of from 380 nm to 830 nm) such that the polarization state is changed (for example, the change in the refractive index allows the polarization axis direction of linearly polarized light to be rotated or the degree of circular polarization of circularly polarized light to be changed), whereby display is performed. In contrast, in the scanning antenna 1000 according to the embodiment, the phase of the microwave excited (re-radiated) from each patch electrode is changed by changing the electrostatic capacitance value of the liquid crystal capacitance of the antenna unit U. Accordingly, the liquid crystal layer preferably has a large anisotropy ($\Delta\varepsilon_M$) of the dielectric constant M (CM) for microwaves, and tan $\delta_M$ is preferably small. For example, the $\Delta\varepsilon_M$ of greater than or equal to 4 and the $\delta_M$ of less than or equal to 0.02 (values of 19 GHz in both cases) described in SID 2015 DIGEST pp. 824-826 written by M. Witteck et al, can be suitably used. In addition, it is possible to use a liquid crystal material having a $\Delta\varepsilon_M$ of greater than or equal to 0.4 and a $\delta_M$ of less than or equal to 0.04 as described in POLYMERS 55 vol. August issue pp. 599-602 (2006), written by Kuki.

In general, the dielectric constant of a liquid crystal material has a frequency dispersion, but the dielectric anisotropy $\Delta\varepsilon_M$ for microwaves has a positive correlation with the refractive index anisotropy Δn with respect to visible light. Accordingly, it can be said that a material having a large refractive index anisotropy Δn with respect to visible light is preferable as a liquid crystal material for an antenna unit for microwaves. The refractive index anisotropy Δn of the liquid crystal material for LCDs is evaluated by the refractive index anisotropy for light having a wavelength of 550 nm. Here again, when a Δn (birefringence index) is used as an index for light having a wavelength of 550 nm, a nematic liquid crystal having a Δn of greater than or equal to 0.3, preferably greater than or equal to 0.4, can be used for an antenna unit for microwaves. An has no particular upper limit. However, since liquid crystal materials having a large Δn tend to have a strong polarity, there is a possibility that reliability may decrease. From the viewpoint of reliability, Δn is preferably less than or equal to 0.4. The thickness of the liquid crystal layer is, for example, from 1 µm to 500 µm.

Hereinafter, the structure and manufacturing method of the scanning antenna according to the embodiments of the disclosure will be described in more detail.

First Embodiment

Figure 2A:
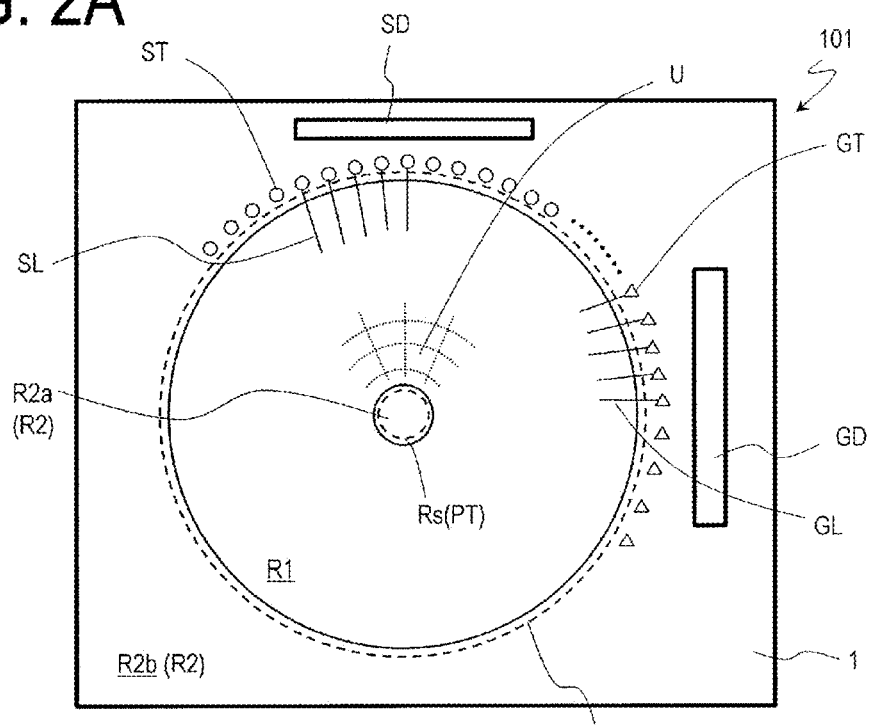
FIGS. 2A and 2B are schematic plan views illustrating a TFT substrate 101 and a slot substrate 201 in the scanning antenna 1000, respectively.
Figure 2B:
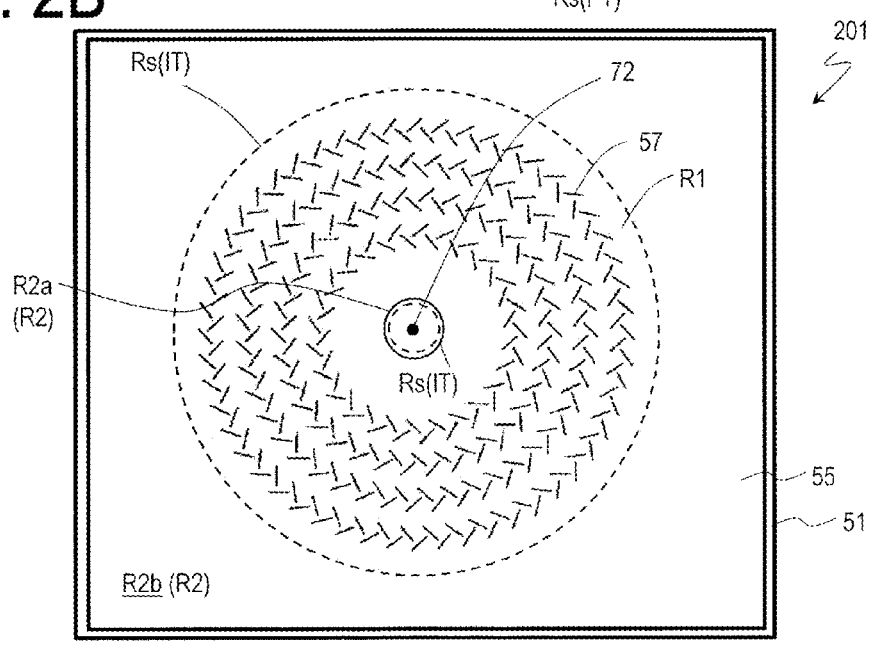

First, a description is given with reference to FIG. 1 and FIGS. 2A and 2B. FIG. 1 is a schematic partial cross-sectional view of the scanning antenna 1000 near the center thereof as described above, and FIGS. 2A and 2B are schematic plan views illustrating the TFT substrate 101 and the slot substrate 201 in the scanning antenna 1000, respectively.

The scanning antenna 1000 includes a plurality of antenna units U arranged two-dimensionally. In the scanning antenna 1000 exemplified here, the plurality of antenna units are arranged concentrically. In the following description, the region of the TFT substrate 101 and the region of the slot substrate 201 corresponding to the antenna unit U will be referred to as "antenna unit region", and be denoted with the same reference numeral U as the antenna unit. In addition, as illustrated in FIGS. 2A and 2B, in the TFT substrate 101 and the slot substrate 201, a region defined by the plurality of two-dimensionally arranged antenna unit regions is referred to as "transmission and/or reception region R1", and a region other than the transmission and/or reception region R1 is called a "non-transmission and/or reception region R2". A terminal section, a driving circuit, and the like are provided in the non-transmission and/or reception region R2.

FIG. 2A is a schematic plan view illustrating the TFT substrate 101 in the scanning antenna 1000.

In the illustrated example, the transmission and/or reception region R1 has a donut-shape when viewed from a normal direction of the TFT substrate 101. The non-transmission and/or reception region R2 includes a first non-transmission and/or reception region R2a located at the center of the transmission and/or reception region R1 and a second non-transmission and/or reception region R2b located at the periphery of the transmission and/or reception region R1. An outer diameter of the transmission and/or reception region R1, for example, is from 200 mm to 1500 mm, and is configured according to a data traffic volume or the like.

A plurality of gate bus lines GL and a plurality of source bus lines SL supported by the dielectric substrate 1 are provided in the transmission and/or reception region R1 of the TFT substrate 101, and the antenna unit regions U are defined by these wiring lines. The antenna unit regions U are, for example, arranged concentrically in the transmission and/or reception region R1. Each of the antenna unit regions U includes a TFT and a patch electrode electrically connected to the TFT. The source electrode of the TFT is electrically connected to the source bus line SL, and the gate electrode is electrically connected to the gate bus line GL. In addition, the drain electrode is electrically connected to the patch electrode.

In the non-transmission and/or reception region R2 (R2a, R2b), a seal region Rs is disposed surrounding the transmission and/or reception region R1. A sealing member (not illustrated) is applied to the seal region Rs. The sealing member bonds the TFT substrate 101 and the slot substrate 201 to each other, and also encloses liquid crystals between these substrates 101, 201.

A gate terminal section GT, the gate driver GD, a source terminal section ST, and the source driver SD are provided outside the sealing region Rs in the non-transmission and/or reception region R2. Each of the gate bus lines GL is connected to the gate driver GD with the gate terminal section GT therebetween. Each of the source bus lines SL is connected to the source driver SD with the source terminal section ST therebetween. Note that, in this example, although the source driver SD and the gate driver GD are formed on the dielectric substrate 1, one or both of these drivers may be provided on another dielectric substrate.

Also, a plurality of transfer terminal sections PT are provided in the non-transmission and/or reception region R2. The transfer terminal section PT is electrically connected to the slot electrode 55 (FIG. 2B) of the slot substrate 201. In the present specification, the connection section between the transfer terminal section PT and the slot electrode 55 is referred to as a "transfer section". As illustrated in drawings, the transfer terminal section PT (transfer section) may be disposed in the seal region Rs. In this case, a resin containing conductive particles may be used as the sealing member. In this way, liquid crystals are sealed between the TFT substrate 101 and the slot substrate 201, and an electrical connection can be secured between the transfer terminal section PT and the slot electrode 55 of the slot substrate 201. In this example, although a transfer terminal section PT is disposed in both the first non-transmission and/or reception region R2a and the second non-transmission and/or reception region R2b, the transfer terminal section PT may be disposed in only one of them.

Note that the transfer terminal section PT (transfer section) need not be disposed in the seal region Rs. For example, the transfer terminal section PT may be disposed outside the seal region Rs in the non-transmission and/or reception region R2.

FIG. 2B is a schematic plan view illustrating the slot substrate 201 in the scanning antenna 1000, and illustrates the surface of the slot substrate 201 closer to the liquid crystal layer LC.

In the slot substrate 201, the slot electrode 55 is formed on the dielectric substrate 51 extending across the transmission and/or reception region R1 and the non-transmission and/or reception region R2.

In the transmission and/or reception region R1 of the slot substrate 201, a plurality of slots 57 are formed in the slot electrode 55. The slots 57 are formed corresponding to the antenna unit region U on the TFT substrate 101. For the plurality of slots 57 in the illustrated example, a pair of slots 57 extending in directions substantially orthogonal to each other are concentrically disposed so that a radial inline slot antenna is configured. Since the scanning antenna 1000 includes slots that are substantially orthogonal to each other, the scanning antenna 1000 can transmit and receive circularly polarized waves.

A plurality of terminal sections IT of the slot electrode 55 are provided in the non-transmission and/or reception region R2. The terminal section IT is electrically connected to the transfer terminal section PT (FIG. 2A) of the TFT substrate 101. In this example, the terminal section IT is disposed within the seal region Rs, and is electrically connected to a corresponding transfer terminal section PT by a sealing member containing conductive particles.

In addition, the power feed pin 72 is disposed on a rear surface side of the slot substrate 201 in the first non-transmission and/or reception region R2a. The power feed pin 72 allows microwaves to be inserted into the waveguide 301 constituted by the slot electrode 55, the reflective conductive plate 65, and the dielectric substrate 51. The power feed pin 72 is connected to a power feed device 70. Power feeding is performed from the center of the concentric circle in which the slots 57 are arranged. The power feed method may be either a direct coupling power feed method or an electromagnetic coupling method, and a known power feed structure can be utilized.

In FIGS. 2A and 2B, an example is illustrated in which the seal region Rs is provided so as to surround a relatively narrow region including the transmission and/or reception region R1, but the arrangement of the seal region Rs is not limited to this. In particular, the seal region Rs provided outside the transmission and/or reception region R1 may be provided nearby the side of the dielectric substrate 1 and/or the dielectric substrate 51, for example, so as to maintain a certain distance or more from the transmission and/or reception region R1. Of course, the terminal section and the driving circuit, for example, that are provided in the non-transmission and/or reception region R2 may be formed outside the seal region Rs (that is, the side where the liquid crystal layer is not present). By forming the seal region Rs at a position separated from the transmission and/or reception region R1 by a certain distance or more, it is possible to prevent the antenna characteristics from deteriorating due to the influence impurities (in particular, ionic impurities) contained in the sealing member (in particular, a curable resin).

Figure 3A:
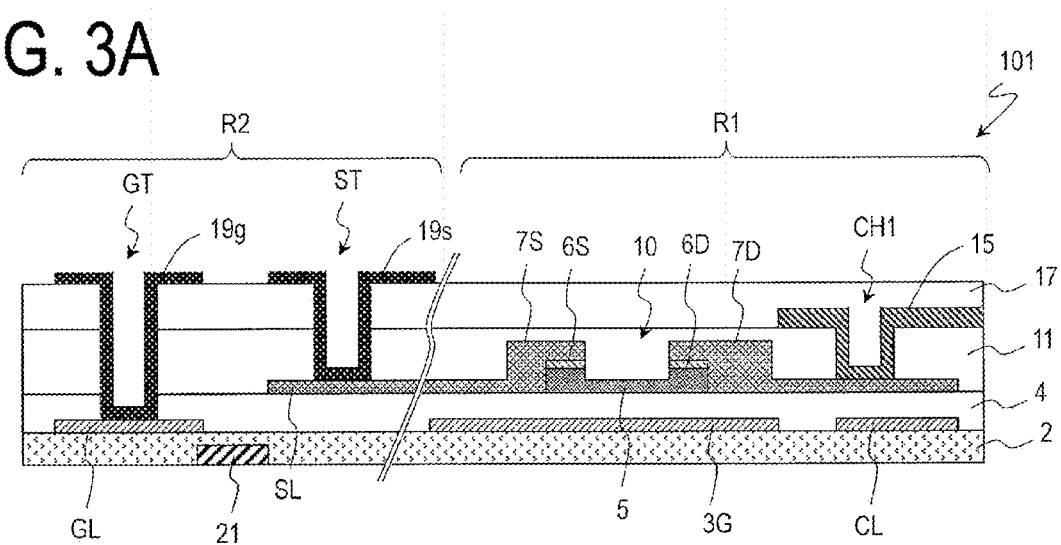
FIGS. 3A and 3B are a cross-sectional view and a plane view schematically illustrating an antenna unit region U of the TFT substrate 101, respectively.
Figure 3B:
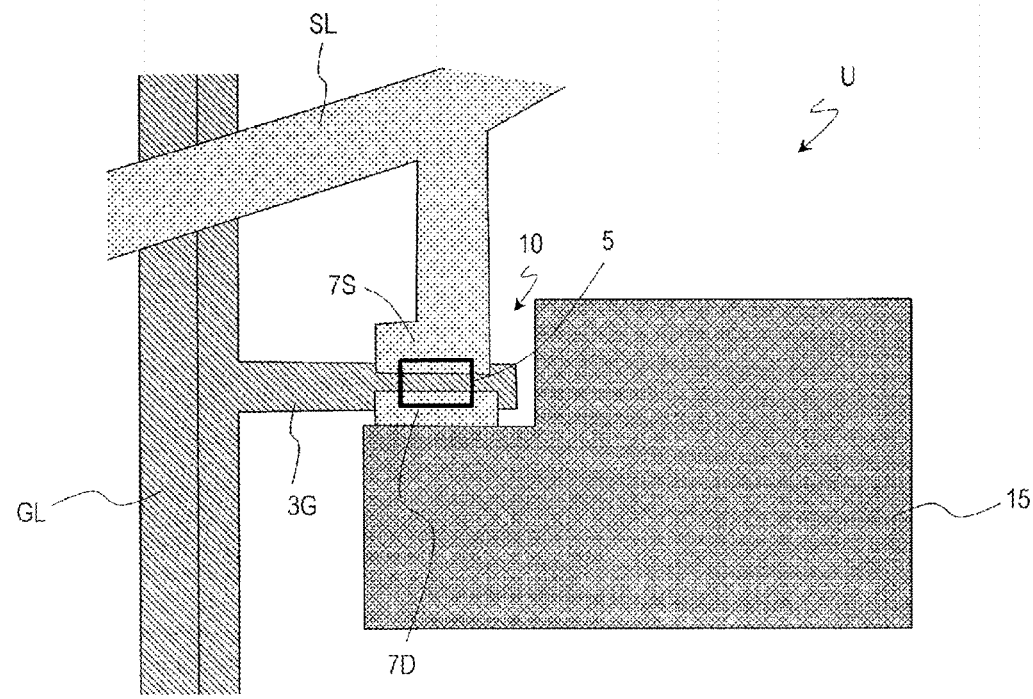

In the following, each component of the scanning antenna 1000 will be described in detail with reference to drawings.
Structure of TFT Substrate 101
Antenna Unit Region U FIGS. 3A and 3B are a cross-sectional view and a plane view schematically illustrating the antenna unit region U of the TFT substrate 101, respectively.

Each of the antenna unit regions U includes a dielectric substrate (not illustrated), a TFT 10 supported by the dielectric substrate, a first insulating layer 11 covering the TFT 10, a patch electrode 15 formed on the first insulating layer 11 and electrically connected to the TFT 10, and a second insulating layer 17 covering the patch electrode 15. The TFT 10 is disposed, for example, at or near an intersection of the gate bus line GL and the source bus line SL.

The TFT 10 include a gate electrode 3G, an island-shaped semiconductor layer 5, a gate insulating layer 4 disposed between the gate electrode 3G and the semiconductor layer 5, a source electrode 7S, and a drain electrode 7D. The structure of the TFT 10 is not particularly limited to a specific structure. In this example, the TFT 10 is a channel etch-type TFT having a bottom gate structure.

The gate electrode 3G is electrically connected to the gate bus line GL, and a scanning signal is supplied via the gate bus line GL. The source electrode 7S is electrically connected to the source bus line SL, and a data signal is supplied via the source bus line SL. The gate electrode 3G and the gate bus line GL may be formed of the same conductive film (gate conductive film). The source electrode 7S, the drain electrode 7D, and the source bus line SL may be formed from the same conductive film (source conductive film). The gate conductive film and the source conductive film are, for example, metal films. In the present specification, layers formed using a gate conductive film may be referred to as "gate metal layers", and layers formed using a source conductive film may be referred to as "source metal layers".

The semiconductor layer 5 is disposed overlapping the gate electrode 3G with the gate insulating layer 4 interposed therebetween. In the illustrated example, a source contact layer 6S and a drain contact layer 6D are formed on the semiconductor layer 5. The source contact layer 6S and the drain contact layer 6D are disposed on both sides of a region where a channel is formed in the semiconductor layer 5 (channel region). The semiconductor layer 5 may be an intrinsic amorphous silicon (i-a-Si) layer, and the source contact layer 6S and the drain contact layer 6D may be $n^+$ type amorphous silicon ($n^+$-a-Si) layers.

The source electrode 7S is provided in contact with the source contact layer 6S and is connected to the semiconductor layer 5 with the source contact layer 6S interposed therebetween. The drain electrode 7D is provided in contact with the drain contact layer 6D and is connected to the semiconductor layer 5 with the drain contact layer 6D interposed therebetween.

The first insulating layer 11 includes a contact hole CH1 that at least reaches the drain electrode 7D of the TFT 10.

The patch electrode 15 is provided on the first insulating layer 11 and within the contact hole CH1, and is in contact with the drain electrode 7D in the contact hole CH1. The patch electrode 15 includes a metal layer. The patch electrode 15 may be a metal electrode formed only from a metal layer. The material of the patch electrode 15 may be the same as that of the source electrode 7S and the drain electrode 7D. However, a thickness of the metal layer in the patch electrode 15 (a thickness of the patch electrode 15 when the patch electrode 15 is a metal electrode) is set to be greater than thicknesses of the source electrode 7S and the drain electrode 7D. The thickness of the metal layer in the patch electrode 15 is set to, for example, greater than or equal to 0.3 μm when it is formed of an Al layer.

A CS bus line CL may be provided using the same conductive film as that of the gate bus line GL. The CS bus line CL may be disposed overlapping the drain electrode (or extended portion of the drain electrode) 7D with the gate insulating layer 4 interposed therebetween, and may constitute the auxiliary capacitance CS having the gate insulating layer 4 as a dielectric layer.

An alignment mark (for example, a metal layer) 21 and a base insulating film 2 covering the alignment mark 21 may be formed at a position closer to the dielectric substrate than a position of the gate bus line GL. The alignment mark 21 is used as follows. When manufacturing m TFT substrates from one glass substrate, in a case where the number of photomasks is n (where n<m), for example, it is necessary to perform each exposure process multiple times. In this way, when the number (n) of photomasks is less than the number (m) of TFT substrates 101 manufactured from one glass substrate 1, the alignment mark 21 can be used for alignment of the photomasks. The alignment marks 21 may be omitted.

In the present embodiment, the patch electrode 15 is formed in a layer different from the source metal layer. This provides the advantages described below.

Since the source metal layer is typically formed using a metal film, it is conceivable to form a patch electrode in the source metal layer. However, it is preferable that the patch electrode have a low resistance to the extent that the vibration of electrons is not hindered. The patch electrode is formed of a comparatively thick Al layer having a thickness of greater than or equal to 0.3 μm, for example. From the viewpoint of antenna performance, it is preferable that the patch electrode be thick. Depending on the configuration of the TFT, however, when a patch electrode having a thickness exceeding 1 μm is formed in the source metal layer, a problem arises in that the desired patterning accuracy cannot be obtained. For example, there may be a problem that the gap between the source electrode and the drain electrode (corresponding to the channel length of the TFT) cannot be controlled with high accuracy. In contrast, in the present embodiment, since the patch electrode 15 is formed separately from the source metal layer, the thickness of the source metal layer and the thickness of the patch electrode 15 can be controlled independently. This allows the controllability for forming the source metal layer to be secured and a patch electrode 15 having a desired thickness to be formed.

In the present embodiment, the thickness of the patch electrode 15 can be set with a high degree of freedom separately from the thickness of the source metal layer. Note that since the size of the patch electrode 15 needs not be controlled as strictly as the source bus line SL or the like, it is acceptable for the line width shift (deviation from the design value) to be increased by thickening the patch electrode 15. Note that a case where the thickness of the patch electrode 15 is equal to the thickness of the source metal layer is not excluded.

The patch electrode 15 may include a Cu layer or an Al layer as a main layer. A performance of the scanning antenna correlates with an electric resistance of the patch electrode 15, and a thickness of the main layer is set so as to obtain a desired resistance. In terms of the electric resistance, there is a possibility that the thickness of the patch electrode 15 can be made thinner in the Cu layer than in the Al layer.

Figure 4A:
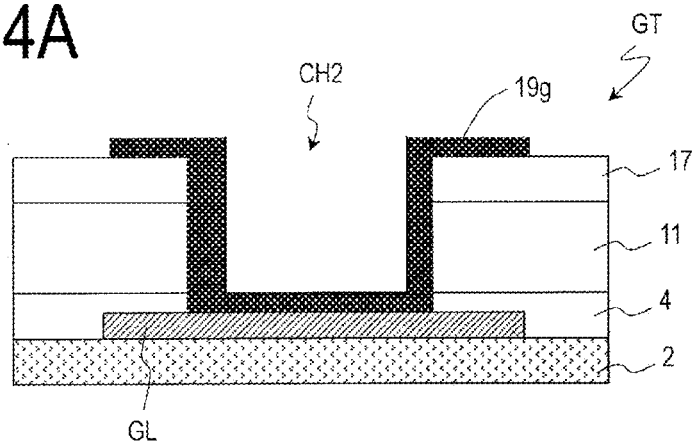
FIGS. 4A to 4C are cross-sectional views schematically illustrating a gate terminal section GT, a source terminal section ST, and a transfer terminal section PT of the TFT substrate 101, respectively.
Figure 4B:
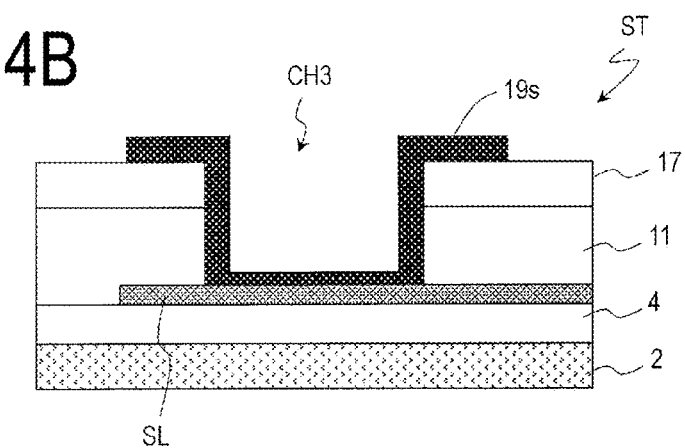
Figure 4C:
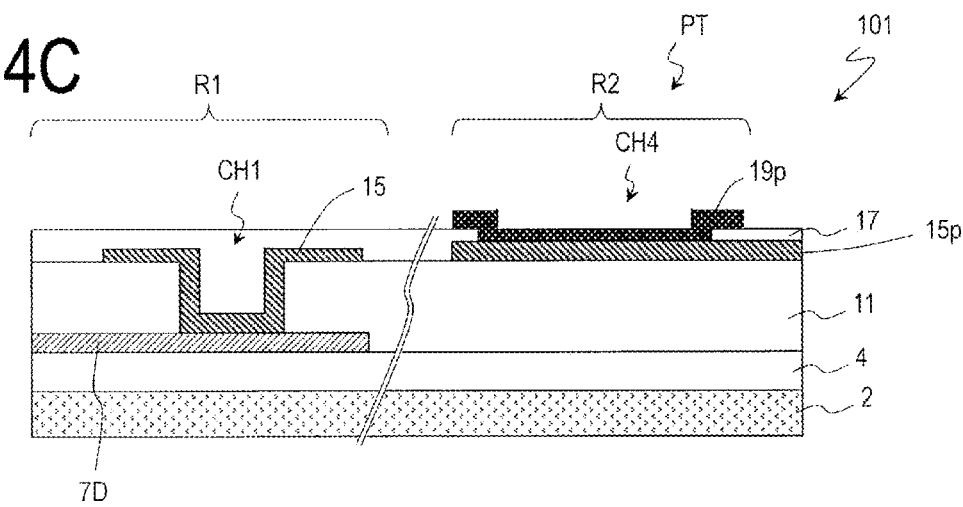

Gate Terminal Section GT, Source Terminal Section ST, and Transfer Terminal Section PT FIGS. 4A to 4C are cross-sectional views schematically illustrating the gate terminal section GT, the source terminal section ST, and the transfer terminal section PT, respectively.

The gate terminal section GT includes a gate bus line GL formed on the dielectric substrate, an insulating layer covering the gate bus line GL, and a gate terminal upper connection section 19g. The gate terminal upper connection section 19g is in contact with the gate bus line GL within the contact hole CH2 formed in the insulating layer. In this example, the insulating layer covering the gate bus line GL includes the gate insulating layer 4, the first insulating layer 11 and the second insulating layer 17 in that order from the dielectric substrate side. The gate terminal upper connection section 19g is, for example, a transparent electrode formed of a transparent conductive film provided on the second insulating layer 17.

The source terminal section ST includes the source bus line SL formed on the dielectric substrate (here, on the gate insulating layer 4), the insulating layer covering the source bus line SL, and a source terminal upper connection section 19s. The source terminal upper connection section 19s is in contact with the source bus line SL within the contact hole CH3 formed in the insulating layer. In this example, the insulating layer covering the source bus line SL includes the first insulating layer 11 and the second insulating layer 17. The source terminal upper connection section 19s is, for example, a transparent electrode formed of a transparent conductive film provided on the second insulating layer 17.

The transfer terminal section PT include a patch connection section 15p formed on the first insulating layer 11, the second insulating layer 17 covering the patch connection section 15p, and a transfer terminal upper connection section 19p. The transfer terminal upper connection section 19p is in contact with the patch connection section 15p within a contact hole CH4 formed in the second insulating layer 17. The patch connection section 15p is formed of the same conductive film as that of the patch electrode 15. The transfer terminal upper connection section (also referred to as an upper transparent electrode) 19p is, for example, a transparent electrode formed of a transparent conductive film provided on the second insulating layer 17. In the present embodiment, the upper connection sections 19g, 19s, and 19p for the respective terminal sections are formed of the same transparent conductive film.

In the present embodiment, it is advantageous that the contact holes CH2, CH3, and CH4 of the respective terminal sections can be simultaneously formed by the etching process after the formation of the second insulating layer 17. The detailed manufacturing process thereof will be described later.

Manufacturing Method of TFT Substrate 101

Figure 5:
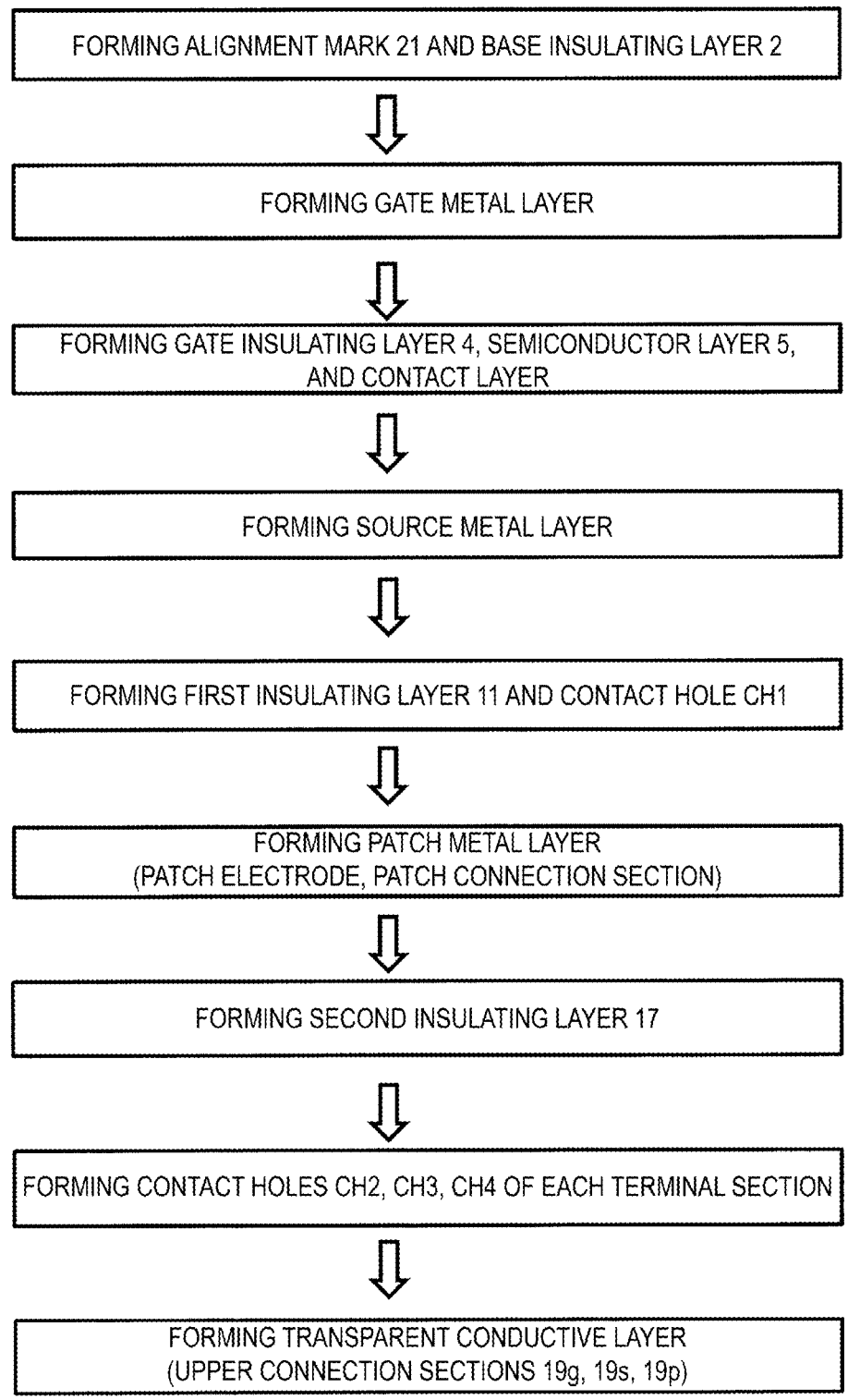
FIG. 5 is a diagram illustrating an example of a manufacturing process of the TFT substrate 101.

As an example, the TFT substrate 101 can be manufactured by the following method. FIG. 5 is a diagram exemplifying the manufacturing process of the TFT substrate 101.

First, a metal film (for example, a Ti film) is formed on a dielectric substrate and patterned to form an alignment mark 21. A glass substrate, a plastic substrate (resin substrate) having heat resistance, or the like can be used as the dielectric substrate, for example. Next, the base insulating film 2 is formed so as to cover the alignment mark 21. An $SiO_2$ film is used as the base insulating film 2.

Subsequently, a gate metal layer including the gate electrode 3G and the gate bus line GL is formed on the base insulating film 2.

The gate electrode 3G can be formed integrally with the gate bus line GL. Here, a not-illustrated gate conductive film (with a thickness of greater than or equal to 50 nm and less than or equal to 500 nm) is formed on the dielectric substrate by sputtering or the like. Next, the gate conductive film is patterned to obtain the gate electrode 3G and the gate bus line GL. The material of the gate conductive film is not particularly limited to a specific material. A film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used. Here, as a gate conductive film, a layered film is formed by layering MoN (having a thickness of 50 nm, for example), Al (having a thickness of 200 nm, for example), and MoN (having a thickness of 50 nm, for example) in this order.

Next, the gate insulating layer 4 is formed so as to cover the gate metal layer. The gate insulating layer 4 can be formed by a CVD method or the like. As the gate insulating layer 4, a silicon oxide ($SiO_2$) layer, a silicon nitride (SiNx) layer, a silicon oxynitride (SiOxNy; x>y) layer, a silicon nitride oxide (SiNxOy; x>y) layer, or the like may be used as appropriate. The gate insulating layer 4 may have a layered structure. Here, a SiNx layer (having a thickness of 410 nm, for example) is formed as the gate insulating layer 4.

Next, the semiconductor layer 5 and a contact layer are formed on the gate insulating layer 4. Here, an intrinsic amorphous silicon film (with a thickness of 125 nm, for example) and an $n^+$ type amorphous silicon film (with a thickness of 65 nm, for example) are formed in this order and patterned to obtain an island-shaped semiconductor layer 5 and a contact layer. The semiconductor film used for the semiconductor layer 5 is not limited to an amorphous silicon film. For example, an oxide semiconductor layer may be formed as the semiconductor layer 5. In this case, it is not necessary to provide a contact layer between the semiconductor layer 5 and the source/drain electrodes.

Next, a source conductive film (having a thickness of greater than or equal to 50 nm and less than or equal to 500 nm, for example) is formed on the gate insulating layer 4 and the contact layer, and patterned to form a source metal layer including the source electrode 7S, the drain electrode 7D, and the source bus line SL. At this time, the contact layer is also etched, and the source contact layer 6S and the drain contact layer 6D separated from each other are formed.

The material of the source conductive film is not particularly limited to a specific material. A film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used. Here, as a source conductive film, a layered film is formed by layering MoN (having a thickness of 30 nm, for example), Al (having a thickness of 200 nm, for example), and MoN (having a thickness of 50 nm, for example) in this order. Instead, as a source conductive film, a layered film may be formed by layering Ti (having a thickness of 30 nm, for example), MoN (having a thickness of 30 nm, for example), Al (having a thickness of 200 nm, for example), and MoN (having a thickness of 50 nm, for example) in this order.

Here, for example, a source conductive film is formed by sputtering and the source conductive film is patterned by wet etching (source/drain separation). Thereafter, a portion of the contact layer located on the region that will serve as the channel region of the semiconductor layer 5 is removed by dry etching, for example, to form a gap portion, and the source contact layer 6S and the drain contact layer 6D are separated. At this time, in the gap portion, the area around the surface of the semiconductor layer 5 is also etched (overetching).

Note that, when a layered film in which a Ti film and an Al film layered in this order is used as a source conductive film, for example, after patterning the Al film by wet etching using, for example, an aqueous solution of phosphoric acid, acetic acid, and nitric acid, the Ti film and the contact layer ($n^+$ type amorphous silicon layer) 6 may be simultaneously patterned by dry etching. Alternatively, it is also possible to collectively etch the source conductive film and the contact layer. However, in the case of simultaneously etching the source conductive film or the lower layer thereof and the contact layer 6, it may be difficult to control the distribution of the etching amount of the semiconductor layer 5 (the amount of excavation of the gap portion) of the entire substrate. In contrast, as described above, in a case where etching is performed in an etching step separate from the source/drain separation and the gap portion formation, the etching amount of the gap portion can be more easily controlled.

Next, the first insulating layer 11 is formed so as to cover the TFT 10. In this example, the first insulating layer 11 is disposed so as to be in contact with the channel region of the semiconductor layer 5. In addition, the contact hole CH1 that at least reaches the drain electrode 7D is formed in the first insulating layer 11 by a known photolithographic method.

The first insulating layer 11 may be an inorganic insulating layer such as a silicon oxide ($SiO_2$) film, a silicon nitride (SiNx) film, a silicon oxynitride (SiOxNy; x>y) film, or a silicon nitride oxide (SiNxOy; x>y) film, for example. Here, as the first insulating layer 11, a SiNx layer having a thickness of 330 nm, for example, is formed by a CVD method.

Next, a patch conductive film is formed on the first insulating layer 11 and within the contact hole CH1, and this is subsequently patterned. In this way, the patch electrode 15 is formed in the transmission and/or reception region R1, and the patch connection section 15p is formed in the non-transmission and/or reception region R2. The patch electrode 15 is in contact with the drain electrode 7D within the contact hole CH1. Note that, in the present specification, the layer including the patch electrode 15 and the patch connection section 15p formed from the patch conductive film may be referred to as a "patch metal layer" in some cases.

The same material as that of the gate conductive film or the source conductive film can be used as the material of the patch conductive film. However, the patch conductive film is set to be thicker than the gate conductive film and the source conductive film. Accordingly, by reducing the sheet resistance of the patch electrode, the loss resulting from the oscillation of free electrons in the patch electrode changing to heat can be reduced. A suitable thickness of the patch conductive film is, for example, greater than or equal to 0.3 µm. In a case where the thickness of the patch conductive film becomes thinner than this, the sheet resistance becomes greater or equal to 0.10 Ω/sq, and there is a possibility that the loss increases. The thickness of the patch conductive film is, for example, less than or equal to 3 µm, and more preferably less than or equal to 2 µm. In a case where the thickness is thicker than this, warping of the substrate may be caused by a thermal stress in the process. In a case where the warping is large, problems such as conveyance troubles, chipping of the substrate, or cracking of the substrate may occur in the mass production process.

Here, as a patch conductive film, a layered film (MoN/Al/MoN) is formed by layering MoN (having a thickness of 50 nm, for example), Al (having a thickness of 1000 nm, for example), and MoN (having a thickness of 50 nm, for example) in this order. Instead, a layered film (MoN/Al/MoN/Ti) may be formed by layering Ti (having a thickness of 50 nm, for example), MoN (having a thickness of 50 nm, for example), Al (having a thickness of 2000 nm, for example), and MoN (having a thickness of 50 nm, for example) in this order. Alternatively, instead, a layered film (MoN/Al/MoN/Ti) may be formed by layering Ti (having a thickness of 50 nm, for example), MoN (having a thickness of 50 nm, for example), Al (having a thickness of 500 nm, for example), and MoN (having a thickness of 50 nm, for example) in this order. Alternatively, a layered film (Ti/Cu/Ti) in which a Ti film, a Cu film, and a Ti film are layered in this order, or a layered film (Cu/Ti) in which a Ti film and a Cu film are layered in this order may be used.

Next, the second insulating layer (having a thickness of greater than or equal to 100 nm and less than or equal to 300 nm) 17 is formed on the patch electrode 15 and the first insulating layer 11. The second insulating layer 17 is not particularly limited to a specific film, and, for example, a silicon oxide ($SiO_2$) film, a silicon nitride (SiNx) film, a silicon oxynitride (SiOxNy; x>y) film, a silicon nitride oxide (SiNxOy; x>y) film, or the like can be used as appropriate. Here, as the second insulating layer 17, for example, a SiNx layer having a thickness of 200 nm is formed.

Thereafter, the inorganic insulating films (the second insulating layer 17, the first insulating layer 11, and the gate insulating layer 4) are etched collectively by dry etching using a fluorine-based gas, for example. During the etching, the patch electrode 15, the source bus line SL, and the gate bus line GL each function as an etch stop. In this way, the contact hole CH2 that at least reaches the gate bus line GL is formed in the second insulating layer 17, the first insulating layer 11, and the gate insulating layer 4, and the contact hole CH3 that at least reaches the source bus line SL is formed in the second insulating layer 17 and the first insulating layer 11. In addition, the contact hole CH4 that at least reaches the patch connection section 15p is formed in the second insulating layer 17.

In this example, since the inorganic insulating films are etched collectively, side surfaces of the second insulating layer 17, first insulating layer 11, and gate insulating layer 4 are aligned on a side wall of the obtained contact hole CH2, and the side walls of the second insulating layer 17 and first insulating layer 11 are aligned on a side wall of the contact hole CH3. Note that, in the present embodiment, the expression that "the side surfaces of different two or more layers are aligned" within the contact hole does not only refer to when the side surfaces exposed in the contact hole in these layers are flush in the vertical direction, but also includes cases where inclined surfaces such as continuous tapered shapes are formed. Such a structure can be obtained, for example, by etching these layers using the same mask, or alternatively by using one of these layers as a mask to etch the other layer.

Next, a transparent conductive film (having a thickness of greater than or equal to 50 nm and less than or equal to 200 nm) is formed on the second insulating layer 17 and within the contact holes CH2, CH3, and CH4 by sputtering, for example. An indium tin oxide (ITO) film, an IZO film, a zinc oxide (ZnO) film or the like can be used as the transparent conductive film. Here, an ITO film having a thickness of, for example, 100 nm is used as the transparent conductive film.

Next, the transparent conductive film is patterned to form the gate terminal upper connection section 19g, the source terminal upper connection section 19s, and the transfer terminal upper connection section 19p. The gate terminal upper connection section 19g, the source terminal upper connection section 19s, and the transfer terminal upper connection section 19p are used for protecting the electrodes or wiring lines exposed at each terminal section. In this way, the gate terminal section GT, the source terminal section ST, and the transfer terminal section PT are obtained.

Structure of Slot Substrate 201

Next, the structure of the slot substrate 201 will be described in greater detail.

Figure 6:
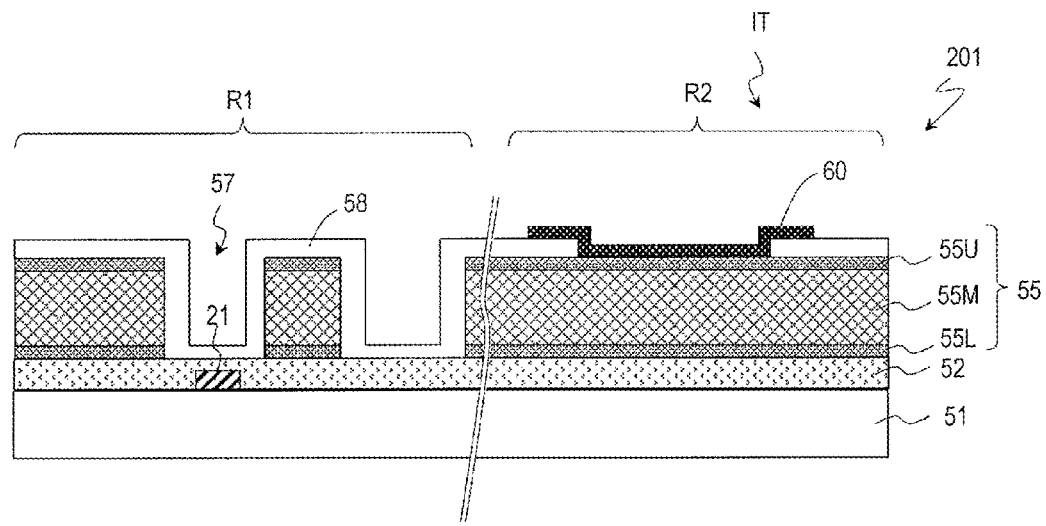
FIG. 6 is a cross-sectional view schematically illustrating an antenna unit region U and a terminal section IT in the slot substrate 201.

FIG. 6 is a cross-sectional view schematically illustrating the antenna unit region U and the terminal section IT in the slot substrate 201.

The slot substrate 201 includes the dielectric substrate 51 having a front surface and a rear surface, a third insulating layer 52 formed on the front surface of the dielectric substrate 51, the slot electrode 55 formed on the third insulating layer 52, and a fourth insulating layer 58 covering the slot electrode 55. The reflective conductive plate 65 is disposed opposing the rear surface of the dielectric substrate 51 with the dielectric layer (air layer) 54 interposed therebetween. The slot electrode 55 and the reflective conductive plate 65 function as walls of the waveguide 301.

In the transmission and/or reception region R1, a plurality of slots 57 are formed in the slot electrode 55. The slot 57 is an opening that opens through the slot electrode 55. In this example, one slot 57 is disposed in each antenna unit region U.

The fourth insulating layer 58 is formed on the slot electrode 55 and within the slot 57. The material of the fourth insulating layer 58 may be the same as the material of the third insulating layer 52. By covering the slot electrode 55 with the fourth insulating layer 58, the slot electrode 55 and the liquid crystal layer LC are not in direct contact with each other, such that the reliability can be enhanced. In a case where the slot electrode 55 is formed of a Cu layer, Cu may elute into the liquid crystal layer LC in some cases. In addition, in a case where the slot electrode 55 is formed of an Al layer by using a thin film deposition technique, the Al layer may include a void. The fourth insulating layer 58 can prevent the liquid crystal material from entering the void of the Al layer. Note that in a case where the slot electrode 55 is formed by bonding an aluminum foil as the Al layer on the dielectric substrate 51 with an adhesive and patterning it, the problem of voids can be avoided.

The slot electrode 55 includes a main layer 55M such as a Cu layer or an Al layer. The slot electrode 55 may have a layered structure that includes the main layer 55M, as well as an upper layer 55U and a lower layer 55L disposed sandwiching the main layer 55M therebetween. A thickness of the main layer 55M may be set in consideration of the skin effect depending on the material, and may be, for example, greater than or equal to 2 µm and less than or equal to 30 µm. The thickness of the main layer 55M is typically greater than the thickness of the upper layer 55U and the lower layer 55L.

In the illustrated example, the main layer 55M is a Cu layer, and the upper layer 55U and the lower layer 55L are Ti layers. By disposing the lower layer 55L between the main layer 55M and the third insulating layer 52, the adhesion between the slot electrode 55 and the third insulating layer 52 can be improved. In addition, by providing the upper layer 55U, corrosion of the main layer 55M (e.g., the Cu layer) can be suppressed.

Since the reflective conductive plate 65 constitutes the wall of the waveguide 301, it is desirable that the reflective conductive plate 65 has a thickness that is three times or greater than the skin depth, and preferably five times or greater. An aluminum plate, a copper plate, or the like having a thickness of several millimeters manufactured by a cutting out process can be used as the reflective conductive plate 65.

The terminal section IT is provided in the non-transmission and/or reception region R2. The terminal section IT includes the slot electrode 55, the fourth insulating layer 58 covering the slot electrode 55, and an upper connection section 60. The fourth insulating layer 58 includes an opening that at least reaches the slot electrode 55. The upper connection section 60 is in contact with the slot electrode 55 within the opening. In the present embodiment, the terminal section IT is disposed in the seal region Rs, and is connected to the transfer terminal section on the TFT substrate (transfer section) by a seal resin containing conductive particles.

Transfer Section

Figure 7:
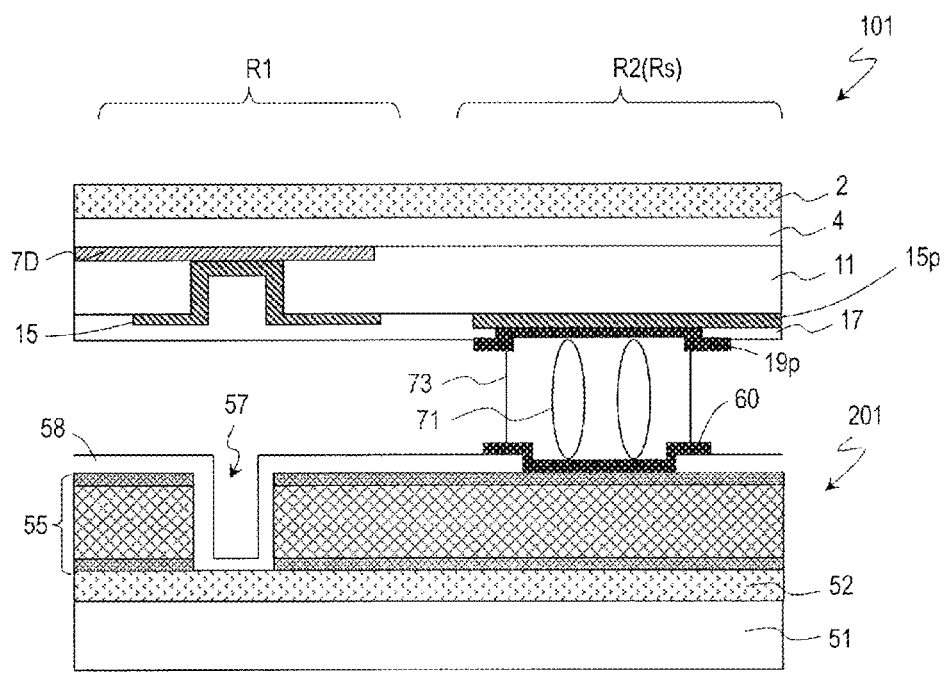
FIG. 7 is a schematic cross-sectional view for illustrating a transfer section in the TFT substrate 101 and the slot substrate 201.

FIG. 7 is a schematic cross-sectional view for illustrating the transfer section connecting the transfer terminal section PT of the TFT substrate 101 and the terminal section IT of the slot substrate 201. In FIG. 7, the same reference numerals are attached to the same components as those in FIG. 1 to FIG. 4C.

In the transfer section, the upper connection section 60 of the terminal section IT is electrically connected to the transfer terminal upper connection section 19p of the transfer terminal section PT in the TFT substrate 101. In the present embodiment, the upper connection section 60 and the transfer terminal upper connection section 19p are connected with a resin (sealing resin) 73 (also referred to as a sealing portion 73) including conductive beads 71 therebetween.

Each of the upper connection sections 60 and 19p is a transparent conductive layer such as an ITO film or an IZO film, and there is a possibility that an oxide film is formed on the surface thereof. When an oxide film is formed, the electrical connection between the transparent conductive layers cannot be ensured, and the contact resistance may increase. In contrast, in the present embodiment, since these transparent conductive layers are bonded with a resin including conductive beads (for example, Au beads) 71 therebetween, even in a case where a surface oxide film is formed, the conductive beads pierce (penetrate) the surface oxide film, allowing an increase in contact resistance to be suppressed. The conductive beads 71 may penetrate not only the surface oxide film but also penetrate the upper connection sections 60 and 19p which are the transparent conductive layers, and directly contact the patch connection section 15p and the slot electrode 55.

The transfer section may be disposed at both a center portion and a peripheral portion (that is, inside and outside of the donut-shaped transmission and/or reception region R1 when viewed from the normal direction of the scanning antenna 1000) of the scanning antenna 1000, or alternatively may be disposed at only one of them. The transfer section may be disposed in the seal region Rs in which the liquid crystals are sealed, or may be disposed outside the seal region Rs (opposite to the liquid crystal layer).

Manufacturing Method of Slot Substrate 201

The slot substrate 201 can be manufactured by the following method, for example.

First, the third insulating layer (having a thickness of 200 nm, for example) 52 is formed on the dielectric substrate. A substrate such as a glass substrate or a resin substrate having a high transmittance to electromagnetic waves (the dielectric constant $\varepsilon_M$ and the dielectric loss tan $\delta_M$ are small) can be used as the dielectric substrate. The dielectric substrate is preferably thin in order to suppress the attenuation of the electromagnetic waves. For example, after forming the constituent elements such as the slot electrode 55 on the front surface of the glass substrate by a process to be described later, the glass substrate may be thinned from the rear side. This allows the thickness of the glass substrate to be reduced to 500 µm or less, for example.

When a resin substrate is used as the dielectric substrate, constituent elements such as TFTs may be formed directly on the resin substrate, or may be formed on the resin substrate by a transfer method. In a case of the transfer method, for example, a resin film (for example, a polyimide film) is formed on the glass substrate, and after the constituent elements are formed on the resin film by the process to be described later, the resin film on which the constituent elements are formed is separated from the glass substrate. Generally, the dielectric constant $\varepsilon_M$ and the dielectric loss tan $\delta_M$ of resin are smaller than those of glass. The thickness of the resin substrate is, for example, from 3 µm to 300 µm. Besides polyimide, for example, a liquid crystal polymer can also be used as the resin material.

The third insulating layer 52 is not particularly limited to a specific film, and, for example, a silicon oxide (SiO$_2$) film, a silicon nitride (SiNx) film, a silicon oxynitride (SiOxNy; x>y) film, a silicon nitride oxide (SiNxOy; x>y) film, or the like can be used as appropriate.

Next, a metal film is formed on the third insulating layer 52, and this is patterned to obtain the slot electrode 55 including the plurality of slots 57. As the metal film, a Cu film (or Al film) having a thickness of from 2 µm to 5 µm may be used. Here, a layered film obtained by layering a Ti film, a Cu film, and a Ti film in this order is used. Instead, a layered film may be formed by layering Ti (having a thickness of 50 nm, for example) and Cu (having a thickness of 5000 nm, for example) in this order.

Thereafter, the fourth insulating layer (having a thickness of 100 nm or 200 nm, for example) 58 is formed on the slot electrode 55 and within the slot 57. The material of the fourth insulating layer 58 may be the same as the material of the third insulating layer. Subsequently, in the non-transmission and/or reception region R2, an opening that at least reaches the slot electrode 55 is formed in the fourth insulating layer 58.

Next, a transparent conductive film is formed on the fourth insulating layer 58 and within the opening of the fourth insulating layer 58, and is patterned to form the upper connection section 60 in contact with the slot electrode 55 within the opening. In this way, the terminal section IT is obtained.

Material and Structure of TFT 10

In the present embodiment, a TFT including a semiconductor layer 5 as an active layer is used as a switching element disposed in each pixel. The semiconductor layer 5 is not limited to an amorphous silicon layer, and may be a polysilicon layer or an oxide semiconductor layer.

In a case where an oxide semiconductor layer is used, the oxide semiconductor included in the oxide semiconductor layer may be an amorphous oxide semiconductor or a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The oxide semiconductor layer may have a layered structure of two or more layers. In cases where the oxide semiconductor layer has a layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. In addition, the oxide semiconductor layer may include a plurality of amorphous oxide semiconductor layers. In cases that the oxide semiconductor layer has a two-layer structure including an upper layer and a lower layer, the energy gap of the oxide semiconductor included in the upper layer is preferably greater than the energy gap of the oxide semiconductor included in the lower layer. However, when the different in the energy gap between these layers is relatively small, the energy gap of the lower layer oxide semiconductor may be greater than the energy gap of the upper layer oxide semiconductor.

JP 2014-007399 A, for example, describes materials, structures, film formation methods, and the configuration of oxide semiconductor layers having layered structures for amorphous oxide semiconductors and each of the above described crystalline oxide semiconductors. For reference, the entire contents of JP 2014-007399 A are incorporated herein.

The oxide semiconductor layer may include, for example, at least one metal element selected from In, Ga, and Zn. In the present embodiment, the oxide semiconductor layer includes, for example, an In—Ga—Zn—O based semiconductor (for example, indium gallium zinc oxide). Here, the In—Ga—Zn—O based semiconductor is a ternary oxide of In (indium), Ga (gallium), and Zn (zinc), and the ratio (composition ratio) of In, Ga, and Zn is not particularly limited to a specific value. For example, the ratio includes In:Ga:Zn=2:2:1, In:Ga:Zn=1:1:1, or In:Ga:Zn=1:1:2. Such an oxide semiconductor layer can be formed from an oxide semiconductor film including an In—Ga—Zn—O based semiconductor.

The In—Ga—Zn—O based semiconductor may be an amorphous semiconductor or a crystalline semiconductor. A crystalline In—Ga—Zn—O based semiconductor in which the c-axis is oriented substantially perpendicular to the layer surface is preferable as the crystalline In—Ga—Zn—O based semiconductor.

Note that the crystal structure of the crystalline In—Ga—Zn—O based semiconductor is disclosed in, for example, the above-mentioned JP 2014-007399 A, JP 2012-134475 A, and JP 2014-209727 A. For reference, the entire contents of JP 2012-134475 A and 2014-209727 A are incorporated herein. Since a TFT including an In—Ga—Zn—O based semiconductor layer has high mobility (more than 20 times in comparison with a-Si TFTs) and low leakage current (less than 1/100th in comparison with a-Si TFTs), such a TFT can suitably be used as a driving TFT (for example, a TFT included in a driving circuit provided in the non-transmission and/or reception region) and a TFT provided in each antenna unit region.

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, or a Ga—Zn—O based semiconductor.

In the example illustrated in FIGS. 3A and 3B, the TFT 10 is a channel etch type TFT having a bottom gate structure. The channel etch type TFT does not include an etch stop layer formed on the channel region, and a lower face of an end portion of each of the source and drain electrodes, which is closer to the channel, is provided so as to be in contact with an upper face of the semiconductor layer. The channel etch type TFT is formed by, for example, forming a conductive film for a source/drain electrode on a semiconductor layer and performing source/drain separation. In the source/drain separation process, the surface portion of the channel region may be etched.

Note that the TFT 10 may be an etch stop type TFT in which an etch stop layer is formed on the channel region. In the etch stop type TFT, the lower face of an end portion of each of the source and drain electrodes, which is closer to the channel, is located, for example, on the etch stop layer. The etch stop type TFT is formed as follows; after forming an etch stop layer covering the portion that will become the channel region in a semiconductor layer, for example, a conductive film for the source and drain electrodes is formed on the semiconductor layer and the etch stop layer, and source/drain separation is performed.

In addition, although the TFT 10 has a top contact structure in which the source and drain electrodes are in contact with the upper face of the semiconductor layer, the source and drain electrodes may be disposed to be in contact with the lower face of the semiconductor layer (a bottom contact structure). Furthermore, the TFT 10 may have a bottom gate structure having a gate electrode on the dielectric substrate side of the semiconductor layer, or a top gate structure having a gate electrode above the semiconductor layer.

Second Embodiment

The scanning antenna of a second embodiment will be described with reference to drawings. The TFT substrate of the scanning antenna of the present embodiment differs from the TFT substrate 101 illustrated in FIG. 2A in that a transparent conductive layer that serves as an upper connection section for each terminal section is provided between the first insulating layer and the second insulating layer of the TFT substrate.

Figure 8A:
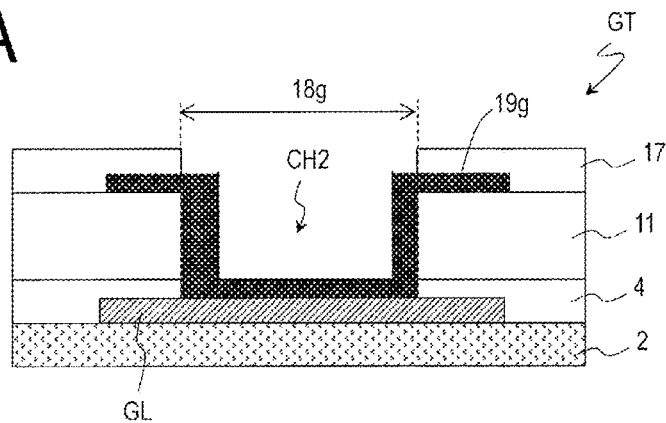
FIGS. 8A to 8C are cross-sectional views illustrating a gate terminal section GT, a source terminal section ST, and a transfer terminal section PT of a TFT substrate 102, respectively, in a second embodiment.
Figure 8B:
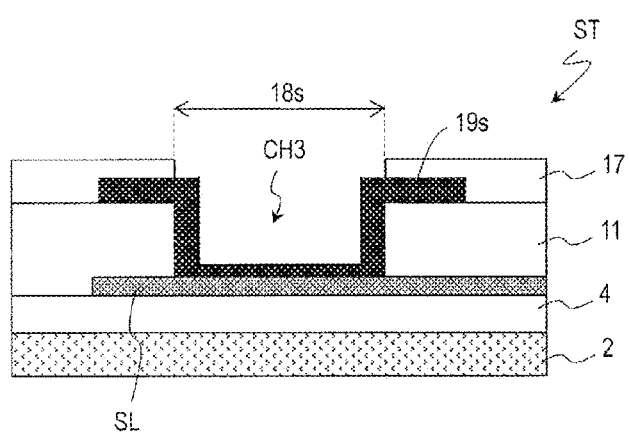
Figure 8C:
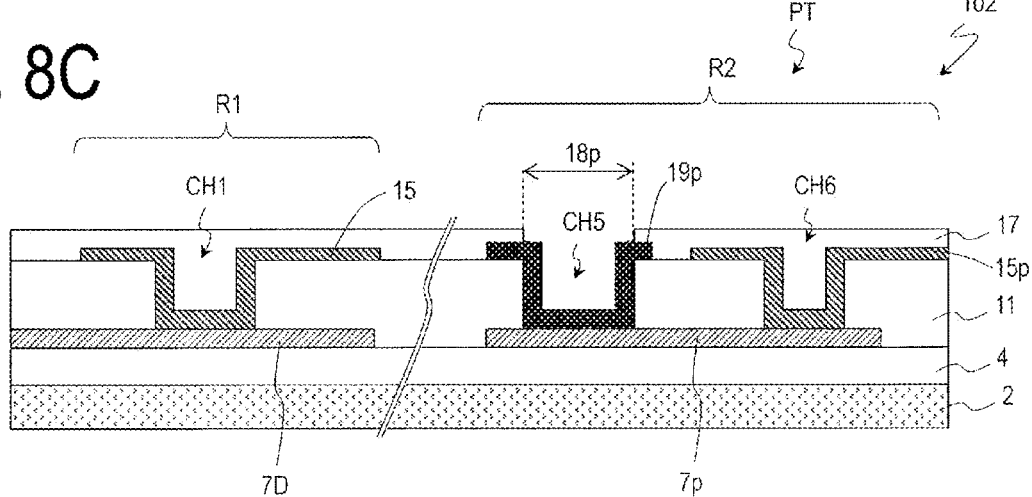

FIGS. 8A to 8C are cross-sectional views illustrating the gate terminal section GT, the source terminal section ST, and the transfer terminal section PT, respectively, of a TFT substrate 102 in the present embodiment. Constituent elements similar to those in FIGS. 4A to 4C are denoted by the same reference numerals, and the description thereof is omitted. Since the cross-sectional structure of the antenna unit region U is similar to that of the above-described embodiments (FIGS. 3A and 3B), the illustration and description thereof will be omitted.

The gate terminal section GT in the present embodiment includes the gate bus line GL formed on a dielectric substrate, the insulating layer covering the gate bus line GL, and the gate terminal upper connection section 19g. The gate terminal upper connection section 19g is in contact with the gate bus line GL within the contact hole CH2 formed in the insulating layer. In this example, the insulating layer covering the gate bus line GL includes the gate insulating layer 4 and the first insulating layer 11. The second insulating layer 17 is formed on the gate terminal upper connection section 19g and the first insulating layer 11. The second insulating layer 17 includes an opening 18g exposing a part of the gate terminal upper connection section 19g. In this example, the opening 18g of the second insulating layer 17 may be disposed so as to expose the entire contact hole CH2.

The source terminal section ST includes the source bus line SL formed on the dielectric substrate (here, on the gate insulating layer 4), the insulating layer covering the source bus line SL, and the source terminal upper connection section 19s. The source terminal upper connection section 19s is in contact with the source bus line SL within the contact hole CH3 formed in the insulating layer. In this example, the insulating layer covering the source bus line SL includes only the first insulating layer 11. The second insulating layer 17 extends over the source terminal upper connection section 19s and the first insulating layer 11. The second insulating layer 17 includes an opening 18s exposing a part of the source terminal upper connection section 19s. The opening 18s of the second insulating layer 17 may be disposed so as to expose the entire contact hole CH3.

The transfer terminal section PT includes a source connection wiring line 7p formed from the same conductive film (source conductive film) as that of the source bus line SL, the first insulating layer 11 extending over the source connection wiring line 7p, the transfer terminal upper connection section 19p and the patch connection section 15p formed on the first insulating layer 11.

Contact holes CH5 and CH6 are provided in the first insulating layer 11 to expose the source connection wiring line 7p. The transfer terminal upper connection section 19p is disposed on the first insulating layer 11 and within the contact hole CH5, and is in contact with the source connection wiring line 7p within the contact hole CH5. The patch connection section 15p is disposed on the first insulating layer 11 and within the contact hole CH6, and is in contact with the source connection wiring line 7p within the contact hole CH6. The transfer terminal upper connection section 19p is a transparent electrode formed of a transparent conductive film. The patch connection section 15p is formed of the same conductive film as that of the patch electrode 15. Note that the upper connection sections 19g, 19s, and 19p of the respective terminal sections may be formed of the same transparent conductive film.

The second insulating layer 17 extends over the transfer terminal upper connection section 19p, the patch connection section 15p, and the first insulating layer 11. The second insulating layer 17 includes an opening 18p exposing a part of the transfer terminal upper connection section 19p. In this example, the opening 18p of the second insulating layer 17 is disposed so as to expose the entire contact hole CH5. In contrast, the patch connection section 15p is covered with the second insulating layer 17.

In this way, in the present embodiment, the source connection wiring line 7p formed in the source metal layer electrically connects the transfer terminal upper connection section 19p of the transfer terminal section PT and the patch connection section 15p. Although not illustrated in drawings, similar to the above-described embodiment, the transfer terminal upper connection section 19p is connected to the slot electrode of the slot substrate 201 by a sealing resin containing conductive particles.

In the previously described embodiment, the contact holes CH1 to CH4 having different depths are collectively formed after the formation of the second insulating layer 17. For example, while the relatively thick insulating layers (the gate insulating layer 4, the first insulating layer 11 and the second insulating layer 17) are etched in the gate terminal section GT, only the second insulating layer 17 is etched in the transfer terminal section PT. Accordingly, there is a possibility that the conductive film (for example, a patch electrode conductive film) that serves as the base of the shallow contact holes is considerably damaged during etching.

In contrast, in the present embodiment, the contact holes CH1 to CH3, CH5, and CH6 are formed prior to formation of the second insulating layer 17. Since these contact holes are formed only in the first insulating layer 11 or in the layered film of the first insulating layer 11 and the gate insulating layer 4, the difference in depth of the collectively formed contact holes can be reduced more than in the previous embodiment. Accordingly, damage to the conductive film that serves as the base of the contact holes can be reduced. In particular, when an Al film is used for the patch electrode conductive film, since a favorable contact cannot be obtained in a case where the ITO film and the Al film are brought into direct contact with each other, a cap layer such as a MoN layer may be formed on the Al film in some cases. In these cases, there is the advantage that the thickness of the cap layer need not be increased to compensate for damage during etching.

Manufacturing Method of TFT Substrate 102

Figure 9:
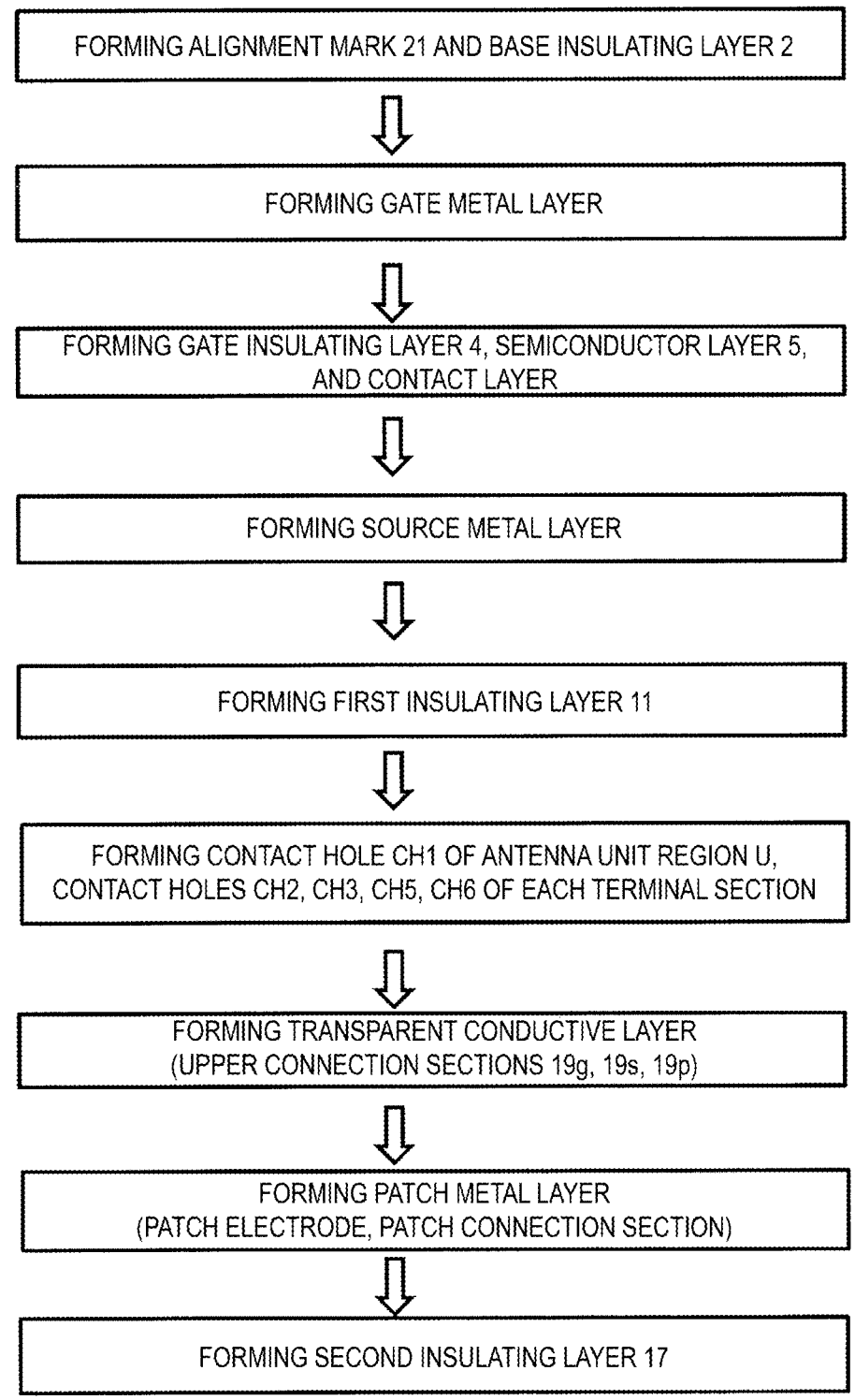
FIG. 9 is a diagram illustrating an example of a manufacturing process of the TFT substrate 102.

The TFT substrate 102 is manufactured by the following method, for example. FIG. 9 is a diagram illustrating an example of a manufacturing process of the TFT substrate 102. Note that in the following description, in cases where the material, thickness, formation method, or the like of each layer are the same as that of the TFT substrate 101 described above, the description thereof is omitted.

First, an alignment mark, a base insulating layer, a gate metal layer, a gate insulating layer, a semiconductor layer, a contact layer, and a source metal layer are formed on a dielectric substrate in the same manner as in the TFT substrate 102 to obtain a TFT. In the step of forming the source metal layer, in addition to the source and drain electrodes and the source bus line, the source connection wiring line 7p is also formed from the source conductive film.

Next, the first insulating layer 11 is formed so as to cover the source metal layer. Subsequently, the first insulating layer 11 and the gate insulating layer 4 are collectively etched to form the contact holes CH1 to CH3, CH5, and CH6. During etching, each of the source bus line SL and the gate bus line GL functions as an etch stop. In this way, in the transmission and/or reception region R1, the contact hole CH1 that at least reaches the drain electrode of the TFT is formed in the first insulating layer 11. In addition, in the non-transmission and/or reception region R2, the contact hole CH2 that at least reaches the gate bus line GL is formed in the first insulating layer 11 and the gate insulating layer 4, and the contact hole CH3 that at least reaches the source bus line SL and contact holes CH5 and CH6 that at least reach the source connection wiring line 7p are formed in the first insulating layer 11. The contact hole CH5 may be disposed in the seal region Rs and the contact hole CH6 may be disposed outside the seal region Rs. Alternatively, both may be disposed outside the seal region Rs.

Next, a transparent conductive film is formed on the first insulating layer 11 and within the contact holes CH1 to CH3, CH5, and CH6, and patterned. In this way, the gate terminal upper connection section 19g in contact with the gate bus line GL within the contact hole CH2, the source terminal upper connection section 19s in contact with the source bus line SL within the contact hole CH3, and the transfer terminal upper connection section 19p in contact with the source connection wiring line 7p within the contact hole CH5 are formed.

Next, a patch electrode conductive film is formed on the first insulating layer 11, the gate terminal upper connection section 19g, the source terminal upper connection section 19s, the transfer terminal upper connection section 19p, and within the contact holes CH1 and CH6 and patterned. In this way, the patch electrode 15 in contact with the drain electrode 7D within the contact hole CH1 is formed in the transmission and/or reception region R1, and the patch connection section 15p in contact with the source connection wiring line 7p within the contact hole CH6 is formed in the non-transmission and/or reception region R2. Patterning of the patch electrode conductive film may be performed by wet etching. Here, an etchant capable of increasing the etching selection ratio between the transparent conductive film (ITO or the like) and the patch electrode conductive film (for example, an Al film) is used. In this way, when patterning the patch electrode conductive film, the transparent conductive film can function as an etch stop. Since the portions of the source bus line SL, the gate bus line GL, and the source connection wiring line 7p exposed by the contact holes CH2, CH3, and CH5 are covered with an etch stop (transparent conductive film), they are not etched.

Subsequently, the second insulating layer 17 is formed. Thereafter, the second insulating layer 17 is patterned by, for example, dry etching using a fluorine-based gas. In this way, the opening 18g exposing the gate terminal upper connection section 19g, the opening 18s exposing the source terminal upper connection section 19s, and the opening 18p exposing the transfer terminal upper connection section 19p are provided in the second insulating layer 17. In this manner, the TFT substrate 102 is obtained.

Third Embodiment

The scanning antenna of a third embodiment will be described with reference to drawings. The TFT substrate in the scanning antenna of the present embodiment differs from the TFT substrate 102 illustrated in FIGS. 8A to 8C in that the upper connection section made of a transparent conductive film is not provided in the transfer terminal section.

Figure 10A:
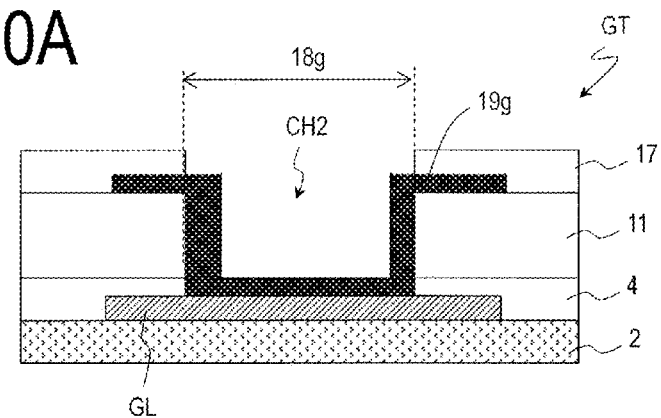
FIGS. 10A to 10C are cross-sectional views illustrating a gate terminal section GT, a source terminal section ST, and a transfer terminal section PT of a TFT substrate 103, respectively, in a third embodiment.
Figure 10B:
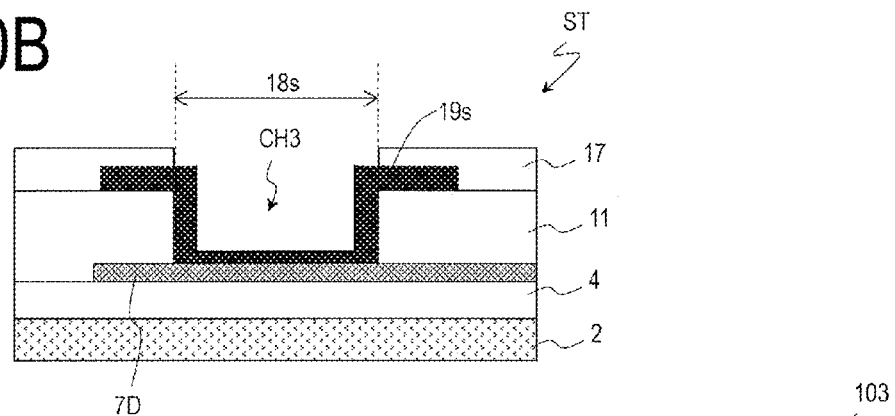
Figure 10C:
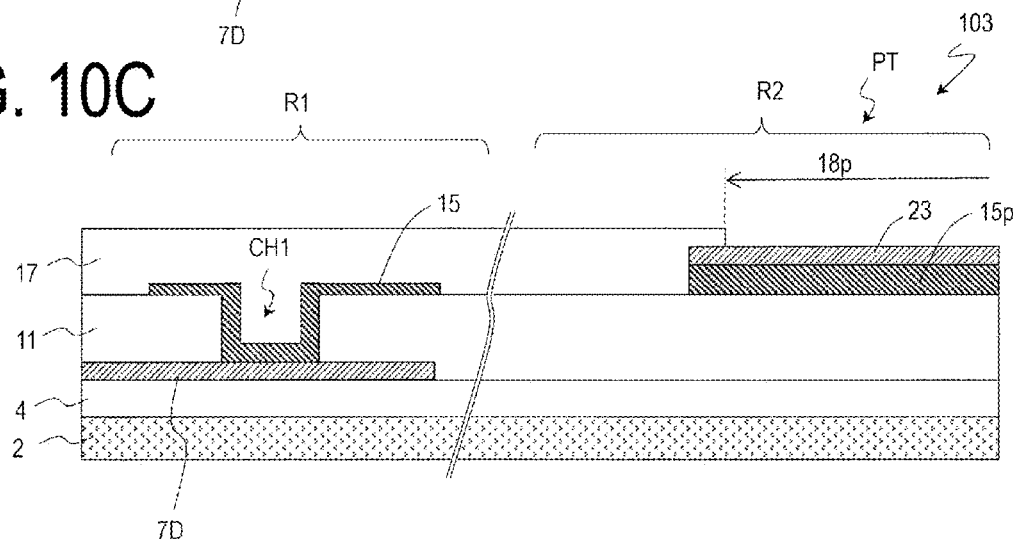

FIGS. 10A to 10C are cross-sectional views illustrating the gate terminal section GT, the source terminal section ST, and the transfer terminal section PT, respectively, of a TFT substrate 103 in the present embodiment. Constituent elements similar to those in FIGS. 8A to 8C are denoted by the same reference numerals. Since the structure of the antenna unit region U is similar to that of the above-described embodiments (FIGS. 3A and 3B), the illustration and description thereof will be omitted.

The structures of the gate terminal section GT and the source terminal section ST are similar to the structures of the gate terminal section and the source terminal section of the TFT substrate 102 illustrated in FIGS. 8A and 8B.

The transfer terminal section PT includes the patch connection section 15p formed on the first insulating layer 11 and a protective conductive layer 23 layered on the patch connection section 15p. The second insulating layer 17 extends over the protective conductive layer 23 and includes an opening 18p exposing a part of the protective conductive layer 23. In contrast, the patch electrode 15 is covered with the second insulating layer 17.

Manufacturing Method of TFT Substrate 103

Figure 11:
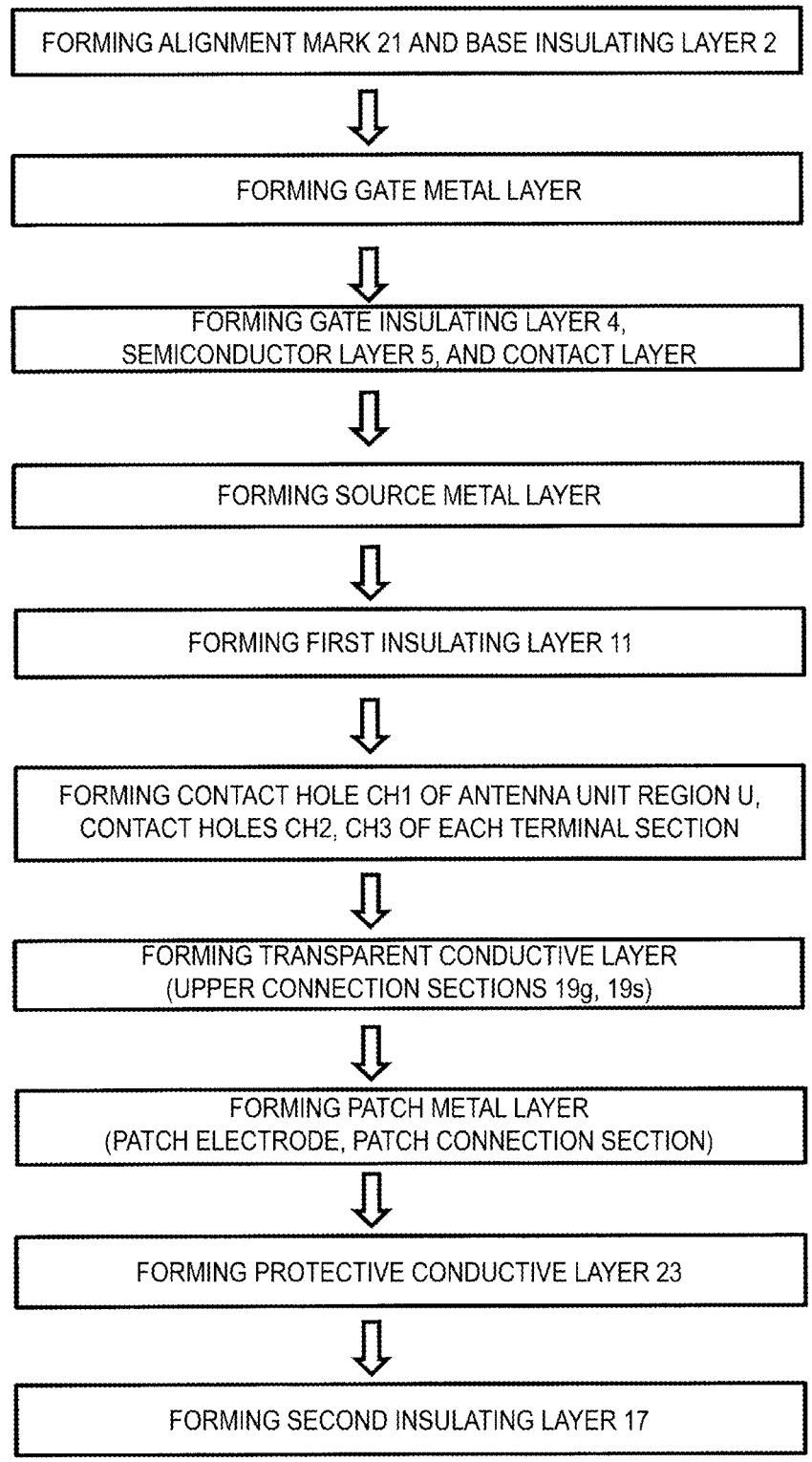
FIG. 11 is a diagram illustrating an example of a manufacturing process of the TFT substrate 103.

The TFT substrate 103 is manufactured by the following method, for example. FIG. 11 is a diagram illustrating an example of a manufacturing process of the TFT substrate 103. Note that in the following description, in cases where the material, thickness, formation method, or the like of each layer are the same as that of the TFT substrate 101 described above, the description thereof is omitted.

First, an alignment mark, a base insulating layer, a gate metal layer, a gate insulating layer, a semiconductor layer, a contact layer, and a source metal layer are formed on a dielectric substrate in the same manner as in the TFT substrate 101 to obtain a TFT.

Next, the first insulating layer 11 is formed so as to cover the source metal layer. Subsequently, the first insulating layer 11 and the gate insulating layer 4 are collectively etched to form the contact holes CH1 to CH3. During etching, each of the source bus line SL and the gate bus line GL functions as an etch stop. In this way, the contact hole CH1 that at least reaches the drain electrode of the TFT is formed in the first insulating layer 11, the contact hole CH2 that at least reaches the gate bus line GL is formed in the first insulating layer 11 and the gate insulating layer 4, and the contact hole CH3 that at least reaches the source bus line SL is formed in the first insulating layer 11. No contact hole is formed in the region where the transfer terminal section is formed.

Next, a transparent conductive film is formed on the first insulating layer 11 and within the contact holes CH1, CH2, and CH3, and patterned. In this way, the gate terminal upper connection section 19g in contact with the gate bus line GL within the contact hole CH2 and the source terminal upper connection section 19s in contact with the source bus line SL within the contact hole CH3 are formed. In the region where the transfer terminal section is formed, the transparent conductive film is removed.

Next, a patch electrode conductive film is formed on the first insulating layer 11, on the gate terminal upper connection section 19g and the source terminal upper connection section 19s, and within the contact hole CH1, and patterned. In this way, the patch electrode 15 in contact with the drain electrode 7D within the contact hole CH1 is formed in the transmission and/or reception region R1, and the patch connection section 15p is formed in the non-transmission and/or reception region R2. Similar to the previous embodiments, an etchant capable of ensuring an etching selection ratio between the transparent conductive film (ITO or the like) and the patch electrode conductive film is used for patterning the patch electrode conductive film.

Subsequently, the protective conductive layer 23 is formed on the patch connection section 15p. A Ti layer, an ITO layer, and an indium zinc oxide (IZO) layer (having a thickness of greater than or equal to 50 nm and less than or equal to 100 nm, for example), or the like can be used as the protective conductive layer 23. Here, a Ti layer (having a thickness of 50 nm, for example) is used as the protective conductive layer 23. Note that the protective conductive layer may be formed on the patch electrode 15.

Next, the second insulating layer 17 is formed. Thereafter, the second insulating layer 17 is patterned by, for example, dry etching using a fluorine-based gas. In this way, the opening 18g exposing the gate terminal upper connection section 19g, the opening 18s exposing the source terminal upper connection section 19s, and the opening 18p exposing the protective conductive layer 23 are provided in the second insulating layer 17. In this manner, the TFT substrate 103 is obtained.

Structure of Slot Substrate 203

Figure 12:
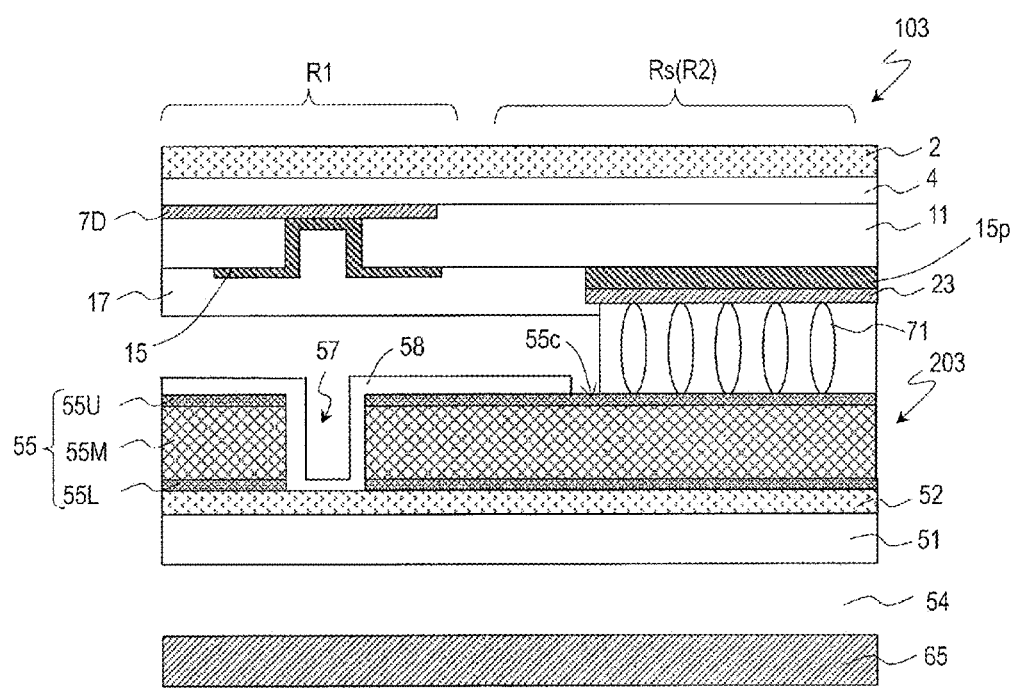
FIG. 12 is a schematic cross-sectional view for illustrating a transfer section in the TFT substrate 103 and a slot substrate 203.

FIG. 12 is a schematic cross-sectional view for illustrating a transfer section that connects the transfer terminal section PT of the TFT substrate 103 and a terminal section IT of a slot substrate 203 in the present embodiment. In FIG. 12, the same reference numerals are attached to the same constituent elements as those in the embodiments described above.

First, the slot substrate 203 in this embodiment will be described. The slot substrate 203 includes the dielectric substrate 51, the third insulating layer 52 formed on the front surface of the dielectric substrate 51, the slot electrode 55 formed on the third insulating layer 52, and the fourth insulating layer 58 covering the slot electrode 55. The reflective conductive plate 65 is disposed opposing the rear surface of the dielectric substrate 51 with the dielectric layer (air layer) 54 interposed therebetween. The slot electrode 55 and the reflective conductive plate 65 function as walls of the waveguide 301.

The slot electrode 55 has a layered structure in which a Cu layer or an Al layer is the main layer 55M. In the transmission and/or reception region R1, a plurality of slots 57 are formed in the slot electrode 55. The structure of the slot electrode 55 in the transmission and/or reception region R1 is the same as the structure of the slot substrate 201 described above with reference to FIG. 6.

The terminal section IT is provided in the non-transmission and/or reception region R2. The terminal section IT includes an opening exposing the front surface of the slot electrode 55 provided in the fourth insulating layer 58. The exposed area of the slot electrode 55 serves as a contact surface 55c. As described above, in the present embodiment, the contact surface 55c of the slot electrode 55 is not covered with the fourth insulating layer 58.

In the transfer section, the protective conductive layer 23 covering the patch connection section 15p of the TFT substrate 103 and the contact surface 55c of the slot electrode 55 of the slot substrate 203 are connected with a resin (sealing resin) containing the conductive beads 71 therebetween.

As in the above-described embodiments, the transfer section in the present embodiment may be disposed at both the central portion and the peripheral portion of the scanning antenna, or may be disposed in only one of them. In addition, the transfer section may be disposed within the seal region Rs or may be disposed outside the seal region Rs (opposite to the liquid crystal layer).

In the present embodiment, no transparent conductive film is provided on the transfer terminal PT and the contact surface of the terminal section IT. Accordingly, the protective conductive layer 23 and the slot electrode 55 of the slot substrate 203 can be connected with a sealing resin containing conductive particles therebetween.

Furthermore, in the present embodiment, since the difference in the depth of the collectively formed contact holes is small in comparison with the first embodiment (FIG. 3A to FIG. 4C), the damage to the conductive film that serves as the base of the contact holes can be reduced.

Manufacturing Method of Slot Substrate 203

The slot substrate 203 is manufactured as follows. Since the material, the thickness, and the formation method of each layer are the same as those of the slot substrate 201, the description thereof is omitted.

First, the third insulating layer 52 and the slot electrode 55 are formed on the dielectric substrate in the same manner as the slot substrate 201, and a plurality of slots 57 are formed in the slot electrode 55. Next, the fourth insulating layer 58 is formed on the slot electrode 55 and within the slot. Subsequently, the opening 18p is formed in the fourth insulating layer 58 so as to expose a region that will become the contact surface of the slot electrode 55. In this way, the slot substrate 203 is manufactured.

Internal Heater Structure

As described above, it is preferable that the dielectric anisotropy $\Delta\varepsilon_M$ of the liquid crystal material used for the antenna unit of the antenna be large. However, the viscosity of liquid crystal materials (nematic liquid crystals) having large dielectric anisotropies ACM is high, and the slow response speed may lead to problems. In particular, as the temperature decreases, the viscosity increases. The environmental temperature of a scanning antenna mounted on a moving body (for example, a ship, an aircraft, or an automobile) fluctuates. Accordingly, it is preferable that the temperature of the liquid crystal material can be adjusted to a certain extent, for example 30° C. or higher, or 45° C. or higher. The set temperature is preferably set such that the viscosity of the nematic liquid crystal material is about 10 cP (centipoise) or less.

In addition to the above structure, the scanning antenna according to the embodiments of the disclosure preferably has an internal heater structure. A resistance heating type heater that uses Joule heat is preferable as the internal heater. The material of the resistive film for the heater is not particularly limited to a specific material, but a conductive material having relatively high specific resistance such as ITO or IZO can be utilized, for example. In addition, to adjust the resistance value, a resistive film may be formed with thin lines or meshes made of a metal (e.g., nichrome, titanium, chromium, platinum, nickel, aluminum, and copper). Thin lines or meshes made of ITO and IZO may be also used. The resistance value may be set according to the required calorific value.

For example, to set the heat generation temperature of the resistive film to 30° C. for an area (roughly 90000 mm$^2$) of a circle having a diameter of 340 mm with 100 V AC (60 Hz), the resistance value of the resistive film should be set to 139Ω, the current should be set to 0.7 A, and the power density should be set to 800 W/m$^2$. To set the heat generation temperature of the resistive film to 45° C. for the same area with 100 V AC (60 Hz), the resistance value of the resistive film should be set to 82Ω, the current should be set to 1.2 A, and the power density should be set to 1350 W/m$^2$.

Figure 13A:
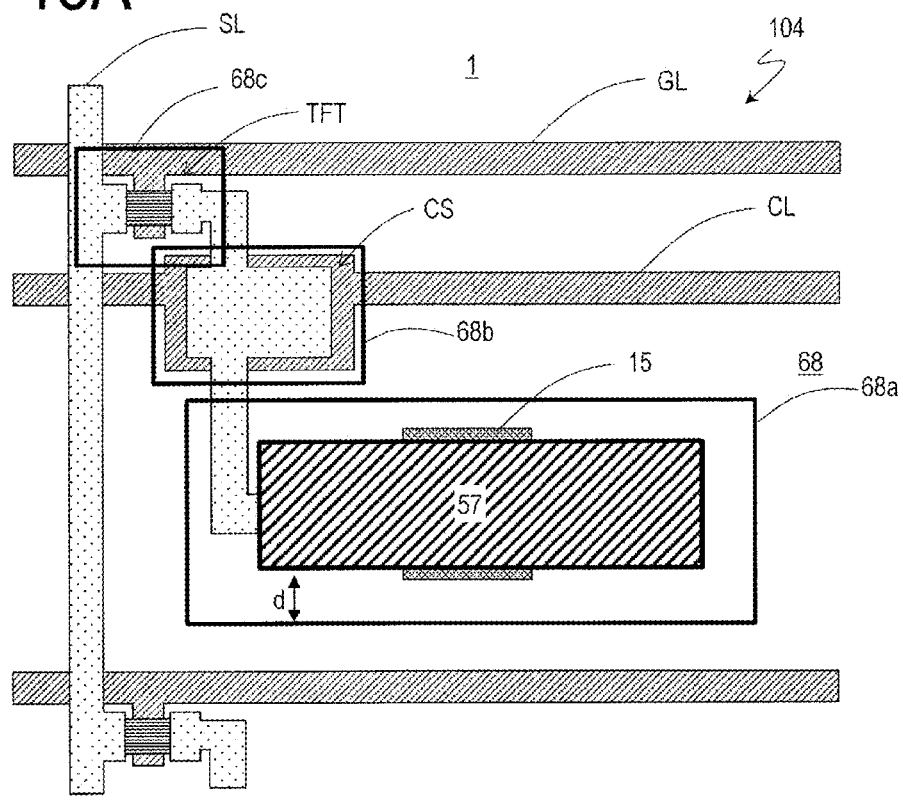
FIG. 13A is a schematic plan view of a TFT substrate 104 including a heater resistive film 68.

The resistive film for the heater may be provided anywhere as long as it does not affect the operation of the scanning antenna, but to efficiently heat the liquid crystal material, the resistive film is preferably provided near the liquid crystal layer. For example, as illustrated in a TFT substrate 104 illustrated in FIG. 13A, a resistive film 68 may be formed on almost the entire surface of the dielectric substrate 1. FIG. 13A is a schematic plan view of the TFT substrate 104 including the heater resistive film 68. The resistive film 68 is covered with, for example, the base insulating film 2 illustrated in FIG. 3A. The base insulating film 2 is formed to have a sufficient dielectric strength.

The resistive film 68 preferably has openings 68a, 68b, and 68c. When the TFT substrate 104 and the slot substrate are bonded to each other, the slots 57 are positioned to oppose the patch electrodes 15. At this time, the opening 68a is disposed such that the resistive film 68 is not present within an area having a distance d from an edge of the slot 57. The distance d is 0.5 mm, for example. In addition, it is also preferable to dispose the opening portion 68b under the auxiliary capacitance CS and to dispose the opening portion 68c under the TFT.

Figure 13B:
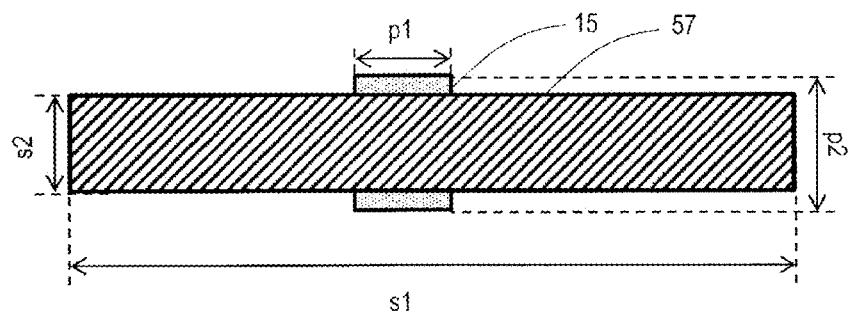
FIG. 13B is a schematic plan view for illustrating sizes of a slot 57 and a patch electrode 15.

Note that the size of the antenna unit U is, for example, 4 mm×4 mm. In addition, as illustrated in FIG. 13B, a width s2 of the slot 57 is 0.5 mm, a length s1 of the slot 57 is 3.3 mm, a width p2 of the patch electrode 15 in a width direction of the slot 57 is 0.7 mm, and a width p1 of the patch electrode 15 in the length direction of the slot is 0.5 mm. Note that the size, shape, arrangement relationships, and the like of the antenna unit U, the slot 57, and the patch electrode 15 are not limited to the examples illustrated in FIGS. 13A and 13B.

To further reduce the influence of the electric field from the heater resistive film 68, a shield conductive layer may be formed. The shield conductive layer is formed, for example, on the base insulating film 2 over almost the entire surface of the dielectric substrate 1. While the shield conductive layer need not include the openings 68a and 68b like in the resistive film 68, the opening 68c is preferably provided therein. The shield conductive layer is formed of, for example, an aluminum layer, and is set to ground potential.

In addition, the resistive film preferably has a distribution of the resistance value so that the liquid crystal layer can be uniformly heated. A temperature distribution of the liquid crystal layer is preferably such that a difference between a maximum temperature and a minimum temperature (temperature fluctuation) is, for example, less than or equal to 15° C. When the temperature fluctuation exceeds 15° C., there are cases that phase difference modulation varies within the plane, and good quality beam formation cannot be achieved. Furthermore, when the temperature of the liquid crystal layer approaches the Tni point (for example, 125° C.), $\Delta\varepsilon_M$ becomes small, which is not preferable.

With reference to FIGS. 14A and 14B, and FIGS. 15A to 15C, the distribution of the resistance value in the resistive film will be described. FIGS. 14A and 14B, and FIGS. 15A to 15C illustrate schematic structures of resistance heating structures 80a to 80e and a current distribution. The resistance heating structure includes a resistive film and a heater terminal.

Figure 14A:
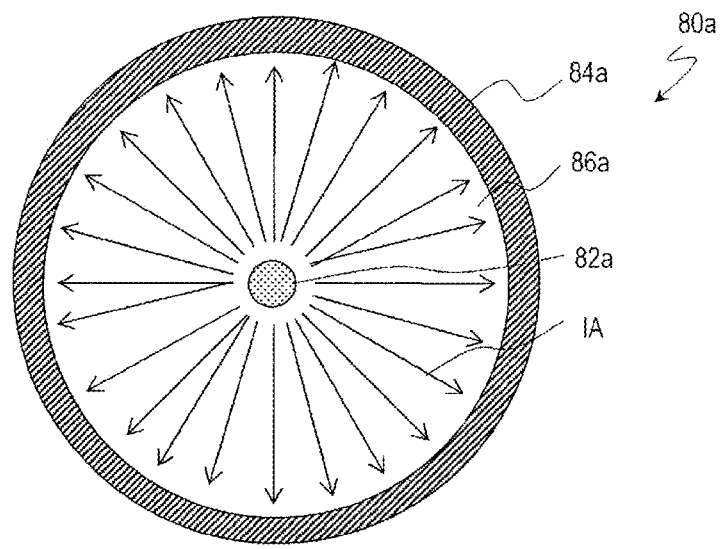
FIGS. 14A and 14B are diagrams illustrating a schematic structure and current distribution of resistance heating structures 80a and 80b, respectively.

The resistance heating structure 80a illustrated in FIG. 14A includes a first terminal 82a, a second terminal 84a, and a resistive film 86a connected thereto. The first terminal 82a is disposed at the center of the circle, and the second terminal 84a is disposed along the entire circumference. Here, the circle corresponds to the transmission and/or reception region R1. When a DC voltage is applied between the first terminal 82a and the second terminal 84a, for example, a current IA flows radially from the first terminal 82a to the second terminal 84a. Accordingly, even though an in-plane resistance value is constant, the resistive film 86a can uniformly generate heat. Of course, the direction of a current flow may be a direction from the second terminal 84a to the first terminal 82a.

Figure 14B:
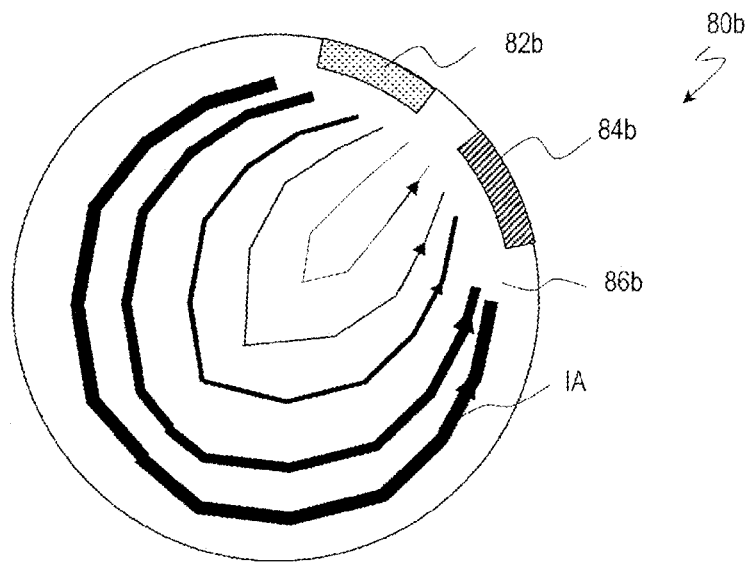

The resistance heating structure 80b illustrated in FIG. 14B includes a first terminal 82b, a second terminal 84b, and a resistive film 86b connected thereto. The first terminal 82b and the second terminal 84b are disposed adjacent to each other along the circumference. A resistance value of the resistive film 86b has an in-plane distribution such that an amount of heat generated per unit area by the current IA flowing between the first terminal 82b and the second terminal 84b in the resistive film 86b is constant. In a case where the resistive film 86b is formed of a thin line, for example, the in-plane distribution of the resistance value of the resistive film 86 may be adjusted by the thickness of the thin line and the density of the thin line.

Figure 15A:
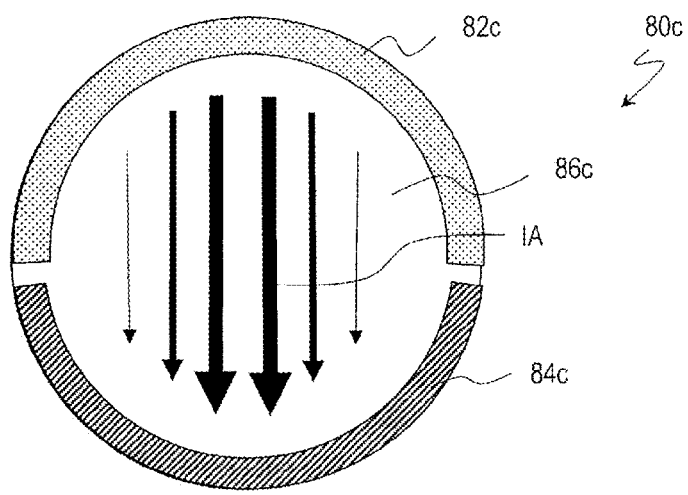
FIGS. 15A to 15C are diagrams illustrating a schematic structure and current distribution of resistance heating structures 80c to 80e, respectively.

The resistance heating structure 80c illustrated in FIG. 15A includes a first terminal 82c, a second terminal 84c, and a resistive film 86c connected thereto. The first terminal 82c is disposed along the circumference of the upper half of the circle, and the second terminal 84c is disposed along the circumference of the lower half of the circle. When the resistive film 86c is constituted by thin lines extending vertically between the first terminal 82c and the second terminal 84c, for example, a thickness and a density of the thin lines near the center are adjusted such that the amount of heat generated per unit area by the current IA is constant in the plane.

Figure 15B:
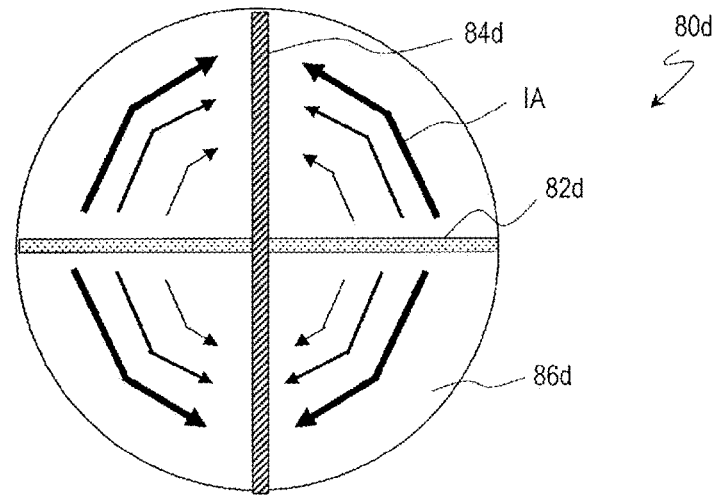

The resistance heating structure 80d illustrated in FIG. 15B includes a first terminal 82d, a second terminal 84d, and a resistive film 86d connected thereto. The first terminal 82d and the second terminal 84d are provided so as to extend in the vertical direction and the horizontal direction, respectively, along the diameter of the circle. Although simplified in drawings, the first terminal 82d and the second terminal 84d are electrically insulated from each other.

Figure 15C:
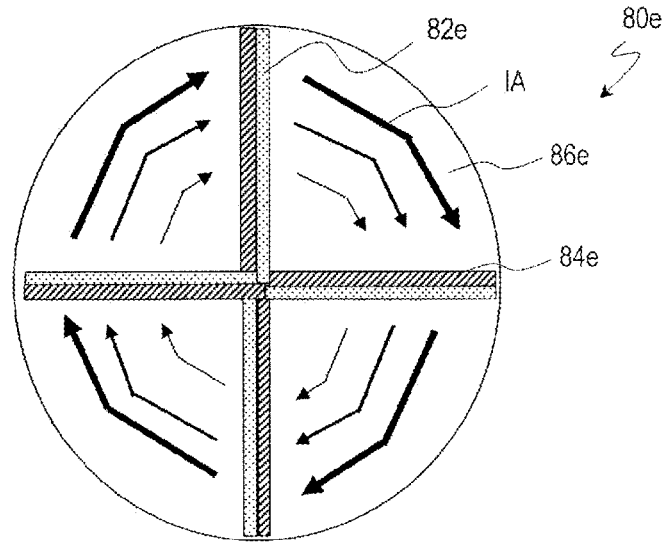

In addition, the resistance heating structure 80e illustrated in FIG. 15C includes a first terminal 82e, a second terminal 84e, and a resistive film 86e connected thereto. Unlike the resistance heating structure 80d, both the first terminal 82e and the second terminal 84e of the resistance heating structure 80e include four portions extending from the center of the circle in four directions upward, downward, left, and right. The portions of the first terminal 82e and the second terminal 84e that form a 90 degree angle with each other are disposed such that the current IA flows clockwise.

In both of the resistance heating structure 80d and the resistance heating structure 80e, the thin line closer to the circumference is adjusted to be thick and have a higher density, for example, so that the closer to the circumference the more the current IA increases and the amount of heat generated per unit area becomes uniform within the plane.

Such an internal heater structure may automatically operate, for example, when it is detected that the temperature of the scanning antenna has fallen below a preset temperature. Of course, it may also operate in response to the operation of a user.

External Heater Structure

Instead of the internal heater structure described above, or in addition to the internal heater structure, the scanning antenna according to the embodiments of the disclosure may include an external heater structure. A resistance heating type heater that uses Joule heat is preferable as the external heater although various known heaters can be used. Assume that a part generating heat in the heater is a heater section. In the following description, an example in which a resistive film is used as the heater section is described. In the following description also, the resistive film is denoted by the reference numeral 68.

Figure 16A:
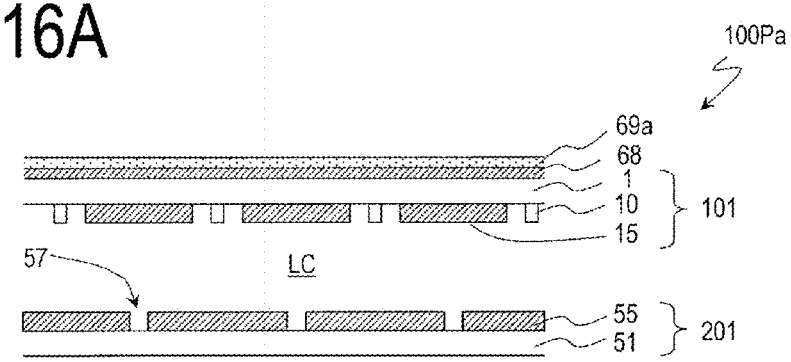
FIG. 16A is a schematic cross-sectional view of a liquid crystal panel 100Pa including the heater resistive film 68.
Figure 16B:
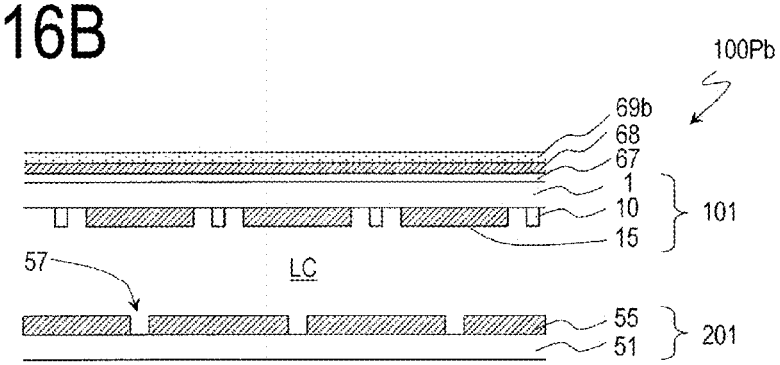
FIG. 16B is a schematic cross-sectional view of a liquid crystal panel 100Pb including the heater resistive film 68.

For example, the heater resistive film 68 is preferably disposed as in a liquid crystal panel 100Pa or 100Pb illustrated in FIGS. 16A and 16B. Here, the liquid crystal panels 100Pa and 100Pb includes the TFT substrate 101, the slot substrate 201, and the liquid crystal layer LC provided therebetween in the scanning antenna 1000 illustrated in FIG. 1, and further includes a resistance heating structure including the resistive film 68 on an outer side of the TFT substrate 101. The resistive film 68 may be formed on a side of the dielectric substrate 1 of the TFT substrate 101 closer to the liquid crystal layer LC. However, such a configuration complicates a manufacturing process of the TFT substrate 101, and thus the resistive film 68 is preferably disposed on the outer side of the TFT substrate 101 (opposite to the liquid crystal layer LC).

The liquid crystal panel 100Pa illustrated in FIG. 16A includes the heater resistive film 68 formed on an outer surface of the dielectric substrate 1 of the TFT substrate 101 and a protection layer 69a covering the heater resistive film 68. The protection layer 69a may be omitted. The scanning antenna is housed in a case made of plastic, for example, and therefore, the resistive film 68 is not directly contacted by the user.

The resistive film 68 can be formed on the outer surface of the dielectric substrate 1 by use of, for example, a known thin film deposition technique (e.g., sputtering, CVD), a coating method, or a printing method. The resistive film 68 is patterned as needed. Patterning is performed through a photolithographic process, for example.

The material of the heater resistive film 68 is not particularly limited to a specific material as described above for the internal heater structure, but a conductive material having relatively high specific resistance such as ITO or IZO can be utilized, for example. In addition, to adjust the resistance value, the resistive film 68 may be formed with thin lines or meshes made of a metal (e.g., nichrome, titanium, chromium, platinum, nickel, aluminum, and copper). Thin lines or meshes made of ITO and IZO may be also used. The resistance value may be set according to the required calorific value.

The protection layer 69a is made of an insulating material and formed to cover the resistive film 68. The protection layer 69a may not be formed on a portion where the resistive film 68 is patterned and the dielectric substrate 1 is exposed. The resistive film 68 is patterned so as not to decrease the antenna performance as described later. In a case that a presence of the material forming the protection layer 69a causes the antenna performance to decrease, the patterned protection layer 69a is preferably used similar to the resistive film 68.

The protection layer 69a may be formed by any of a wet process and a dry process. For example, a liquid curable resin (or precursor of resin) or a solution is applied on the surface of the dielectric substrate 1 on which the resistive film 68 is formed, and thereafter, the curable resin is cured to form the protection layer 69a. The liquid resin or the resin solution is applied to the surface of the dielectric substrate 1 to have a predetermined thickness by various coating methods (e.g., using a slot coater, a spin coater, a spray) or various printing methods. After that, the resultant substrate is subjected to room temperature curing, thermal curing, or light curing depending on a kind of the resin to form the protection layer 69a which is an insulating resin film. The insulating resin film may be patterned by a photolithographic process, for example.

A curable resin material is preferably used as a material for forming the protection layer 69a. The curable resin material includes a thermal curing type resin material and a light curing type resin material. The thermal curing type includes a thermal cross-linking type and a thermal polymerization type.

Examples of the resin material of thermal cross-linking type include a combination of an epoxy-based compound (e.g., an epoxy resin) and amine-based compound, a combination of an epoxy-based compound and a hydrazide-based compound, a combination of an epoxy-based compound and an alcohol-based compound (e.g., including a phenol resin), a combination of an epoxy-based compound and a carboxylic acid-based compound (e.g., including an acid anhydride), a combination of an isocyanate-based compound and an amine-based compound, a combination of an isocyanate-based compound and a hydrazide-based compound, a combination of an isocyanate-based compound and an alcohol-based compound (e.g., including an urethane resin), and a combination of an isocyanate-based compound and a carboxylic acid-based compound. Examples of a cationic polymerization type adhesive include a combination of an epoxy-based compound and a cationic polymerization initiator (a representative cationic polymerization initiator: aromatic sulfonium salt). Examples of the resin material of radical polymerization type include a combination of a monomer and/or an oligomer containing a vinyl group of various acrylic, methacrylic, and urethane modified acrylic (methacrylic) resins and a radical polymerization initiator (a representative radical polymerization initiator: azo-based compound (e.g., azobisisobutyronitrile (AIBN))), and examples of the resin material of ring-opening polymerization type include an ethylene oxide-based compound, an ethyleneimine-based compound, and a siloxane-based compound. In addition, examples of the resin material may also include a maleimide resin, a combination of a maleimide resin and an amine, a combination of maleimide and a methacrylic compound, a bismaleimide-triazine resin, and a polyphenylene ether resin. Moreover, polyimide can be preferably used. Note that "polyimide" including polyamic acid that is a precursor of polyimide is used. Polyimide is used in combination with an epoxy-based compound or an isocyanate-based compound, for example.

In terms of a heat resistance, a chemical stability, and mechanical characteristics, the thermal curing type resin material is preferably used. Particularly, the resin material containing an epoxy resin or a polyimide resin is preferable, and in terms of the mechanical characteristics (in particular, a mechanical strength) and a hygroscopicity, the resin material containing a polyimide resin is preferable. A polyimide resin and an epoxy resin may be mixed to be used. A polyimide resin and/or an epoxy resin may be mixed with a thermoplastic resin and/or an elastomer. Furthermore, rubber-modified polyimide resin and/or epoxy resin may be mixed. A thermoplastic resin or an elastomer can be mixed to improve flexibility or toughness. Even when the rubber-modified resin is used, the same effect can be obtained.

A cross-linking reaction and/or a polymerization reaction of the light curing type material is caused by ultraviolet light or visible light, and the light curing type material cures. The light curing type includes a radical polymerization type and a cationic polymerization type, for example. Representative examples of the radical polymerization type material include a combination of an acrylic resin (epoxy modified acrylic resin, urethane modified acrylic resin, silicone modified acrylic resin) and a photopolymerization initiator. Examples of an ultraviolet radical polymerization initiator include an acetophenone type initiator and a benzophenone type initiator. Examples of a visible light radical polymerization initiator include a benzylic type initiator and a thioxanthone type initiator. A combination of an epoxy compound and a photo cationic polymerization initiator is a representative example of the cationic polymerization type. Examples of a photo cationic polymerization initiator include an iodonium salt-based compound. A resin material having both light curing and thermal curing characteristics can be used also.

The liquid crystal panel 100Pb illustrated in FIG. 16B is different from the liquid crystal panel 100Pa in that the liquid crystal panel 100Pb further includes an adhesive layer 67 between the resistive film 68 and the dielectric substrate 1. Moreover, the liquid crystal panel 100Pb is different from the liquid crystal panel 100Pa in that the protection layer 69$b$ is formed using a polymer film or glass plate fabricated in advance.

For example, the liquid crystal panel 100Pb including the protection layer 69$b$ formed of a polymer film is manufactured as below.

First, an insulating polymer film that will become the protection layer 69$b$ is prepared. Examples of a polymer film include a polyester film made of polyethylene terephthalate, polyethylene naphthalate or the like, and a film made of super engineering plastic such as polyphenylene sulfone, polyimide, or polyamide. A thickness of the polymer film (that is, a thickness of the protection layer 69$b$) is greater than or equal to 5 µm and less than or equal to 200 µm, for example.

The resistive film 68 is formed on one surface of this polymer film. The resistive film 68 can be formed by the above method. The resistive film 68 may be patterned, and the polymer film may be also patterned as needed.

The polymer film on which the resistive film 68 is formed (that is, a member integrally formed of the protection layer 69$b$ and the resistive film 68) is bonded to the dielectric substrate 1 with an adhesive. Examples of the adhesive include the same curable resin as the curable resin used to form the protection layer 69$a$ described above. Furthermore, a hot-melt type resin material (adhesive) can be used. The hot-melt type resin material contains a thermoplastic resin as a main component, and melts by heating and solidifies by cooling. Examples of the hot-melt type resin material include polyolefin-based (e.g., polyethylene, polypropylene), polyamide-based, and ethylene vinyl acetate-based resins. A reactive urethane-based hot-melt resin material (adhesive) is also available. In terms of adhesive and durability, the reactive urethane-based resin is preferable.

The adhesive layer 67 may be patterned similar to the resistive film 68 and the protection layer (polymer film) 69$b$. However, the adhesive layer 67 needs only fix the resistive film 68 and the protection layer 69$b$ to the dielectric substrate 1, and may be smaller than the resistive film 68 and the protection layer 69$b$.

In place of the polymer film, the glass plate may be also used to form the protection layer 69$b$. A manufacturing process may be the same as the case using the polymer film. A thickness of the glass plate is preferably less than or equal to 1 mm and further preferably less than or equal to 0.7 mm A lower limit of the thickness of the glass plate is not specifically specified, but in terms of handling, the thickness of the glass plate is preferably greater than or equal to 0.3 mm.

In the liquid crystal panel 100Pb illustrated in FIG. 16B, the resistive film 68 formed on the protection layer (polymer film or glass plate) 69$b$ is fixed to the dielectric substrate 1 via the adhesive layer 67, but the resistive film 68 needs only be disposed in contact with the dielectric substrate 1, and the resistive film 68 and the protection layer 69$b$ are not necessarily fixed (bonded) to the dielectric substrate 1. In other words, the adhesive layer 67 may be omitted. For example, the polymer film on which the resistive film 68 is formed (that is, a member integrally formed of the protection layer 69$b$ and the resistive film 68) may be disposed such that the resistive film 68 is brought into contact with the dielectric substrate 1 and is pressed against the dielectric substrate 1 with the case housing the scanning antenna. For example, since the thermal contact resistance possibly increases when the polymer film on which the resistive film 68 is formed is merely disposed only, the polymer film is preferably pressed against the dielectric substrate to decrease the thermal contact resistance. Using such a configuration allows the member integrally formed of the resistive film 68 and the protection layer (polymer film or glass plate) 69$b$ to be detachable.

Note that in a case that the resistive film 68 (and the protection layer 69$b$) is patterned as described later, the resistive film 68 (and the protection layer 69$b$) is preferably fixed to the dielectric substrate 1 to a degree not to shift in a position with respect to the TFT substrate so that the antenna performance does not decrease.

The heater resistive film 68 may be provided anywhere as long as it does not affect the operation of the scanning antenna, but to efficiently heat the liquid crystal material, the resistive film is preferably provided near the liquid crystal layer. Therefore, the heater resistive film 68 is preferably provided on the outer side of the TFT substrate 101 as illustrated in FIGS. 16A and 16B. In addition, the resistive film 68 directly provided on the outer side of the dielectric substrate 1 of the TFT substrate 101 as illustrated in FIG. 16A is preferable, because an energy efficiency is higher, and controllability of the temperature is higher than those in a case in which the resistive film 68 is provided on the outer side of the dielectric substrate 1 with the adhesive layer 67 therebetween as illustrated in FIG. 16B.

For example, the resistive film 68 may be formed on almost the entire surface of the dielectric substrate 1 of the TFT substrate 104 illustrated in FIG. 13A. The resistive film 68 preferably includes the openings 68$a$, 68$b$, and 68$c$ as described for the internal heater structure.

The protection layers 69$a$ and 69$b$ may be formed on the entire surface to cover the resistive film 68. As described above, in a case where the protection layer 69$a$ or 69$b$ has an adverse effect on antenna characteristics, openings corresponding to the openings 68$a$, 68$b$, and 68$c$ of the resistive film 68 may be provided. In this case, the openings of the protection layer 69$a$ or 69$b$ are formed inside the openings 68$a$, 68$b$, and 68$c$ of the resistive film 68.

To further reduce the influence of the electric field from the heater resistive film 68, a shield conductive layer may be formed. The shield conductive layer is formed on the side of the resistive film 68 closer to the dielectric substrate 1 with an insulating film therebetween, for example. The shield conductive layer is formed on almost the entire surface of the dielectric substrate 1. While the shield conductive layer need not include the openings 68$a$ and 68$b$ like in the resistive film 68, the opening 68$c$ is preferably provided therein. The shield conductive layer is formed of, for example, an aluminum layer, and is set to ground potential. In addition, the resistive film preferably has a distribution of the resistance value so that the liquid crystal layer can be uniformly heated. These structures are similar to the structures of the internal heater structure described above.

The resistive film needs only heat the liquid crystal layer LC in the transmission and/or reception region R1, and may be provided on an area corresponding to the transmission and/or reception region R1 as an example described above. However, the structure of the resistive film is not limited to this structure. For example, as illustrated in FIG. 2A, in a case where the TFT substrate 101 has an outline capable of defining a rectangular area encompassing the transmission and/or reception region R1, the resistive film may be provided on an area corresponding to the rectangular area encompassing the transmission and/or reception region R1. Of course, the outline of the resistive film is not limited to a rectangle, and may be any shape encompassing the transmission and/or reception region R1.

In the above example, the resistive film is disposed on the outer side of the TFT substrate 101, but the resistive film may be disposed on an outer side of the slot substrate 201 (opposite to the liquid crystal layer LC). In this case also, the resistive film may be formed directly on the dielectric substrate 51 similar to the liquid crystal panel 100Pa in FIG. 16A, or the resistive film formed on the protection layer (polymer film or glass plate) with the adhesive layer therebetween may be fixed to the dielectric substrate 51 similar to the liquid crystal panel 100Pb in FIG. 16B. Alternatively, the protection layer on which the resistive film is formed without the adhesive layer (that is, the member integrally formed of the protection layer and the resistive film) may be disposed such that the resistive film is in contact with the dielectric substrate 51. For example, since the thermal contact resistance possibly increases in a case where the polymer film on which the resistive film is formed is merely disposed only, the polymer film is preferably pressed against the dielectric substrate 51 to decrease the thermal contact resistance. Using such a configuration allows the member integrally formed of the resistive film and the protection layer (polymer film or glass plate) to be detachable. Note that in a case where the resistive film (and the protection layer) is patterned, the resistive film (and the protection layer) is preferably fixed to the dielectric substrate to a degree not to shift in a position with respect to the slot substrate so that the antenna performance does not decrease.

In a case where the resistive film is disposed on the outer side of the slot substrate 201, openings are preferably provided in the resistive film at positions corresponding to the slots 57. The resistive film has preferably a thickness enough to transmit microwaves.

Here, the example in which the resistive film is used as the heater section is described, but other than the example, a nichrome line (e.g., winding wire), an infrared light heater section, and the like may be used as the heater section, for example. In the cases like these also, the heater section is preferably disposed not to decrease the antenna performance.

Such an external heater structure may automatically operate, for example, when it is detected that the temperature of the scanning antenna has fallen below a preset temperature. Of course, it may also operate in response to the operation of a user.

As a temperature control device for making the external heater structure automatically operate, various known thermostats can be used, for example. For example, a thermostat using bimetal may be connected between one of two terminals connected with the resistive film and a power source. Of course, a temperature control device may be used which supplies current to the external heater structure from the power source to prevent the temperature from falling below a preset temperature by use of a temperature sensor.

Driving Method

Since an antenna unit array of the scanning antenna according to the embodiments of the disclosure has a structure similar to that of an LCD panel, line sequential driving is performed in the same manner as an LCD panel. However, in a case where known driving methods for LCD panels are applied, the following problems may occur. Problems that may occur in the scanning antenna will be described with reference to the equivalent circuit diagram of one antenna unit of the scanning antenna illustrated in FIG. 17.

First, as mentioned above, since the specific resistance of liquid crystal materials having large dielectric anisotropies ACM (birefringence Δn with respect to visible light) in the microwave range is low, in a case where driving methods for LCD panels are applied as is, the voltage applied to the liquid crystal layer cannot be sufficiently maintained. Then, the effective voltage applied to the liquid crystal layer decreases, and the electrostatic capacitance value of the liquid crystal capacitance does not reach the target value.

In this way, when the voltage applied to the liquid crystal layer deviates from the predetermined value, the direction in which the gain of the antenna becomes maximum deviates from the intended direction. Then, for example, communication satellites cannot be accurately tracked. To prevent this, an auxiliary capacitance CS is provided electrically in parallel with the liquid crystal capacitance Clc, and the capacitance value C-Ccs of the auxiliary capacitance CS is sufficiently increased. The capacitance value C-Ccs of the auxiliary capacitance CS is preferably set appropriately such that the voltage holding rate of the liquid crystal capacitance Clc is at least greater than or equal to 30%, and preferably greater than or equal to 55%. The capacitance value C-Ccs of the auxiliary capacitance CS depends on the area of electrodes CSE1 and CSE2, and the thickness and the dielectric constant of the dielectric layer between the electrode CSE1 and the electrode CSE2. Typically, the same voltage as that of the patch electrode 15 is supplied to the electrode CSE1, and the same voltage as that of the slot electrode 55 is supplied to the electrode CSE2.

In addition, when a liquid crystal material having a low specific resistance is utilized, a voltage drop due to the interface polarization and/or the orientation polarization also occurs. To prevent the voltage drop due to these polarizations, it is conceivable to apply a sufficiently high voltage in anticipation of the voltage drop. However, when a high voltage is applied to a liquid crystal layer having a low specific resistance, a dynamic scattering effect (DS effect) may occur. The DS effect is caused by a convection of ionic impurities in the liquid crystal layer, and the dielectric constant CM of the liquid crystal layer approaches an average value $((\varepsilon_M // + 2\varepsilon_M \bot)/3)$. Also, to control the dielectric constant CM of the liquid crystal layer in multiple stages (multiple gray scales), it is not always possible to apply a sufficiently high voltage.

To suppress the above-described DS effect and/or the voltage drop due to the polarization, the polarity inversion period of the voltage applied to the liquid crystal layer may be sufficiently shortened. As is well known, in a case where the polarity inversion period of the applied voltage is shortened, a threshold voltage at which the DS effect occurs becomes higher. Accordingly, the polarity inversion frequency may be determined such that the maximum value of the voltage (absolute value) applied to the liquid crystal layer is less than the threshold voltage at which the DS effect occurs. For the polarity inversion frequency of 300 Hz or greater, even in a case where a voltage with an absolute value of 10 V is applied to a liquid crystal layer having a specific resistance of $1\times10^{10}$ Ω·cm and a dielectric anisotropy Δε (@ 1 kHz) of about −0.6, a good quality action can be ensured. In addition, in a case that the polarity inversion frequency (typically equal to twice the frame frequency) is 300 Hz or greater, the voltage drop caused by the polarization is also suppressed. From the viewpoint of power consumption and the like, the upper limit of the polarity inversion period is preferably about less than or equal to 5 kHz.

The polarity inversion frequency of the voltage applied to the liquid crystal layer naturally depends on the liquid crystal material (particularly the specific resistance). Accordingly, depending on the liquid crystal material, even in a case where a voltage with a polarity inversion period of less than 300 Hz is applied, the above described problem does not arise. However, since the liquid crystal material used for the scanning antenna according to the embodiments of the disclosure has a lower specific resistance than that of the liquid crystal material used for LCDs, it is preferable for the liquid crystal layer to be driven at roughly 60 Hz or greater.

As described above, since the viscosity of the liquid crystal material depends on the temperature, it is preferable that the temperature of the liquid crystal layer be appropriately controlled. The physical properties and driving conditions of the liquid crystal material described here are values under the operating temperature of the liquid crystal layer. Conversely, the temperature of the liquid crystal layer is preferably controlled such that it can be driven under the above conditions.

An example of a waveform of a signal used for driving the scanning antenna will be described with reference to FIGS. 18A to 18G. Note that FIG. 18D illustrates the waveform of the display signal Vs (LCD) supplied to the source bus line of the LCD panel for comparison.

FIG. 18A illustrates the waveform of a scanning signal Vg supplied to a gate bus line G-L1, FIG. 18B illustrates the waveform of a scanning signal Vg supplied to a gate bus line G-L2, FIG. 18C illustrates the waveform of a scanning signal Vg supplied to a gate bus line G-L3, FIG. 18E illustrates the waveform of a data signal Vda supplied to the source bus line, FIG. 18F illustrates the waveform of a slot voltage Vidc supplied to the slot electrode of the slot substrate (slot electrode), and FIG. 18G illustrates the waveform of the voltage applied to the liquid crystal layer of each antenna unit.

As illustrated in FIGS. 18A to 18C, the voltage of the scanning signal Vg supplied to the gate bus line sequentially changes from a low level (VgL) to a high level (VgH). VgL and VgH can be appropriately set according to the characteristics of the TFT. For example, VgL=from −5 V to 0 V, and VgH=+20 V. Also, VgL=−20 V and VgH=+20 V are possible. A period from the time when the voltage of the scanning signal Vg of a particular gate bus line switches from the low level (VgL) to the high level (VgH) until the time when the voltage of the next gate bus line switches from VgL to VgH will be referred to as one horizontal scan period (1H). In addition, the period during which the voltage of each gate bus line is at the high level (VgH) will be referred to as a selection period PS. In this selection period PS, the TFTs connected to the respective gate bus lines are turned on, and the current voltage of the data signal Vda supplied to the source bus line is supplied to the corresponding patch electrode. The data signal Vda is, for example, from −15 V to 15 V (an absolute value is 15 V), and, for example, a data signal Vda having different absolute values corresponding to 12 gray scales, or preferably corresponding to 16 gray scales is used.

Here, a case is exemplified where an intermediate voltage is applied to all antenna units. That is, it is assumed that the voltage of the data signal Vda is constant with respect to all antenna units (assumed to be connected to m gate bus lines). This corresponds to the case where the gray levels are displayed on the LCD panel over the whole surface thereof. At this time, dot inversion driving is performed in the LCD panel. That is, in each frame, the display signal voltage is supplied such that the polarities of adjacent pixels (dots) are opposite to each other.

FIG. 18D illustrates the waveform of the display signal of the LCD panel on which the dot inversion driving is performed. As illustrated in FIG. 18D, the polarity of Vs (LCD) is inverted every 1H. The polarity of the Vs (LCD) supplied to a source bus line adjacent to a source bus line supplied with the Vs (LCD) having this waveform is opposite to the polarity of the Vs (LCD) illustrated in FIG. 18D. Furthermore, the polarity of the display signal supplied to all the pixels is inverted for each frame. In the LCD panels, it is difficult to perfectly match the magnitude of the effective voltage applied to the liquid crystal layer between the positive polarity and the negative polarity, and further, the difference in effective voltage becomes a difference in luminance, which is observed as flicker. To make this flicker less noticeable, the pixels (dots) to which voltages of different polarities are applied are spatially dispersed in each frame. Typically, by performing the dot inversion driving, the pixels (dots) having different polarities are arranged in a checkered pattern.

In contrast, in the scanning antenna, the flicker itself is not problematic. That is, it is sufficient for the electrostatic capacitance value of the liquid crystal capacitance to be an intended value, and the spatial distribution of the polarity in each frame is not problematic. Accordingly, from the perspective of low power consumption or the like, it is preferable to reduce the number of times of polarity inversion of the data signal Vda supplied from the source bus line; that is, to lengthen the period of polarity inversion. For example, as illustrated in FIG. 18E, the period of polarity inversion may be set to 10 H (such that polarity inversion occurs every 5 H). Of course, in a case where the number of antenna units connected to each source bus line (typically equal to the number of gate bus lines) is m, the period of polarity inversion of the data signal Vda may be 2 m·H (polarity inversion occurs each m·H). The period of polarity inversion of the data signal Vda may be equal to 2 frames (a polarity inversion occurs each frame).

In addition, the polarity of the data signal Vda supplied from all the source bus lines may be the same. Accordingly, for example, in a particular frame, a positive polarity data signal Vda may be supplied from all the source bus lines, and in the next frame, a negative polarity data signal Vda may be supplied from all the source bus lines.

Alternatively, the polarities of the data signals Vda supplied from the adjacent source bus lines may be opposite to each other. For example, in a particular frame, a positive polarity data signal Vda is supplied from odd-numbered source bus lines, and a negative polarity data signal Vda may be supplied from even-numbered source bus lines. Then, in the next frame, the negative polarity data signal Vda is supplied from the odd-numbered source bus lines, and the positive polarity data signal Vda is supplied from the even-numbered source bus lines. In the LCD panels, such a driving method is referred to as source line inversion driving. In a case where the data signals Vda supplied from adjacent source bus line are made to have opposite polarity, by connecting (short-circuiting) adjacent source bus lines to each other before inverting the polarity of the data signals Vda supplied between frames, it is possible to cancel electric charges stored in the liquid crystal capacitance between adjacent columns. Accordingly, an advantage can be obtained such that the amount of electric charge supplied from the source bus line in each frame can be reduced.

As illustrated in FIG. 18F, the voltage Vidc of the slot electrode is, for example, a DC voltage, and is typically a ground potential. Since the capacitance value of the capacitance (liquid crystal capacitance and auxiliary capacitance) of the antenna units is greater than the capacitance value of the pixel capacitance of the LCD panel (for example, about 30 times in comparison with 20-inch LCD panels), there is no affect from the pull-in voltage due to the parasitic capacitance of the TFT, and even in a case that the voltage Vidc of the slot electrode is the ground potential and the data signal Vda is a positive or negative symmetrical voltage with reference to the ground potential, the voltage supplied to the patch electrode is a positive and negative symmetrical voltage. In the LCD panels, although the positive and negative symmetrical voltages are applied to the pixel electrode by adjusting the voltage (common voltage) of the counter electrode in consideration of the pull-in voltage of the TFT, this is not necessary for the slot voltage of the scanning antenna, and ground potential may be used. Also, although not illustrated in FIG. 18A to FIG. 18G, the same voltage as the slot voltage Vidc is supplied to the CS bus line.

Since the voltage applied to the liquid crystal capacitance of each antenna unit is the voltage of the patch electrode with respect to the voltage Vidc (FIG. 18F) of the slot electrode (that is, the voltage of the data signal Vda illustrated in FIG. 18E), when the slot voltage Vidc is the ground potential, as illustrated in FIG. 18G, the voltage coincides with the waveform of the data signal Vda illustrated in FIG. 18E.

The waveform of the signal used for driving the scanning antenna is not limited to the above example. For example, as described below with reference to FIGS. 19A to 19E and FIGS. 20A to 20E, a Viac having an oscillation waveform may also be used as the voltage of the slot electrode.

For example, signals such as those exemplified in FIGS. 19A to 19E can be used. In FIGS. 19A to 19E, although the waveform of the scanning signal Vg supplied to the gate bus line is omitted, the scanning signal Vg described with reference to FIGS. 18A to 18C is also used here.

As illustrated in FIG. 19A, similar to that illustrated in FIG. 18E, a case where the waveform of the data signal Vda is inverted in polarity at a 10H period (every 5 H) will be exemplified. Here, a case where an amplitude is the maximum value $|Vda_{max}|$ is illustrated as the data signal Vda. As described above, the waveform of the data signal Vda may be inverted in polarity at a two frame period (each frame).

Here, as illustrated in FIG. 19C, the voltage Viac of the slot electrode is an oscillation voltage such that the polarity of the voltage Viac of the slot electrode is opposite to the polarity of the data signal Vda (ON), and the oscillation period of the slot electrode is the same as that of data signal Vda (ON). The amplitude of the voltage Viac of the slot electrode is equal to the maximum value $|Vda_{max}|$ of the amplitude of the data signal Vda. That is, the slot voltage Viac is set to a voltage that oscillates between $-Vda_{max}$ and $+Vda_{max}$ with the same period of polarity inversion as that of the data signal Vda (ON) and opposite polarity (the phase differs by 180°).

Since a voltage Vlc applied to the liquid crystal capacitance of each antenna unit is the voltage of the patch electrode with respect to the voltage Viac (FIG. 19C) of the slot electrode (that is, the voltage of the data signal Vda (ON) illustrated in FIG. 19A), when the amplitude of the data signal Vda oscillates at $\pm Vda_{max}$, the voltage applied to the liquid crystal capacitance has a waveform that oscillates with an amplitude twice $Vda_{max}$ as illustrated in FIG. 19D. Accordingly, the maximum amplitude of the data signal Vda required to make the maximum amplitude of the voltage Vlc applied to the liquid crystal capacitance $\pm Vda_{max}$ is $\pm Vda_{max}/2$.

Since the maximum amplitude of the data signal Vda can be halved by using such a slot voltage Viac, there is the advantage that a general-purpose driver IC with a breakdown voltage of 20 V or less can be used as a driver circuit for outputting the data signal Vda, for example.

Note that, as illustrated in FIG. 19E, to make the voltage Vlc (OFF) applied to the liquid crystal capacitance of each antenna unit zero, as illustrated in FIG. 19B, it may be preferable for the data signal Vda (OFF) to have the same waveform as that of the slot voltage Viac.

Consider, for example, a case where the maximum amplitude of the voltage Vlc applied to the liquid crystal capacitance is ±15 V. When the Vidc illustrated in FIG. 18F is used as the slot voltage and Vidc=0 V, the maximum amplitude of Vda illustrated in FIG. 18E becomes ±15 V. In contrast, when the Viac illustrated in FIG. 19C is used as the slot voltage and the maximum amplitude of Viac is ±7.5 V, the maximum amplitude of Vda (ON) illustrated in FIG. 19A becomes ±7.5 V.

When the voltage Vlc applied to the liquid crystal capacitance is 0 V, the Vda illustrated in FIG. 18E may be set to 0 V, and the maximum amplitude of the Vda (OFF) illustrated in FIG. 19B may be set to ±7.5 V.

In a case where the Viac illustrated in FIG. 19C is utilized, the amplitude of the voltage Vlc applied to the liquid crystal capacitance is different from the amplitude of Vda, and therefore appropriate conversions are necessary.

Figure 20A:
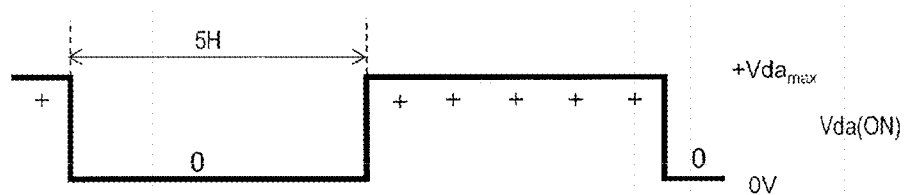
FIGS. 20A to 20E are each a diagram illustrating yet another example of a waveform of each signal used for driving the scanning antenna according to an embodiment.
Figure 20B:
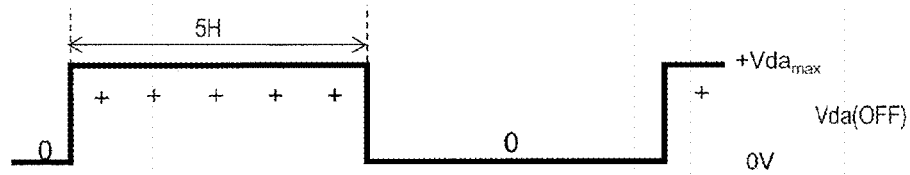
Figure 20C:
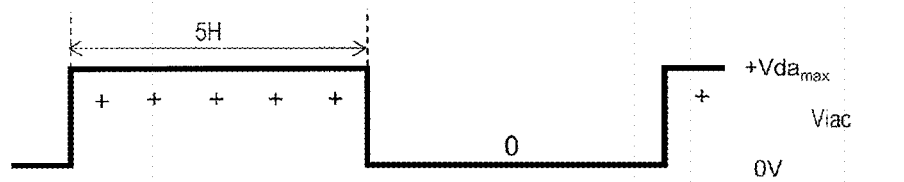

Signals such as those exemplified in FIGS. 20A to 20E can also be used. The signals illustrated in FIGS. 20A to 20E are the same as the signals illustrated in FIGS. 19A to 19E in that the voltage Viac of the slot electrode is an oscillation voltage such that the oscillation phase thereof is shifted by 180° from the oscillation phase of the data signal Vda (ON) as illustrated in FIG. 20C. However, as illustrated in each of FIGS. 20A to 20C, all of the data signals Vda (ON), Vda (OFF) and the slot voltage Viac are voltages oscillating between 0 V and a positive voltage. The amplitude of the voltage Viac of the slot electrode is equal to the maximum value $|Vda_{max}|$ of the amplitude of the data signal Vda.

Figure 20D:
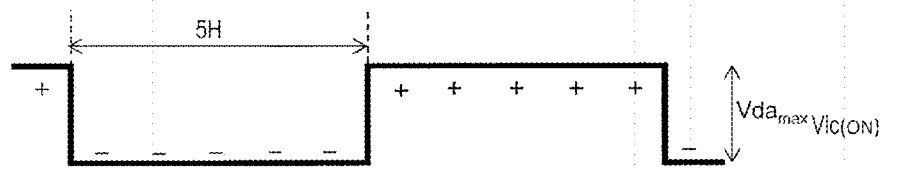

When such a signal is utilized, the driving circuit only needs to output a positive voltage, which contributes to cost reduction. As described above, even in a case where a voltage oscillating between 0 V and a positive voltage is used, as illustrated in FIG. 20D, the polarity of the voltage Vlc (ON) applied to the liquid crystal capacitance is inverted. In the voltage waveform illustrated in FIG. 20D, + (positive) indicates that the voltage of the patch electrode is higher than the slot voltage, and − (negative) indicates that the voltage of the patch electrode is lower than the slot voltage. That is, the direction (polarity) of the electric field applied to the liquid crystal layer is inverted similarly to the other examples. The amplitude of the voltage Vlc (ON) applied to the liquid crystal capacitance is $Vda_{max}$.

Figure 20E:

Note that, as illustrated in FIG. 20E, to make the voltage Vlc (OFF) applied to the liquid crystal capacitance of each antenna unit zero, as illustrated in FIG. 20B, it may be preferable for the data signal Vda (OFF) to have the same waveform as that of the slot voltage Viac.

The driving method described with reference to FIGS. 19A to 19E and FIGS. 20A to 20E of oscillating (inverting) the voltage Viac of the slot electrodes corresponds to a driving method of inverting the counter voltage in the driving method of the LCD panels (sometimes referred to as a "common inversion drive"). In the LCD panels, since the flicker cannot be sufficiently suppressed, the common inversion drive is not utilized. In contrast, in the scanning antennas, since the flicker does not matter, the slot voltage can be inverted. Oscillation (inversion) is performed in each frame, for example (the 5H in FIGS. 19A to 19E and FIGS. 20A to 20E is set to 1 V (vertical scanning period or frame)).

In the above description, although an example of the voltage Viac of the slot electrode is described in which one voltage is applied; that is, an example in which a common slot electrode is provided for all patch electrodes, the slot electrode may be divided corresponding to one row or two or more rows of the patch electrode. Here, a row refers to a set of patch electrodes connected to one gate bus line with a TFT therebetween. By dividing the slot electrode into a plurality of row portions in this way, the polarities of the voltages of the respective portions of the slot electrode can be made independent from each other. For example, in a freely-selected frame, the polarity of the voltage applied to the patch electrodes can be inverted between the patch electrodes connected to adjacent gate bus lines. In this way, it is possible to perform row inversion in which the polarity is inverted not only for each single row (1H inversion) of the patch electrode, but also m row inversion (mH inversion) in which the polarity is inverted for every two or more rows. Of course, row inversion and frame inversion can be combined.

From the viewpoint of simplicity of driving, it is preferable that the polarity of the voltage applied to the patch electrode be the same in any frame, and the polarity be inverted every frame.

Example of Antenna Unit Array and Connection of Gate Bus Line and Source Bus Line In the scanning antenna according to the embodiments of the disclosure, the antenna units are arranged concentrically, for example.

For example, in a case where the antenna units are arranged in m concentric circles, one gate bus line is provided for each circle, for example, such that a total of m gate bus lines is provided. For example, assuming that the outer diameter of the transmission and/or reception region R1 is 800 mm, m is 200, for example. Assuming that the innermost gate bus line is the first one, n (30, for example) antenna units are connected to the first gate bus line and nx (620, for example) antenna units are connected to the m-th gate bus line.

In such an arrangement, the number of antenna units connected to each gate bus line is different. In addition, although m antenna units are connected to a number n of the source bus lines that are also connected to the antenna units constituting the innermost circle, among the nx number of source bus lines connected to nx number antenna units that constitute the outermost circle, the number of antenna units connected to other source bus lines is less than m.

In this way, the arrangement of antenna units in the scanning antenna is different from the arrangement of pixels (dots) in the LCD panel, and the number of connected antenna units differs depending on the gate bus line and/or source bus line. Accordingly, in a case where the capacitances (liquid crystal capacitances+auxiliary capacitances) of all the antenna units are set to be the same, depending on the gate bus line and/or the source bus line, the electrical loads of the antenna units connected thereto differ. In such a case, there is a problem where variations occur in the writing of the voltage to the antenna unit.

Accordingly, to prevent this, the capacitance value of the auxiliary capacitance is preferably adjusted, or the number of antenna units connected to the gate bus line and/or the source bus line is preferably adjusted, for example, to make the electrical loads of the antenna units connected to the gate bus lines and the source bus lines substantially the same.

Fourth Embodiment

The TFT substrate used for the scanning antenna of the present embodiment includes a source-gate connection section in the non-transmission and/or reception region. The source-gate connection section electrically connects each source bus line to a connection wiring line (also referred to as a "source lower connection wiring line" in some cases) formed in the gate metal layer.

Hereinafter, a description is given of a TFT substrate 105 in the present embodiment with reference to FIG. 21A to FIG. 23C.

FIGS. 21A to 21C are schematic plan views illustrating the TFT substrate 105 in the present embodiment.

The TFT substrate 105 includes the transmission and/or reception region R1 in which a plurality of antenna unit regions U are arranged, and the non-transmission and/or reception region R2 provided with the terminal section and the like. The non-transmission and/or reception region R2 includes the seal region Rs provided surrounding the transmission and/or reception region R1. The seal region Rs is located between a terminal section region in which the terminal section is disposed and the transmission and/or reception region R1, for example.

FIG. 21A illustrates the antenna unit region U in the transmission and/or reception region R1, FIG. 21B illustrates the transfer terminal section PT, the gate terminal section GT, and the CS terminal section CT provided in the non-transmission and/or reception region R2, and FIG. 21C illustrates the source-gate connection section SG and the source terminal section ST provided in the non-transmission and/or reception region R2. The transfer terminal section (also referred to as the "transfer section") PT includes a first transfer terminal section PT1 located in the seal region Rs and a second transfer terminal section PT2 provided outside the seal region Rs (on a side where the liquid crystal layer is not present). In this example, the first transfer terminal section PT1 extends along the seal region Rs to surround the transmission and/or reception region R1.

In general, the gate terminal section GT and the source terminal section ST are provided for each gate bus line and for each source bus line, respectively. The source-gate connection section SG is provided corresponding to each source bus line, in general. FIG. 21B illustrates the CS terminal section CT and the second transfer terminal section PT2 aligned with the gate terminal section GT, but the number and arrangement of CS terminal sections CT and second transfer terminal sections PT2 are configured independently from the gate terminal section GT. Typically, the number of CS terminal sections CT and second transfer terminal sections PT2 are less than the number of gate terminal sections GT and are adequately configured in consideration of uniformity of voltages of the CS electrode and the slot electrode. The second transfer terminal section PT2 can be omitted in a case that the first transfer terminal section PT1 is formed.

Each CS terminal section CT is provided corresponding to each CS bus line, for example. Each CS terminal section CT may be provided corresponding to a plurality of CS bus lines. For example, in a case where each CS bus line is supplied with the same voltage as the slot voltage, the TFT substrate 105 may include at least one CS terminal section CT. However, in order to decrease a wiring line resistance, the TFT substrate 105 preferably include a plurality of CS terminal sections CT. The slot voltage is a ground potential, for example. In the case that the CS bus line is supplied with the same voltage as the slot voltage, either the CS terminal section CT or the second transfer terminal section PT2 can be omitted.

Figures 23A, 23B:
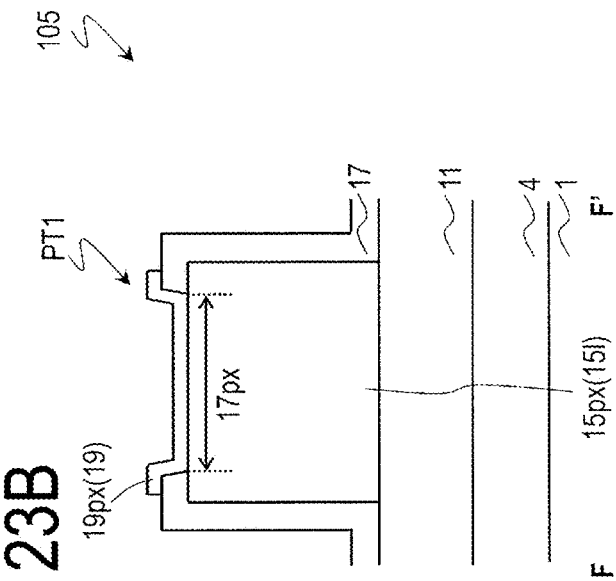
FIGS. 23A to 23C are schematic cross-sectional views of the TFT substrate 105.
Figure 23C:
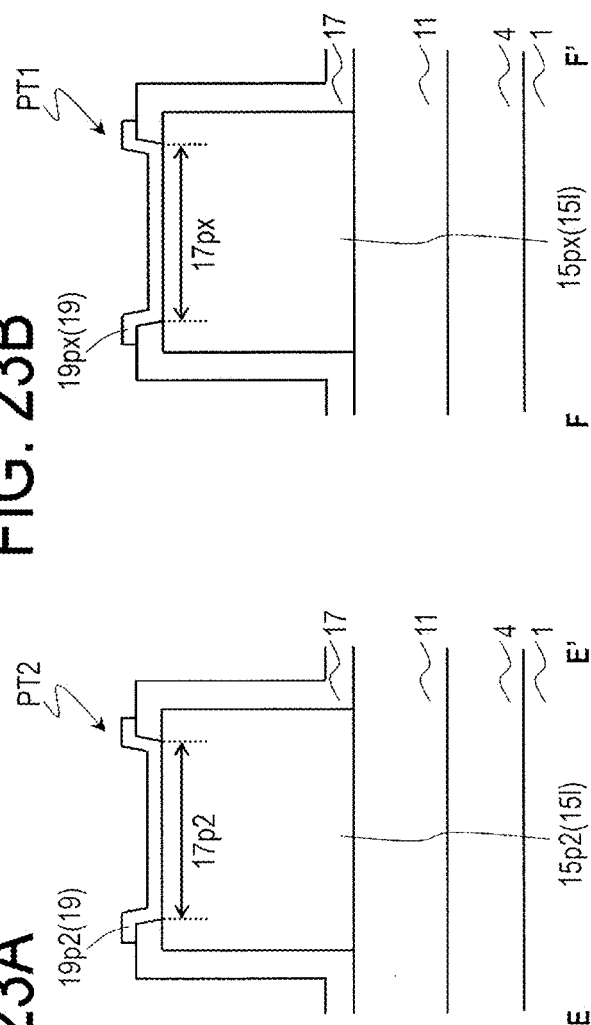

Each of FIGS. 22A to 22D and FIGS. 23A to 23C is a schematic cross-sectional view of the TFT substrate 105. FIG. 22A illustrates a cross-section of the antenna unit region U along a line A-A' in FIG. 21A, FIG. 22B illustrates a cross-section of the first transfer terminal section PT1 along a line B-B' in FIG. 21B, FIG. 22C illustrates a cross-section of the source-gate connection section SG along a line C-C' in FIG. 21C, FIG. 22D illustrates a cross-section of the source terminal section ST along a line D-D' in FIG. 21C, FIG. 23A illustrates a cross-section of the second transfer terminal section PT2 along a line E-E' in FIG. 21B, FIG. 23B illustrates a cross-section of the first transfer terminal section PT1 along a line F-F' in FIG. 21B, and FIG. 23C illustrates cross-sections of the source-gate connection section SG and the source terminal section ST along a line G-G' in FIG. 21C.

Antenna Unit Region U

As illustrated in FIG. 21A and FIG. 22A, each antenna unit region U in the TFT substrate 105 includes the TFT 10 and the patch electrode 15 electrically connected to the drain electrode 7D of the TFT 10.

The TFT substrate 105 includes a gate metal layer 3 supported by the dielectric substrate 1, the gate insulating layer 4 formed on the gate metal layer 3, a source metal layer 7 formed on the gate insulating layer 4, the first insulating layer 11 formed on the source metal layer 7, a patch metal layer 151 formed on the first insulating layer 11, the second insulating layer 17 formed on the patch metal layer 151, and an upper conductive layer 19 formed on the second insulating layer 17, as illustrated in FIG. 21A to FIG. 23. The TFT substrate 105 further includes a lower conductive layer 13 formed between the first insulating layer 11 and the patch metal layer 151.

The TFT 10 includes the gate electrode 3G, the island-shaped semiconductor layer 5, the contact layers 6S and 6D, the gate insulating layer 4 disposed between the gate electrode 3G and the semiconductor layer 5, and the source electrode 7S and the drain electrode 7D. The gate electrode 3G and the source electrode 7S of each TFT 10 are connected to the gate bus line GL and the source bus line SL, respectively. A configuration of the TFT 10 is the same as the configuration described above with reference to FIGS. 3A and 3B and the like.

The structure of the TFT substrate 105 in the antenna unit region U will be described in detail.

The gate metal layer 3 includes the gate electrode 3G of the TFT 10 and the gate bus line GL.

The gate insulating layer 4 is formed to cover the gate electrode 3G and the gate bus line GL.

The source metal layer 7 includes the source electrode 7S and drain electrode 7D of the TFT 10, and the source bus line SL.

The first insulating layer 11 is formed to cover the TFT 10. The first insulating layer 11 includes an opening 11x that at least reaches the drain electrode 7D or a portion extending from the drain electrode 7D.

The lower conductive layer 13 includes a connection section 13x formed on the first insulating layer 11 and within the opening 11x. The connection section 13x is connected to the drain electrode 7D or the portion extending from the drain electrode 7D within the opening 11x. For example, here, the connection section 13x is in contact with the portion extending from the drain electrode 7D within the opening 11x.

The patch metal layer 151 includes the patch electrode 15 and a connection section 15x. The connection section 15x is formed on the connection section 13x and electrically connected to the connection section 13x. For example, here, the connection section 15x is formed to be in direct contact with the connection section 13x. In this example, the patch electrode 15 is electrically connected to the drain electrode 7D via the connection section 13x and the connection section 15x.

The second insulating layer 17 is formed to cover the patch electrode 15 and the connection section 15x.

In this example, the antenna unit region U does not include a conductive portion included in the upper conductive layer 19.

The lower conductive layer 13 includes, for example, an oxide conductive layer (for example, ITO layer).

The patch metal layer 151 has a layered structure including a low resistance metal layer and a high melting-point metal containing layer under the low resistance metal layer. The patch metal layer 151 may further include a high melting-point metal containing layer over the low resistance metal layer. The "high melting-point metal containing layer" is a layer containing at least one element selected from the group including titanium (Ti), tungsten (W), molybdenum (Mo), tantalum (Ta), and niobium (Nb). The "high melting-point metal containing layer" may have a layered structure. For example, the high melting-point metal containing layer refers to a layer formed of any of Ti, W, Mo, Ta, Nb, an alloy containing these, and a nitride of these, and a solid solution of the above metal(s) or alloy and the nitride. The "low resistance metal layer" is a layer containing at least one element selected from the group including copper (Cu), aluminum (Al), silver (Ag), and gold (Au). The "low resistance metal layer" may have a layered structure. The low resistance metal layer of the patch metal layer 151 may be referred to as a "main layer", and the high melting-point metal containing layers under and over the low resistance metal layer may be referred to as a "lower layer" and an "upper layer", respectively.

For example, the patch metal layer 151 has a layered structure (Cu/Ti) including a Ti layer (having a thickness of 20 nm, for example) and a Cu layer (having a thickness of 500 nm, for example) in this order. Alternatively, the patch metal layer 151 may have a layered structure (MoN/Al/MoN) formed by layering a MoN layer (having a thickness of 50 nm, for example), an Al layer (having a thickness of 1000 nm, for example), and a MoN layer (having a thickness of 50 nm, for example) in this order.

Each antenna unit region may have an auxiliary capacity electrically connected in parallel with the liquid crystal capacitance. In this example, the auxiliary capacity is configured by an upper auxiliary capacitance electrode 7C electrically connected to the drain electrode 7D, the gate insulating layer 4, and a lower auxiliary capacitance electrode 3C opposite to the upper auxiliary capacitance electrode 7C with the gate insulating layer 4 interposed therebetween. The lower auxiliary capacitance electrode 3C is included in the gate metal layer 3 and the upper auxiliary capacitance electrode 7C is included in the source metal layer 7. The gate metal layer 3 further includes the CS bus line (auxiliary capacitance line) CL connected to the lower auxiliary capacitance electrode 3C. The CS bus line CL extends substantially in parallel with the gate bus line GL, for example. In this example, the lower auxiliary capacitance electrode 3C is formed integrally with the CS bus line CL. A width of the lower auxiliary capacitance electrode 3C may be larger than a width of the CS bus line CL. In this example, the upper auxiliary capacitance electrode 7C extends from the drain electrode 7D. A width of the upper auxiliary capacitance electrode 7C may be larger than a width of a portion extending from the drain electrode 7D except for the upper auxiliary capacitance electrode 7C. Note that an arrangement relationship between the auxiliary capacity and the patch electrode 15 is not limited to the example illustrated in the drawing.

Source-Gate Connection Section SG

The TFT substrate 105 includes the source-gate connection section SG in the non-transmission and/or reception region R2 as illustrated in FIG. 21C. The source-gate connection section SG is provided for each source bus line SL, in general. The source-gate connection section SG electrically connects each source bus line SL to a connection wiring line (also referred to as a "source lower connection wiring line" in some cases) formed in the gate metal layer 3.

As illustrated in FIG. 21C, FIG. 22C, and FIG. 23C, the source-gate connection section SG includes a source lower connection wiring line 3sg, an opening 4sg1 formed in the gate insulating layer 4, a source bus connection section 7sg, an opening 11sg1 and opening 11sg2 formed in the first insulating layer 11, and a source bus line upper connection section 13sg.

The source lower connection wiring line 3sg is included in the gate metal layer 3 and electrically separate from the gate bus line GL.

The opening 4sg1 formed in the gate insulating layer 4 at least reaches the source lower connection wiring line 3sg.

The source bus line connection section 7sg is included in the source metal layer 7 and electrically connected to the source bus line SL. In this example, the source bus line connection section 7sg extends from the source bus line SL and is formed integrally with the source bus line SL. A width of the source bus line connection section 7sg may be larger than a width of the source bus line SL.

The opening 11sg1 formed in the first insulating layer 11 overlaps the opening 4sg1 formed in the gate insulating layer 4 when viewed from the normal direction of the dielectric substrate 1. The opening 4sg1 formed in the gate insulating layer 4 and the opening 11sg1 formed in the first insulating layer 11 constitute a contact hole CH_sgx1.

The opening 11sg2 formed in the first insulating layer 11 at least reaches the source bus line connection section 7sg. The opening 11sg2 may be referred to as a contact hole CH_sgx2.

The source bus line upper connection section 13sg (also simply referred to as an "upper connection section 13sg") is included in the lower conductive layer 13. The upper connection section 13sg is formed on the first insulating layer 11, within the contact hole CH_sgx1, and within the contact hole CH_sgx2, is connected to the source lower connection wiring line 3sg within the contact hole CH_sgx1, and is connected to the source bus line connection section 7sg within the contact hole CH_sgx2. For example, here, the upper connection section 13sg is in contact with the source lower connection wiring line 3sg within the opening 4sg1 formed in the gate insulating layer 4, and in contact with the source bus line connection section 7sg within the opening 11sg2 formed in the first insulating layer 11.

A portion of the source lower connection wiring line 3sg exposed by the opening 4sg1 is preferably covered by the upper connection section 13sg. A portion of the source bus line connection section 7sg exposed by the opening 11sg2 is preferably covered by the upper connection section 13sg.

In this example, the source-gate connection section SG does not include the conductive portion included in the patch metal layer 151 and the conductive portion included in the upper conductive layer 19.

The TFT substrate 105 has an excellent actional stability because of including the upper connection section 13sg in the source-gate connection section SG. Because the source-gate connection section SG includes the upper connection section 13sg, damages to the gate metal layer 3 and/or source metal layer 7 in a process of etching a patch conductive film for forming the patch metal layer 151 are reduced. A description is given of these effects.

As describe above, in the TFT substrate 105, the source-gate connection section SG does not include the conductive portion included in the patch metal layer 151. Specifically, the patch conductive film in a source-gate connection section formation region is removed in a process of patterning the patch conductive film. In a case where the source-gate connection section SG does not include the upper connection section 13sg, the gate metal layer 3 (the source lower connection wiring line 3sg) is exposed within the contact hole CH_sgx1, so that the patch conductive film to be removed is deposited within the contact hole CH_sgx1 and formed in contact with the source lower connection wiring line 3sg. Similarly, in a case where the source-gate connection section SG does not include the upper connection section 13sg, the source metal layer 7 (the source bus line connection section 7sg) is exposed within the contact hole CH_sgx2, so that the patch conductive film to be removed is deposited within the contact hole CH_sgx2 and formed in contact with the source bus line connection section 7sg. In such a case, the gate metal layer 3 and/or the source metal layer 7 may suffer an etching damage. In the process of patterning the patch conductive film, for example, an etching solution containing phosphoric acid, nitric acid, and acetic acid is used. In a case where the source lower connection wiring line 3sg and/or the source bus line connection section 7sg suffer the etching damage, a contact failure may occur in the source-gate connection section SG.

The source-gate connection section SG of the TFT substrate 105 includes the upper connection section 13sg formed within the contact hole CH_sgx1 and the contact hole CH_sgx2. Therefore, the damage to the source lower connection wiring line 3sg and/or the source bus line connection section 7sg caused by the etching in the process of patterning the patch conductive film is reduced. Accordingly, the TFT substrate 105 is excellent in the actional stability.

From the viewpoint of effectively reducing the etching damage to the gate metal layer 3 and/or the source metal layer 7, it is preferable that a portion of the source lower connection wiring line 3sg exposed by the contact hole CH_sgx1 is covered by the upper connection section 13sg, and a portion of the source bus line connection section 7sg exposed by the opening 11sg2 is covered by the upper connection section 13sg.

In the TFT substrate used for the scanning antenna, a relatively thick conductive film (patch conductive film) may be used to form the patch electrode. In this case, a time for etching and a time for overetching of the patch conductive film may be longer than for the etching process of other layers. In this situation, in a case where the gate metal layer 3 (the source lower connection wiring line 3sg) and the source metal layer 7 (the source bus line connection section 7sg) are exposed within the contact hole CH_sgx1 and within the contact hole CH_sgx2, the etching damage to these metal layers is heavy. As described above, in the TFT substrate including the relatively thick patch metal layer, the effect of reducing the etching damage to the gate metal layer 3 and/or source metal layer 7 is particularly profound because the source-gate connection section SG includes the upper connection section 13sg.

The upper conductive layer 19 includes, for example, a transparent conductive layer (for example, ITO layer). The upper conductive layer 19 may be formed of only a transparent conductive layer, for example. Alternatively, the upper conductive layer 19 may include a first conductive layer including a transparent conductive layer and a second conductive layer formed under the first conductive layer. The second conductive layer is formed of one layer or two or more layers selected from the group including Ti layer, MoNbNi layer, MoNb layer, MoW layer, W layer and Ta layer, for example.

In the illustrated example, the contact hole CH_sgx2 is formed at a position away from the contact hole CH_sgx1. The present embodiment is not limited to the illustrated example, and the contact hole CH_sgx1 and the contact hole CH_sgx2 may be contiguous to each other (that is, may be formed as a single contact hole). The contact hole CH_sgx1 and the contact hole CH_sgx2 may be formed as a single contact hole in the same process. Specifically, a single contact hole that reaches at least the source lower connection wiring line 3sg and source bus line connection section 7sg may be formed in the gate insulating layer 4 and first insulating layer 11 to form the upper connection section 13sg within this contact hole and on the first insulating layer 11. At this time, the upper connection section 13sg is preferably formed to cover a portion of the source lower connection wiring line 3sg and source bus line connection section 7sg exposed by the contact hole.

The lower connection section of the source terminal section ST can be formed of the gate metal layer 3 by providing the source-gate connection section SG as described later. The source terminal section ST including the lower connection section formed of the gate metal layer 3 is excellent in reliability.

Source Terminal Section ST

The TFT substrate 105 includes the source terminal section ST in the non-transmission and/or reception region R2 as illustrated in FIG. 21C. The source terminal section ST is provided corresponding to each source bus line SL, in general. Here, the source terminal section ST and the source-gate connection section SG are provided corresponding to each source bus line SL.

The source terminal section ST includes a source terminal lower connection section 3sA (also simply referred to as a "lower connection section 3sA") connected to the source lower connection wiring line 3sg formed in the source-gate connection section SG, an opening 4s formed in the gate insulating layer 4, an opening 11s formed in the first insulating layer 11, an opening 17s formed in the second insulating layer 17, and a source terminal upper connection section 19sA (also simply referred to as an "upper connection section 19sA") as illustrated in FIG. 21C, FIG. 22D, and FIG. 23C.

The lower connection section 3sA is included in the gate metal layer 3. The lower connection section 3sA is electrically connected to the source lower connection wiring line 3sg formed in the source-gate connection section SG. In this example, the lower connection section 3sA extends from the source lower connection wiring line 3sg and is formed integrally with the source lower connection wiring line 3sg.

The opening 4s formed in the gate insulating layer 4 at least reaches the lower connection section 3sA.

The opening 11s formed in the first insulating layer 11 overlaps the opening 4s formed in the gate insulating layer 4 when viewed from the normal direction of the dielectric substrate 1.

The opening 17s formed in the second insulating layer 17 overlaps the opening 11s formed in the first insulating layer 11 when viewed from the normal direction of the dielectric substrate 1. The opening 4s formed in the gate insulating layer 4, the opening 11s formed in the first insulating layer 11, and the opening 17s formed in the second insulating layer 17 constitute a contact hole CH_s.

The upper connection section 19sA is included in the upper conductive layer 19. The upper connection section 19sA is formed on the second insulating layer 17 and within the contact hole CH_s, and is connected to the lower connection section 3sA within the contact hole CH_s. Here, the upper connection section 19sA is in contact with the lower connection section 3sA within the opening 4s formed in the gate insulating layer 4.

An entire of the upper connection section 19sA may overlap the lower connection section 3sA when viewed from the normal direction of the dielectric substrate 1.

In this example, the source terminal section ST does not include the conductive portion included in the source metal layer 7, the conductive portion included in the lower conductive layer 13, and the conductive portion included in the patch metal layer 151.

The source terminal section ST which includes the lower connection section 3sA included in the gate metal layer 3 has excellent reliability.

In the terminal section, particularly, the terminal section provided outside the seal region Rs (opposite to the liquid crystal layer), corrosion may occur due to atmospheric moisture (which may contain impurities). The atmospheric moisture intrudes from the contact hole at least reaching the lower connection section and at least reaches the lower connection section so that corrosion may occur in the lower connection section. From the viewpoint of suppressing the corrosion occurring, the contact hole that at least reaches the lower connection section is preferably deep. In other words, the thickness of the insulating layer where the opening constituting the contact hole is formed is preferably large.

In a process of fabricating a TFT substrate including a glass substrate as a dielectric substrate, broken pieces or chips (cullets) of the glass substrate may cause scratches or disconnection in the lower connection section of the terminal section. For example, a plurality of TFT substrates are fabricated from one mother substrate. The cullet is generated in cutting the mother substrate or in forming scribe lines in the mother substrate, for example. From the viewpoint of preventing the scratches and disconnection in the lower connection section of the terminal section, the contact hole that at least reaches the lower connection section is preferably deep. In other words, the thickness of the insulating layer where the opening constituting the contact hole is formed is preferably large.

In the source terminal section ST of the TFT substrate 105, since the lower connection section 3sA is included in the gate metal layer 3, the contact hole CH_s that at least reaches the lower connection section 3sA includes the opening 4s formed in the gate insulating layer 4, the opening 11s formed in the first insulating layer 11, and the opening 17s formed in the second insulating layer 17. A depth of the contact hole CH_s is a sum of a thickness of the gate insulating layer 4, a thickness of the first insulating layer 11, and a thickness of the second insulating layer 17. In contrast, in a case where the lower connection section is included in the source metal layer 7, for example, the contact hole that at least reaches the lower connection section includes only an opening formed in the first insulating layer 11 and an opening formed in the second insulating layer 17, and a depth thereof is a sum of the thickness of the first insulating layer 11 and the thickness of the second insulating layer 17 and is smaller than the depth of the contact hole CH_s. Here, the depth of the contact hole and the thickness of the insulating layer are respectively a depth and a thickness in the normal direction of the dielectric substrate 1. The same holds for other contact holes and insulating layers unless otherwise specifically described. In this way, the source terminal section ST of the TFT substrate 105 includes the lower connection section 3s included in the gate metal layer 3, and therefore, has excellent reliability as compared with the case that the lower connection section is included in the source metal layer 7, for example.

The opening 4s formed in the gate insulating layer 4 is formed to expose only a portion of the lower connection section 3s. The opening 4s formed in the gate insulating layer 4 is inside the lower connection section 3s when viewed from the normal direction of the dielectric substrate 1. Therefore, the entire region within the opening 4s has a layered structure including the lower connection section 3s and the upper connection section 19s on the dielectric substrate 1. In the source terminal section ST, the entire region not including the lower connection section 3s has a layered structure including the gate insulating layer 4, the first insulating layer 11, and the second insulating layer 17. With this configuration, the source terminal section ST of the TFT substrate 105 has excellent reliability. From the viewpoint of obtaining the excellent reliability, the sum of the thicknesses of the gate insulating layer 4, the thickness of the first insulating layer 11, and the thickness of the second insulating layer 17 is preferably large.

A portion of the lower connection section 3s exposed by the opening 4s is covered by the upper connection section 19s.

In a case where a thickness of the upper connection section of the terminal section is large (that is, a thickness of the upper conductive layer 19 is large), corrosion of the lower connection section is suppressed. In order to effectively suppress the corrosion of the lower connection section, the upper conductive layer 19 may have the layered structure including the first conductive layer including the transparent conductive layer (for example, ITO layer), and the second conductive layer formed under the first conductive layer and formed of one layer or two or more layers selected from the group including Ti layer, MoNbNi layer, MoNb layer, MoW layer, W layer and Ta layer, as described above. In order to effectively suppress the corrosion of the lower connection section, the thickness of the second conductive layer may be over 100 nm, for example.

Gate Terminal Section GT

The TFT substrate 105 includes the gate terminal section GT in the non-transmission and/or reception region R2 as illustrated in FIG. 21B. The gate terminal section GT may have the same configuration as the source terminal section ST as illustrated in FIG. 21B. The gate terminal section GT is provided for each gate bus line GL, in general.

As illustrated in FIG. 21B, in this example, the gate terminal section GT includes a gate terminal lower connection section 3gA (also simply referred to as a "lower connection section 3gA"), an opening 4g formed in the gate insulating layer 4, an opening 11g formed in the first insulating layer 11, an opening 17g formed in the second insulating layer 17, and a gate terminal upper connection section 19gA (also simply referred to as an "upper connection section 19gA").

The lower connection section 3gA is included in the gate metal layer 3 and electrically connected to the gate bus line GL. In this example, the lower connection section 3gA extends from the gate bus line GL and is formed integrally with the gate bus line GL.

The opening 4g formed in the gate insulating layer 4 at least reaches the lower connection section 3gA.

The opening 11g formed in the first insulating layer 11 overlaps the opening 4g formed in the gate insulating layer 4 when viewed from the normal direction of the dielectric substrate 1.

The opening 17g formed in the second insulating layer 17 overlaps the opening 11g formed in the first insulating layer 11 when viewed from the normal direction of the dielectric substrate 1. The opening 4g formed in the gate insulating layer 4, the opening 11g formed in the first insulating layer 11, and the opening 17g formed in the second insulating layer 17 constitute a contact hole CH_g.

The upper connection section 19gA is included in the upper conductive layer 19. The upper connection section 19gA is formed on the second insulating layer 17 and within the contact hole CH_g, and is connected to the lower connection section 3gA within the contact hole CH_g. For example, the upper connection section 19gA is in contact with the lower connection section 3gA within the opening 4g formed in the gate insulating layer 4.

An entire of the upper connection section 19gA may overlap the lower connection section 3gA when viewed from the normal direction of the dielectric substrate 1.

In this example, the gate terminal section GT does not include the conductive portion included in the source metal layer 7, the conductive portion included in the lower conductive layer 13, and the conductive portion included in the patch metal layer 151.

The gate terminal section GT which includes the lower connection section 3gA included in the gate metal layer 3 has excellent reliability similar to the source terminal section ST.

CS Terminal Section CT

The TFT substrate 105 includes the CS terminal section CT in the non-transmission and/or reception region R2 as illustrated in FIG. 21B. The CS terminal section CT here has the same configuration as the source terminal section ST and gate terminal section GT as illustrated in FIG. 21B. The CS terminal section CT may be provided corresponding to each CS bus line CL, for example.

As illustrated in FIG. 21B, the CS terminal section CT includes a CS terminal lower connection section 3c (also simply referred to as a "lower connection section 3c"), an opening 4c formed in the gate insulating layer 4, an opening 11c formed in the first insulating layer 11, an opening 17c formed in the second insulating layer 17, and a CS terminal upper connection section 19c (also simply referred to as an "upper connection section 19c").

The lower connection section 3c is included in the gate metal layer 3. The lower connection section 3c is electrically connected to the CS bus line CL. In this example, the lower connection section 3c extends from the CS bus line CL and is formed integrally with the CS bus line CL.

The opening 4c formed in the gate insulating layer 4 at least reaches the lower connection section 3c.

The opening 11c formed in the first insulating layer 11 overlaps the opening 4c formed in the gate insulating layer 4 when viewed from the normal direction of the dielectric substrate 1.

The opening 17c formed in the second insulating layer 17 overlaps the opening 11c formed in the first insulating layer 11 when viewed from the normal direction of the dielectric substrate 1. The opening 4c formed in the gate insulating layer 4, the opening 11c formed in the first insulating layer 11, and the opening 17c formed in the second insulating layer 17 constitute a contact hole CH_c.

The upper connection section 19c is included in the upper conductive layer 19. The upper connection section 19c is formed on the second insulating layer 17 and within the contact hole CH_c, and is connected to the lower connection section 3c within the contact hole CH_c. For example, the upper connection section 19c is in contact with the lower connection section 3c within the opening 4c formed in the gate insulating layer 4.

An entire of the upper connection section 19c may overlap the lower connection section 3c when viewed from the normal direction of the dielectric substrate 1.

In this example, the CS terminal section CT does not include the conductive portion included in the source metal layer 7, the conductive portion included in the lower conductive layer 13, and the conductive portion included in the patch metal layer 151.

The CS terminal section CT which includes the lower connection section 3c included in the gate metal layer 3 has excellent reliability similar to the source terminal section ST.

Transfer Terminal Section PT

The TFT substrate 105 includes the first transfer terminal section PT1 in the non-transmission and/or reception region R2 as illustrated in FIG. 21B. The first transfer terminal section PT1 is provided in the seal region Rs, here (that is, the first transfer terminal section PT1 is provided in the sealing portion surrounding the liquid crystal layer).

The first transfer terminal section PT1 includes a first transfer terminal lower connection section 3px (also simply referred to as a "lower connection section 3px"), an opening 4px formed in the gate insulating layer 4, an opening 11px formed in the first insulating layer 11, a first conductive portion for first transfer terminal 13px (also simply referred to as a "first conductive portion 13px"), a second conductive portion for first transfer terminal 15px (also simply referred to as a "second conductive portion 15px"), an opening 17px formed in the second insulating layer 17, and a first transfer terminal upper connection section 19px (also simply referred to as an "upper connection section 19px") as illustrated in FIG. 21B and FIG. 22B.

The lower connection section 3px is included in the gate metal layer 3. That is, the lower connection section 3px is formed of the same conductive film as that of the gate bus line GL. The lower connection section 3px is electrically separate from the gate bus line GL. For example, in a case where the CS bus line CL is supplied with the same voltage as the slog voltage, the lower connection section 3px is electrically connected to, for example, the CS bus line CL. As is illustrated, the lower connection section 3px may extend from the CS bus line. However, the lower connection section 3px is not limited to the illustrated example and may be electrically separate from the CS bus line.

The opening 4px formed in the gate insulating layer 4 at least reaches the lower connection section 3px.

The opening 11px formed in the first insulating layer 11 overlaps the opening 4px formed in the gate insulating layer 4 when viewed from the normal direction of the dielectric substrate 1. The opening 4px formed in the gate insulating layer 4 and the opening 11px formed in the first insulating layer 11 constitute a contact hole CH_px.

The first conductive portion 13px is included in the lower conductive layer 13. The first conductive portion 13px is formed on the first insulating layer 11 and within the contact hole CH_px, and is connected to the lower connection section 3px within the contact hole CH_px. Here, the first conductive portion 13px is in contact with the lower connection section 3px within the opening 4px.

The second conductive portion 15px is included in the patch metal layer 151. The second conductive portion 15px is formed on the first conductive portion 13px. The second conductive portion 15px is electrically connected to the first conductive portion 13px. For example, here, the second conductive portion 15px is in direct contact with the first conductive portion 13px.

The opening (contact hole) 17px formed in the second insulating layer 17 at least reaches the second conductive portion 15px.

The upper connection section 19px is included in the upper conductive layer 19. The upper connection section 19px is formed on the second insulating layer 17 and within the opening 17px, and is connected to the second conductive portion 15px within the opening 17px. Here, the upper connection section 19px is in contact with the second conductive portion 15px within the opening 17px. The upper connection section 19px is connected to a transfer terminal connection section on the slot substrate side by a sealing member containing conductive particles, for example (see FIG. 7).

In this example, the first transfer terminal section PT1 does not include the conductive portion included in the source metal layer 7.

The first transfer terminal section PT1 includes the first conductive portion 13px and second conductive portion 15px between the lower connection section 3px and the upper connection section 19px. This allows the first transfer terminal section PT1 to have an advantage that an electric resistance between the lower connection section 3px and the upper connection section 19px is low.

An entire of the upper connection section 19px may overlap the second conductive portion 15px when viewed from the normal direction of the dielectric substrate 1.

In this example, the lower connection section 3px is disposed between two gate bus lines GL adjacent to each other. Two lower connection sections 3px disposed with the gate bus line GL being interposed therebetween may be electrically connected to each other via a conductive connection section (not illustrated). The conductive connection section may be formed of the same conductive film as that of the source bus line, for example.

Here, a plurality of contact holes CH_px are provided so that the lower connection section 3px is connected to the upper conductive portion 19px with the first conductive portion 13px and second conductive portion 15px interposed therebetween, but one or more contact holes CH_px may be provided to one lower connection section 3px. One contact hole may be provided to one lower connection section 3px. The number of contact holes or the shapes thereof are not limited to the illustrated example.

Here, although the first conductive portion 13px is formed to overlap the respective contact holes CH_px, the shape of the first conductive portion 13px is not limited thereto. The first conductive portion may be formed to overlap a plurality of contact holes CH_px.

Here, the upper connection section 19px is connected to the first conductive portion 13px and second conductive portion 15px through one opening 17px, but one or more openings 17px may be provided to one upper connection section 19px. A plurality of openings may be provided to one upper connection section 19px. The number of openings or the shapes thereof are not limited to the illustrated example.

The second transfer terminal section PT2 is provided outside the seal region Rs (opposite to the transmission and/or reception region R1). The second transfer terminal section PT2 includes a second transfer terminal lower connection section 15p2 (also simply referred to as a "lower connection section 15p2"), an opening 17p2 formed in the second insulating layer 17, and a second transfer terminal upper connection section 19p2 (also simply referred to as an "upper connection section 19p2") as illustrated in FIG. 21B and FIG. 23A.

The second transfer terminal section PT2 has a cross-sectional structure the same as a portion of the first transfer terminal section PT1 not including the lower connection section 3px, the contact hole CH_px, and the first conductive portion 13px (see FIG. 23B)

The lower connection section 15p2 is included in the patch metal layer 151. Here, the lower connection section 15p2 extends from the second conductive portion for first transfer terminal 15px and is formed integrally with the second conductive portion for first transfer terminal 15px.

The opening (contact hole) 17p2 formed in the second insulating layer 17 at least reaches the lower connection section 15p2.

The upper connection section 19p2 is included in the upper conductive layer 19. The upper connection section 19p2 is formed on the second insulating layer 17 and within the opening 17p2, and is connected to the lower connection section 15p2 within the opening 17p2. Here, the upper connection section 19p2 is in contact with the lower connection section 15p2 within the opening 17p2.

In this example, the second transfer terminal section PT2 does not include the conductive portion included in the gate metal layer 3, the conductive portion included in the source metal layer 7, and the conductive portion included in the lower conductive layer 13.

In the second transfer terminal section PT2 also, the upper connection section 19p2 may be connected to a transfer terminal connection section on the slot substrate side by a sealing member containing conductive particles, for example.

Fifth Embodiment

The TFT substrate used for the scanning antenna in the present embodiment is more excellent in the actional stability than the TFT substrate used for the scanning antenna in the fourth embodiment.

Hereinafter, a description is given of a TFT substrate 106 in the present embodiment with reference to FIG. 24A to FIG. 26D. The same constitutions as the TFT substrate 105 in the fourth embodiment are denoted by the same reference numerals and the descriptions thereof are omitted.

FIGS. 24A to 24C are schematic plan views of the TFT substrate 106. FIG. 24A illustrates the antenna unit region U in the transmission and/or reception region R1, FIG. 24B illustrates the transfer terminal section PT, a common-CS connection section CC, the gate terminal section GT, and the CS terminal section CT provided in the non-transmission and/or reception region R2, and FIG. 24C illustrates the source-gate connection section SG and the source terminal section ST provided in the non-transmission and/or reception region R2.

Each of FIGS. 25A to 25D and FIGS. 26A to 26D is a schematic cross-sectional view of the TFT substrate 106. FIG. 25A illustrates a cross-section of the antenna unit region U along a line A-A' in FIG. 24A, FIG. 25B illustrates a cross-section of the first transfer terminal section PT1 along a line B-B' in FIG. 24B, FIG. 25C illustrates a cross-section of the source-gate connection section SG along a line C-C' in FIG. 24C, FIG. 25D illustrates a cross-section of the source terminal section ST along a line D-D' in FIG. 24C, FIG. 26A illustrates a cross-section of the second transfer terminal section PT2 along a line E-E' in FIG. 24B, FIG. 26B illustrates a cross-section of the first transfer terminal section PT1 along a line F-F' in FIG. 24B, FIG. 26C illustrates a cross-section of the common-CS connection section CC along a line G-G' in FIG. 24B, and FIG. 26D illustrates cross-sections of the source-gate connection section SG and the source terminal section ST along a line H-H' in FIG. 24C.

Antenna Unit Region U

The TFT substrate 106 is different from the TFT substrate 105 in the method for connecting the drain electrode 7D and the patch electrode 15.

As illustrated in FIG. 24A and FIG. 25A, in the antenna unit region U of the TFT substrate 106, the upper conductive layer 19 includes a patch drain connection section 19a which is electrically connected to the patch electrode 15 and drain electrode 7D. Specifically, the drain electrode 7D is electrically connected to the patch electrode 15 through the patch drain connection section 19a.

An example of a specific configuration is described. Here, for example, as illustrated in FIG. 24A and FIG. 25A, a contact hole CH_a is formed in the first insulating layer 11 and second insulating layer 17 to at least reach a portion extending from the drain electrode 7D. The contact hole CH_a includes an opening 11a that is formed in the first insulating layer 11 and at least reaches the portion extending from the drain electrode 7D, and an opening 17a that is formed in the second insulating layer 17 and overlaps the opening 11a when viewed from the normal direction of the dielectric substrate 1. In the second insulating layer 17, an opening 17b is also formed that at least reaches a patch connection section 15a connected to the patch electrode 15. Here, the patch connection section 15a extends from the patch electrode 15 and is formed integrally with the patch electrode 15. In this example, the TFT substrate 106 does not include the lower conductive layer 13.

The TFT substrate 106 has more excellent actional stability because of including the patch drain connection section 19a as compared with the TFT substrate 105. A description is given of these effects.

In the test production by the present inventor, the TFT substrate 105 was not sufficient in the actional stability in some cases. According to the study by the present inventor, it has been found that the direct contact between the lower conductive layer 13 (the connection section 13x) including the oxide conductive layer and the high melting-point metal containing layer (the lower layer) in the patch metal layer 151 (the connection section 15x) may cause the insufficient actional stability of the TFT substrate 105 in some cases. Oxygen elements dispersed from the lower conductive layer (for example, ITO layer) 13 oxidize metal elements (for example, Mo, in a case where the high melting-point metal containing layer is a MoN layer) contained in the high melting-point metal containing layer (the lower layer) in the patch metal layer 151. Such an oxidation reaction causes a metal oxide layer (a molybdenum oxide layer, in this case) to be formed in the high melting-point metal containing layer (the lower layer) in the patch metal layer 151 on a side closer to the lower conductive layer 13. It has been found that in a case where the metal oxide layer is generated, the contact resistance between the lower conductive layer 13 and the patch metal layer 151 increases, and thereby, a contact failure occurs between the drain electrode 7D and the patch electrode 15 which are electrically connected to each other through the connection section 13x and connection section 15x, for example.

The above oxide reaction is promoted particularly in a process of heating the lower conductive layer 13 and the patch metal layer 151 in the manufacturing process of the TFT substrate 105. For example, in a case where an insulating film for forming the second insulating layer 17 is deposited by CVD, a film formation temperature is about 230° C. However, the case that the above oxide reaction occurs is not limited to the process of heating the lower conductive layer 13 and the patch metal layer 151, and the above oxide reaction progresses at an ambient temperature also over time, for example. Therefore, the problem of the contact failure occurrence may occur, independently from the manufacturing method thereof, in a TFT substrate in which a layer containing a metal element is formed on an oxide conductive layer and in direct contact with the oxide conductive layer.

In the TFT substrate 106 according to the present embodiment, the drain electrode 7D is electrically connected to the patch electrode 15 through the patch drain connection section 19a, and thus the above problem does not occur. Therefore, the contact failure between the electrodes, the drain electrode 7D and the patch electrode 15, is suppressed. The TFT substrate 106 is more excellent in the actional stability as compared with the TFT substrate 105.

Note that in the TFT substrate 106, in a case where the upper conductive layer 19 is an ITO layer, for example, the ITO layer in the patch drain connection section 19a is in contact with the patch metal layer 151 within the opening 17b and in contact with the source metal layer 7 within the opening 11a. Specifically, the oxide conductive layer (ITO layer, here) is formed on and in direct contact with the layer containing metal elements (the patch metal layer 151 or the source metal layer 7, here). However, unlike the example of the TFT substrate 105, the oxide reaction scarcely occurs owing to the oxide conductive layer even in a case where the oxide conductive layer is formed on the layer containing metal elements. This is because after the layer containing metal elements (the patch metal layer 151 or the source metal layer 7, here) is formed, before a conductive film for forming the oxide conductive layer (the upper conductive layer 19, here) is formed on the layer containing metal elements, a surface of the layer containing metal elements is exposed to the atmosphere (caused by that a chamber is made to be open to the atmosphere, for example) so that an oxide film (also referred to as a natural oxide film or a passivation film in some cases) is formed on the surface of the layer containing metal elements. This chemically stabilizes the surface of the layer containing metal elements, so that even in a case where an oxide conductive layer is formed thereon, the oxide reaction occurring owing to the oxide conductive layer is suppressed.

Note that the natural oxide film described above is very thin (a thickness of less than 10 nm, for example), and thus effects on the contact resistance can be almost ignored. The thickness of the natural oxide film scarcely depends on a length of time while being exposed to the atmosphere and does not increase thereafter over time.

First Transfer Terminal Section PT1 and Common-CS Connection Section CC

In the TFT substrate 105, as illustrated in FIG. 22B, the high melting-point metal layer in the patch metal layer 151 (the second conductive portion 15px) is formed on and in direct contact with the lower conductive layer 13 (the first conductive portion 13px) including the oxide conductive layer also in the first transfer terminal section PT1. Therefore, in the TFT substrate 105, the contact failure may occur between the upper connection section 19px and the lower connection section 3px also in the first transfer terminal section PT1.

In contrast, the first transfer terminal section PT1 of the TFT substrate 106 does not include the conductive portion included in the lower conductive layer 13, and therefore, the contact failure is suppressed. The TFT substrate 106 is more excellent in the actional stability as compared with the TFT substrate 105.

The TFT substrate 106 includes the common-CS connection section CC in the non-transmission and/or reception region R2 as illustrated in FIG. 24B. The lower connection section 15p1 is electrically connected to the CS bus line CL because of including the common-CS connection section CC. Specifically, in this example, the CS bus line CL is supplied with the same voltage as the slot voltage.

Specific configurations of the first transfer terminal section PT1 and the common-CS connection section CC are described.

The first transfer terminal section PT1 of the TFT substrate 106 includes a first transfer terminal lower connection section 15p1 (also simply referred to as a "lower connection section 15p1"), an opening 17p1 formed in the second insulating layer 17, a first transfer terminal upper connection section 19p1 (also simply referred to as an "upper connection section 19p1") as illustrated in FIG. 24B and FIG. 25B. The first transfer terminal section PT1 of the TFT substrate 106 has a cross-section structure similar to the second transfer terminal section PT2.

The lower connection section 15p1 is included in the patch metal layer 151 and electrically connected to the CS bus line CL.

The opening (contact hole) 17p1 formed in the second insulating layer 17 at least reaches the lower connection section 15p1.

The upper connection section 19p1 is included in the upper conductive layer 19. The upper connection section 19p1 is formed on the second insulating layer 17 and within the opening 17p1, and is connected to the lower connection section 15p1 within the opening 17p1. Here, the upper connection section 19p1 is in contact with the lower connection section 15p1 within the opening 17p1.

The first transfer terminal section PT1 of the TFT substrate 106 does not include the conductive portion included in the gate metal layer 3 and the conductive portion included in the source metal layer 7.

Because of having such a configuration, the contact failure occurring between the upper connection section 19p1 and the lower connection section 15p1 is suppressed in the first transfer terminal section PT1 of the TFT substrate 106.

The common-CS connection section CC includes a CS connecting lower connection section 3cc (also simply referred to as a "lower connection section 3cc"), an opening 4cc formed in the gate insulating layer 4, an opening 11cc formed in the first insulating layer 11, an opening 17cc formed in the second insulating layer 17, and a CS connecting upper connection section 19cc (also simply referred to as an "upper connection section 19cc") as illustrated in FIG. 24B and FIG. 26C, for example.

The lower connection section 3cc is included in the gate metal layer 3 and electrically connected to the CS bus line CL. In this example, the lower connection section 3cc extends from the CS bus line CL.

The opening 4cc formed in the gate insulating layer 4 at least reaches the lower connection section 3cc.

The opening 11cc formed in the first insulating layer 11 overlaps the opening 4cc formed in the gate insulating layer 4 when viewed from the normal direction of the dielectric substrate 1.

The opening 17cc formed in the second insulating layer 17 overlaps the opening 11cc formed in the first insulating layer 11 when viewed from the normal direction of the dielectric substrate 1. The opening 4cc formed in the gate insulating layer 4, the opening 11cc formed in the first insulating layer 11, and the opening 17cc formed in the second insulating layer 17 constitute a contact hole CH_cc.

The upper connection section 19cc is included in the upper conductive layer 19 and electrically connected to the first transfer terminal upper connection section 19p1. Here, the upper connection section 19cc extends from the upper connection section 19p1 and is formed integrally with the upper connection section 19p1. The upper connection section 19cc is formed on the second insulating layer 17 and within the contact hole CH_cc, and is connected to the lower connection section 3cc within the contact hole CH_cc. Here, the upper connection section 19cc is in contact with the lower connection section 3cc within the opening 4cc formed in the gate insulating layer 4.

In this example, the common-CS connection section CC does not include the conductive portion included in the source metal layer 7 and the conductive portion included in the patch metal layer 151.

Source-Gate Connection Section SG

The TFT substrate 106 may be different from the TFT substrate 105 in the configuration of the source-gate connection section SG.

For example, the source-gate connection section SG of the TFT substrate 106 includes the source lower connection wiring line 3sg, the opening 4sg1 formed in the gate insulating layer 4, the source bus line connection section 7sg, the opening 11sg1 and opening 11sg2 formed in the first insulating layer 11, an opening 17sg1 and opening 17sg2 formed in the second insulating layer 17, and a source bus line upper connection section 19sg as illustrated in FIG. 24C, FIG. 25C and FIG. 26D.

The source lower connection wiring line 3sg is included in the gate metal layer 3 and electrically separate from the gate bus line GL.

The opening 4sg1 formed in the gate insulating layer 4 at least reaches the source lower connection wiring line 3sg.

The source bus line connection section 7sg is included in the source metal layer 7 and electrically connected to the source bus line SL. In this example, the source bus line connection section 7sg extends from the source bus line SL and is formed integrally with the source bus line SL. A width of the source bus line connection section 7sg may be larger than a width of the source bus line SL.

The opening 11sg1 formed in the first insulating layer 11 overlaps the opening 4sg1 formed in the gate insulating layer 4 when viewed from the normal direction of the dielectric substrate 1.

The opening 11sg2 formed in the first insulating layer 11 at least reaches the source bus line connection section 7sg.

The opening 17sg1 formed in the second insulating layer 17 overlaps the opening 11sg1 formed in the first insulating layer 11 when viewed from the normal direction of the dielectric substrate 1. The opening 4sg1 formed in the gate insulating layer 4, the opening 11sg1 formed in the first insulating layer 11, and the opening 17sg1 formed in the second insulating layer 17 constitute a contact hole CH_sg1.

The opening 17sg2 formed in the second insulating layer 17 overlaps the opening 11sg2 formed in the first insulating layer 11 when viewed from the normal direction of the dielectric substrate 1. The opening 11sg2 formed in the first insulating layer 11 and the opening 17sg2 formed in the second insulating layer 17 constitute a contact hole CH_sg2.

The source bus line upper connection section 19sg (also simply referred to as the "upper connection section 19sg") is included in the upper conductive layer 19. The upper connection section 19sg is formed on the second insulating layer 17, within the contact hole CH_sg1, and within the contact hole CH_sg2, is connected to the source lower connection wiring line 3sg within the contact hole CH_sg1, and is connected to the source bus line connection section 7sg within the contact hole CH_sg2. For example, here, the upper connection section 19sg is in contact with the source lower connection wiring line 3sg within the opening 4sg1 formed in the gate insulating layer 4, and in contact with the source bus line connection section 7sg within the opening 11sg2 formed in the first insulating layer 11.

Here, the source-gate connection section SG does not include the conductive portion included in the patch metal layer 151.

The source-gate connection section SG of the TFT substrate 106 has more excellent actional stability as compared with the source-gate connection section SG of the TFT substrate 105. In the TFT substrate 106, the contact holes CH_sg1 and CH_sg2 are formed by collectively etching the gate insulating layer 4, the first insulating layer 11, and the second insulating layer 17, for example. In the process of patterning the patch conductive film for forming the patch metal layer 151, the openings 4sg1, 11sg1, and 11sg2 are still not formed. Specifically, in the process of patterning the patch conductive film, the opening that at least reaches the gate metal layer 3 and/or source metal layer 7 in the source-gate connection section SG is not formed in the first insulating layer 11 and the gate insulating layer 4. Therefore, from the viewpoint of suppressing the damage to the gate metal layer 3 and source metal layer 7 in the process of etching the patch conductive film, the TFT substrate 106 is advantageous as compared with the TFT substrate 105. The manufacturing method of the TFT substrate 106 is described later in detail.

In a case of including the source-gate connection section SG having the configuration described above, the lower conductive layer 13 can be omitted, and therefore, the manufacturing process and the manufacturing cost can be reduced as compared with the TFT substrate 105. Furthermore, the gate insulating layer 4, the first insulating layer 11, and the second insulating layer 17 can be collectively etched, and therefore, the manufacturing process and the manufacturing cost can be reduced as compared with the TFT substrate 105.

Manufacturing Method of TFT Substrate 106

A description is given of a manufacturing method of the TFT substrate 106 with reference to FIG. 27A to FIG. 30B.

FIGS. 27A to 27E, FIGS. 28A to 28C, FIGS. 29A to 29C, and FIGS. 30A to 30B are process cross-sectional views illustrating an example of the manufacturing method of the TFT substrate 106. Each of these drawings illustrates the cross sections corresponding to FIGS. 25A to 25D and FIG. 26A. Note that the cross-sections corresponding to FIGS. 26B and 26C are formed by a similar method for the cross-sections corresponding to FIG. 26A and FIG. 25D, respectively, although the illustrations thereof are omitted. The descriptions of the material, thickness, formation method, and the like of each layer which are similar to those in the method described above with reference to FIG. 5 may be adequately omitted.

As described above, the TFT substrate 106 includes the gate metal layer 3, the gate insulating layer 4, the source metal layer 7, the first insulating layer 11, the patch metal layer 151, the second insulating layer 17, and the upper conductive layer 19 in this order on the dielectric substrate 1.

The gate metal layer 3 includes the gate electrode 3G of the TFT 10, the gate bus line GL, the CS bus line CL, the lower auxiliary capacitance electrode 3C, the source lower connection wiring line 3sg of the source-gate connection section SG, the lower connection section 3cc of the common-CS connection section CC, and the lower connection sections 3gA, 3c, and 3sA of the respective terminal sections.

The source metal layer 7 includes the source electrode 7S and drain electrode 7D of the TFT 10, the source bus line SL, the upper auxiliary capacitance electrode 7C, and the source bus line connection section 7sg of the source-gate connection section SG.

The patch metal layer 151 includes the patch electrode 15, the connection section 15a of the antenna unit region U, and the lower connection sections 15p1 and 15p2 of the first transfer terminal section PT1 and the second transfer terminal section PT2, respectively.

The upper conductive layer 19 includes the source bus line upper connection section 19sg of the source-gate connection section SG, the upper connection section 19cc of the common-CS connection section CC, and the upper connection section 19gA, 19c, 19sA, 19p1, and 19p2 of the respective terminal sections.

First, as illustrated in FIG. 27A, a gate conductive film 3' is formed on the dielectric substrate 1 by sputtering or the like. Here, as the gate conductive film 3', a layered film (MoN/Al) is formed by layering an Al film (having a thickness of 150 nm, for example) and a MoN layer (having a thickness of 100 nm, for example) in this order.

Next, the gate conductive film 3' is patterned to form the gate metal layer 3 as illustrated in FIG. 27B. Specifically, the gate electrode 3G, the lower auxiliary capacitance electrode 3C, the gate bus line GL, and the CS bus line CL are formed in an antenna unit formation region, the source lower connection wiring line 3sg is formed in a source-gate connection section formation region, the lower connection sections 3sA, 3gA, and 3c are formed in respective terminal section formation regions, and the lower connection section 3cc is formed in a common-CS connection section formation region. Here, patterning of the gate conductive film 3' is performed by wet etching.

After that, as illustrated in FIG. 27C, a gate insulating film 4, an intrinsic amorphous silicon film 5', and an n$^+$ type amorphous silicon film 6' are formed in this order to cover the gate metal layer 3. For the purpose of simplification, the gate insulating layer 4 and the gate insulating film 4 are denoted by the same reference numeral. Here, as the gate insulating film 4, a silicon nitride (SixNy) film having a thickness of 350 nm, for example. The intrinsic amorphous silicon film 5' having a thickness of 120 nm, for example, and the n$^+$ type amorphous silicon film 6' having a thickness of 30 nm, for example, are formed.

Next, the intrinsic amorphous silicon film 5' and the n$^+$ type amorphous silicon film 6' are patterned to obtain the island-shaped semiconductor layer 5 and the contact layer 6 as illustrated in FIG. 27D. Note that the semiconductor film used for the semiconductor layer 5 is not limited to an amorphous silicon film. For example, an oxide semiconductor layer may be formed as the semiconductor layer 5. In this case, it is not necessary to provide a contact layer between the semiconductor layer 5, and the source electrode and drain electrode.

Next, a source conductive film 7' is formed on the gate insulating film 4 and on the contact layer 6 as illustrated in FIG. 27E. Here, as the source conductive film 7', a layered film (MoN/Al/MoN) is formed by layering MoN (having a thickness of 50 nm, for example), Al (having a thickness of 150 nm, for example), and MoN (having a thickness of 100 nm, for example) in this order.

Next, the source conductive film 7' is patterned to form the source metal layer 7 as illustrated in FIG. 28A. Specifically, the source electrode 7S and the drain electrode 7D, the source bus line SL, and the upper auxiliary capacitance electrode 7C are formed in the antenna unit formation region, and the source bus line connection section 7sg is formed in the source-gate connection section formation region. At this time, the contact layer 6 is also etched, and the source contact layer 6S and the drain contact layer 6D separated from each other are formed. Here, patterning of the source conductive film 7' is performed by wet etching. For example, an aqueous solution containing phosphoric acid, nitric acid, and acetic acid is used to simultaneously pattern the MoN film and the Al film by wet etching. In this manner, the TFT 10 is obtained.

Here, in the source-gate connection section formation region, the source metal layer 7 is formed such that at least a portion of the source lower connection wiring line 3sg does not overlap the source bus line connection section 7sg. Each terminal section formation region does not include the conductive portion included in the source metal layer 7.

Next, as illustrated in FIG. 28B, the first insulating film 11 is formed to cover the TFT 10 and the source metal layer 7. For the purpose of simplification, the first insulating layer 11 and the first insulating film 11 are denoted by the same reference numeral. In this example, the first insulating film 11 is formed to be in contact with the channel region of the semiconductor layer 5. Here, as the first insulating film 11, a silicon nitride (SixNy) film having a thickness of 330 nm, for example, is formed.

Subsequently, as illustrated in FIG. 28C, a patch conductive film 15' is formed on the first insulating film 11. Here, as the patch conductive film 15', a layered film (MoN/Al/MoN) is formed which includes a MoN film (having a thickness of 50 nm, for example), an Al film (having a thickness of 1000 nm, for example), and a MoN film (having a thickness of 50 nm, for example) in this order. Alternatively, as the patch conductive film 15', a layered film (Cu/Ti) may be formed which includes a Ti film (having a thickness of 20 nm, for example) and a Cu film (having a thickness of 500 nm, for example) in this order.

Next, the patch conductive film 15' is patterned to form the patch metal layer 151 as illustrated in FIG. 29A. Specifically, the patch electrode 15 and the connection section 15a are formed in the antenna unit region formation region, the lower connection section 15p1 is formed in a first transfer terminal section formation region, and the lower connection section 15p2 is formed in a second transfer terminal section formation region.

In the case that the layered film (MoN/Al/MoN) is formed as the patch conductive film 15' by layering MoN, Al, and MoN in this order, patterning of the patch conductive film 15' is performed by wet etching using, as an etching solution, an aqueous solution containing phosphoric acid, nitric acid, and acetic acid, for example, to simultaneously pattern the MoN film and the Al film. In the case that the layered film (Cu/Ti) is formed as the patch conductive film 15' by layering Ti and Cu in this order, the patch conductive film 15' can be patterned by wet etching using, as an etching solution, an acid mixed aqueous solution, for example.

As illustrated in FIG. 29A, in the process of patterning the patch conductive film 15', there is no opening formed in the gate insulating layer 4 and the first insulating layer 11. Specifically, the source bus line connection section 7sg formed in the source-gate connection section formation region is covered by the first insulating layer 11, and the source lower connection wiring line 3sg formed in the source-gate connection section formation region is covered by the gate insulating layer 4 and the first insulating layer 11. Therefore, the source bus line connection section 7sg and the source lower connection wiring line 3sg scarcely suffer the etching damage in the process of patterning the patch conductive film 15'.

Next, as illustrated in FIG. 29B, the second insulating film 17 is formed on the patch metal layer 151 and on the first insulating layer 11. For the purpose of simplification, the second insulating layer 17 and the second insulating film 17 are denoted by the same reference numeral. Here, as the second insulating layer 17, a silicon nitride (SixNy) film having a thickness of 100 nm, for example, is formed. The second insulating film 17 is formed to cover the patch metal layer 151.

Next, the second insulating film 17, the first insulating film 11, and the gate insulating film 4 are etched through a known photolithography process to form the second insulating layer 17, the first insulating layer 11, and the gate insulating layer 4 as illustrated in FIG. 29C.

Specifically, in the antenna unit formation region, the contact hole CH_a at least reaching the portion extending from the drain electrode 7D is formed in the second insulating film 17 and the first insulating film 11, and the opening 17b at least reaching the connection section 15a is formed in the second insulating film 17. In the source-gate connection section formation region, the contact hole CH_sg1 at least reaching the source lower connection wiring line 3sg is formed in the second insulating film 17, the first insulating film 11, and the gate insulating film 4, and the contact hole CH_sg2 at least reaching the source bus line connection section 7sg is formed in the second insulating film 17 and the first insulating film 11. In the source terminal section formation region, the contact hole CH_s at least reaching the lower connection section 3sA is formed in the second insulating film 17, the first insulating film 11, and the gate insulating film 4. In the gate terminal section formation region, the contact hole CH_g at least reaching the lower connection section 3gA is formed in the second insulating film 17, the first insulating film 11, and the gate insulating film 4. In the CS terminal section formation region, the contact hole CH_c at least reaching the lower connection section 3c is formed in the second insulating film 17, the first insulating film 11, and the gate insulating film 4. In the first transfer terminal section formation region, the opening 17p1 at least reaching the lower connection section 15p1 is formed in the second insulating film 17. In the second transfer terminal section formation region, the opening 17p2 at least reaching the lower connection section 15p2 is formed in the second insulating film 17. In the common-CS connection section formation region, the contact hole CH_cc at least reaching the lower connection section 3cc is formed in the second insulating film 17, the first insulating film 11, and the gate insulating film 4.

In this etching process, the source metal layer 7 and the patch metal layer 151 are used as etch stops to etch the second insulating layer 17, the first insulating film 11, and the gate insulating film 4.

For example, in the antenna unit formation region, the second insulating film 17 and the first insulating film 11 are collectively etched in a region overlapping the portion extending from the drain electrode 7D, and the connection section 15a functions as the etch stop to etch only the second insulating film 17 in a region overlapping the connection section 15a. This allows the contact hole CH_a and the opening 17b to be obtained. The contact hole CH_a includes an opening 11a that is formed in the first insulating layer 11 and at least reaches the portion extending from the drain electrode 7D, and the opening 17a that is formed in the second insulating layer 17 and overlaps the opening 11a. Here, since at least a part of the drain electrode 7D and potion extending from the drain electrode 7D is formed not to overlap the patch metal layer 151, the contact hole CH_a is formed in the first insulating film 11 and the second insulating film 17. A side surface of the opening 11a and a side surface of the opening 17a may be aligned on a side surface of the contact hole CH_a.

In the source-gate connection section formation region, the second insulating film 17, the first insulating film 11, and the gate insulating film 4 are collectively etched in a region overlapping the source lower connection wiring line 3sg, and the source bus line connection section 7sg functions as the etch stop to etch the second insulating film 17 and the first insulating film 11 in a region overlapping the source bus line connection section 7sg. This allows the contact hole CH_sg1 and the contact hole CH_sg2 to be obtained. The contact hole CH_sg1 includes the opening 4sg1 that is formed in the gate insulating layer 4 and at least reaches the source lower connection wiring line 3sg, the opening 11sg1 that is formed in the first insulating layer 11 and overlaps the opening 4sg1, and the opening 17sg1 that is formed in the second insulating layer 17 and overlaps the opening 11sg1. The contact hole CH_sg2 includes the opening 11sg2 that is formed in the first insulating layer 11 and at least reaches the source bus line connection section 7sg, and the opening 17sg2 that is formed in the second insulating layer 17 and overlaps the opening 11sg2. Here, since at least a portion of the source lower connection wiring line 3sg is formed not to overlap the source bus line connection section 7sg, the contact hole CH_sg1 is formed in the gate insulating film 4, the first insulating film 11, and the second insulating film 17.

A side surface of the opening 4sg1, a side surface of the opening 11sg1, and a side surface of the opening 17sg1 may be aligned on a side surface of the contact hole CH_sg1. A side surface of the opening 11sg2 and a side surface of the opening 17sg2 may be aligned on a side surface of the contact hole CH_sg2.

The second insulating film 17, the first insulating film 11, and the gate insulating film 4 are collectively etched using the same etchant, for example. Here, the second insulating film 17, the first insulating film 11, and the gate insulating film 4 are etched by dry etching using a fluorine gas. The second insulating film 17, the first insulating film 11, and the gate insulating film 4 may be etched using different etchants.

Since the conductive portions included in the source metal layer 7 and patch metal layer 151 are not formed in each of the source terminal section formation region, the gate terminal section formation region, the CS terminal section formation region, and the common-CS connection section formation region, the second insulating film 17, the first insulating film 11, and the gate insulating film 4 are collectively etched.

In the source terminal section formation region, the second insulating film 17, the first insulating film 11, and the gate insulating film 4 are collectively etched to form the contact hole CH_s. The contact hole CH_s includes the opening 4s that is formed in the gate insulating layer 4 and at least reaches the lower connection section 3sA, the opening 11s that is formed in the first insulating layer 11 and overlaps the opening 4s, and the opening 17s that is formed in the second insulating layer 17 and overlaps the opening 11s. A side surface of the opening 4s, a side surface of the opening 11s, and a side surface of the opening 17s may be aligned on a side surface of the contact hole CH_s.

In the gate terminal section formation region, the second insulating film 17, the first insulating film 11, and the gate insulating film 4 are collectively etched to form the contact hole CH_g. The contact hole CH_g includes the opening 4g that is formed in the gate insulating layer 4 and at least reaches the lower connection section 3gA, the opening 11g that is formed in the first insulating layer 11 and overlaps the opening 4g, and the opening 17g that is formed in the second insulating layer 17 and overlaps the opening 11g. A side surface of the opening 4g, a side surface of the opening 11g, and a side surface of the opening 17g may be aligned on a side surface of the contact hole CH_g.

In the CS terminal section formation region, the second insulating film 17, the first insulating film 11, and the gate insulating film 4 are collectively etched to form the contact hole CH_c. The contact hole CH_c includes the opening 4c that is formed in the gate insulating layer 4 and at least reaches the lower connection section 3c, the opening 11c that is formed in the first insulating layer 11 and overlaps the opening 4c, and the opening 17c that is formed in the second insulating layer 17 and overlaps the opening 11c. A side surface of the opening 4c, a side surface of the opening 11c, and a side surface of the opening 17c may be aligned on a side surface of the contact hole CH_c.

In the common-CS connection section formation region, the second insulating film 17, the first insulating film 11, and the gate insulating film 4 are collectively etched to form the contact hole CH_cc. The contact hole CH_cc includes the opening 4cc that is formed in the gate insulating layer 4 and at least reaches the lower connection section 3cc, the opening 11cc that is formed in the first insulating layer 11 and overlaps the opening 4cc, and the opening 17cc that is formed in the second insulating layer 17 and overlaps the opening 11cc. A side surface of the opening 4cc, a side surface of the opening 11cc, and a side surface of the opening 17cc may be aligned on a side surface of the contact hole CH_cc.

Next, as illustrated in FIG. 30A, an upper conductive film 19' is formed on the second insulating layer 17, within the contact hole CH_a, within the opening 17b, within the contact hole CH_sg1, within the contact hole CH_sg2, within the contact hole CH_s, within the contact hole CH_g, within the contact hole CH_c, within the opening 17p1, within the opening 17p2, and within the contact hole CH_cc, by sputtering, for example. The upper conductive film 19' includes a transparent conductive film, for example. Here, an ITO film having a thickness of, for example, 70 nm is used as the upper conductive film 19'. Alternatively, a layered film (ITO/Ti) formed by layering Ti (having a thickness of 50 nm, for example) and ITO (having a thickness of 70 nm, for example) in this order may be used as the upper conductive film 19'. In place of the Ti film, a layered film formed of one film or two or more films selected from the group including MoNbNi film, MoNb film, MoW film, W film, and Ta film may be used. Specifically, as the upper conductive film 19', a layered film may be used that is formed by layering a layered film formed of one film or two or more films selected from the group including Ti film, MoNbNi film, MoNb film, MoW film, W film, and Ta film, and an ITO film in this order.

Next, the upper conductive film 19' is patterned to form the upper conductive layer 19 as illustrated in FIG. 30B. Specifically, formed are the patch drain connection section 19a in contact with the portion extending from the drain electrode 7D within the contact hole CH_a and in contact with the connection section 15a within the opening 17b in the antenna unit formation region, the upper connection section 19sg in contact with the source lower connection wiring line 3sg within the contact hole CH_sg1 and in contact with the source bus line connection section 7sg within the contact hole CH_sg2 in the source-gate connection section formation region, the upper connection section 19sA in contact with the lower connection section 3sA within the contact hole CH_s in the source terminal section formation region, the upper connection section 19gA in contact with the lower connection section 3gA within the contact hole CH_g in the gate terminal section formation region, the upper connection section 19c in contact with the lower connection section 3c within the contact hole CH_c in the CS terminal section formation region, the upper connection section 19p1 in contact with the lower connection section 15p1 within the opening 17p1 in the first transfer terminal section formation region, the upper connection section 19p2 in contact with the lower connection section 15p2 within the opening 17p2 in the second transfer terminal section formation region, and the upper connection section 19cc in contact with the lower connection section 3cc within the contact hole CH_cc in the common-CS connection section formation region. This provides the antenna unit region U, the source-gate connection section SG, the source terminal section ST, the gate terminal section GT, the CS terminal section CT, the first transfer terminal section PT1, the second transfer terminal section PT2, and the common-CS connection section CC.

In this manner, the TFT substrate 106 is manufactured.

Modification Example

A TFT substrate in Modification Example of the present embodiment is different from the TFT substrate 106 in further including the lower conductive layer 13.

Hereinafter, a description is given of a TFT substrate 107 in Modification Example of the present embodiment with reference to FIG. 31A to FIG. 33D. The following description mainly describes differences from the TFT substrate 106.

FIGS. 31A to 31C are schematic cross-sectional views of the TFT substrate 107. FIG. 31A illustrates the antenna unit region U in the transmission and/or reception region R1, FIG. 31B illustrates the transfer terminal section PT, the common-CS connection section CC, the gate terminal section GT, and the CS terminal section CT provided in the non-transmission and/or reception region R2, and FIG. 31C illustrates the source-gate connection section SG and the source terminal section ST provided in the non-transmission and/or reception region R2.

Each of FIGS. 32A to 32D and FIGS. 33A to 33D is a schematic cross-sectional view of the TFT substrate 107. FIG. 32A illustrates a cross-section of the antenna unit region U along a line A-A' in FIG. 31A, FIG. 32B illustrates a cross-section of the first transfer terminal section PT1 along a line B-B' in FIG. 31B, FIG. 32C illustrates a cross-section of the source-gate connection section SG along a line C-C' in FIG. 31C, FIG. 32D illustrates a cross-section of the source terminal section ST along a line D-D' in FIG. 31C, FIG. 33A illustrates a cross-section of the second transfer terminal section PT2 along a line E-E' in FIG. 31B, FIG. 33B illustrates a cross-section of the first transfer terminal section PT1 along a line F-F' in FIG. 31B, FIG. 33C illustrates a cross-section of the common-CS connection section CC along a line G-G' in FIG. 31B, and FIG. 33D illustrates cross-sections of the source-gate connection section SG and the source terminal section ST along a line H-H' in FIG. 31C.

Antenna Unit Region U

As illustrated in FIG. 31A and FIG. 32A, the antenna unit region U of the TFT substrate 107 is different from the configuration of the antenna unit region of the TFT substrate 106 in further including the lower conductive layer 13. The TFT substrate 107 can also provide the advantage of having more excellent actional stability as compared with the TFT substrate 105 in the fourth embodiment because of including the patch drain connection section 19a.

In the TFT substrate 107, the first insulating layer 11 includes the opening 11a and opening 11d that at least reach a portion extending form the drain electrode 7D. The opening 11a and the opening 11d are formed to be apart from each other. In the illustrated example, the opening 11d at least reaches the upper auxiliary capacitance electrode 7C extending from the drain electrode 7D.

The lower conductive layer 13 includes a connection section 13c formed on the first insulating layer 11 and within the opening 11d. The connection section 13c is connected to the portion extending from the drain electrode 7D within the opening 11d. For example, here, the connection section 13c is in contact with the portion extending from the drain electrode 7D within the opening 11d.

The patch metal layer 151 includes the patch electrode 15 and the connection section 15a. The connection section 15a is formed on the connection section 13c and electrically connected to the connection section 13c. For example, here, the connection section 15a is formed to be in direct contact with the connection section 13c. Therefore, in the TFT substrate 107, the patch electrode 15 is electrically connected to the drain electrode 7D via the connection section 13c and the connection section 15a, and also via the patch drain connection section 19a.

The lower conductive layer 13 includes, for example, an oxide conductive layer (for example, ITO layer). As already described, because the lower conductive layer 13 (the connection section 13c) including the oxide conductive layer includes a portion that is in direct contact with the high melting-point metal containing layer (the lower layer) in the patch metal layer 151 (the connection section 15a), the contact resistance between the connection section 13c and the connection section 15a may increase in some cases. However, in the TFT substrate 107, the patch electrode 15 is electrically connected to the drain electrode 7D via also the patch drain connection section 19a, so that the contact failure between the drain electrode 7D and the patch electrode 15 is suppressed even in a case where the contact resistance between the connection section 13c and the connection section 15a increases. The TFT substrate 107 is more excellent in the actional stability as compared with the TFT substrate 105.

First Transfer Terminal Section PT1 and Common-CS Connection Section CC

As illustrated in 31B and 32B, the first transfer terminal section PT1 of the TFT substrate 107 may have a configuration different from that of the TFT substrate 106. Here, the first transfer terminal section PT1 of the TFT substrate 107 has the same configuration as the first transfer terminal section PT1 of the TFT substrate 105. However, the TFT substrate 107 is different from the TFT substrate 105 in including the common-CS connection section CC as illustrated in FIG. 31B and FIG. 33C. The configuration of the common-CS connection section CC is the same as that of the TFT substrate 106. Because the TFT substrate 107 includes the common-CS connection section CC, the lower connection section of the first transfer terminal section PT1 is electrically connected to the CS bus line CL.

In the TFT substrate 107, the lower connection section 3cc of the common-CS connection section CC is electrically connected to the lower connection section 3px of the first transfer terminal section PT1. For example, the lower connection section 3cc extends from the lower connection section 3px. The upper connection section 19cc of the common-CS connection section CC is electrically connected to the upper connection section 19px of the first transfer terminal section PT1. For example, the upper connection section 19cc extends from the upper connection section 19px.

Similar to the TFT substrate 105, in the first transfer terminal section PT1 of the TFT substrate 107, the lower conductive layer 13 (the first conductive portion 13px) including the oxide conductive layer includes a potion that is in direct contact with the high melting-point metal layer in the patch metal layer 151 (the second conductive portion 15px). Therefore, in the first transfer terminal section PT1 of the TFT substrate 107, the contact resistance between the first conductive portion 13px and the second conductive portion 15px may increase in some cases. However, since the TFT substrate 107 includes the common-CS connection section CC, the contact failure between the upper connection section 19px and the CS bus line CL is suppressed in the TFT substrate 107. The TFT substrate 107 is more excellent in the actional stability as compared with the TFT substrate 105.

Manufacturing Method of TFT Substrate 107

A description is given of a manufacturing method of the TFT substrate 107 with reference to FIG. 34A to FIG. 38B.

FIGS. 34A to 34E, FIGS. 35A to 35D, FIGS. 36A to 36C, FIGS. 37A and 37B, and FIGS. 38A and 38B are process cross-sectional views illustrating an example of the manufacturing method of the TFT substrate 107. Each of these drawings illustrates the cross sections corresponding to FIGS. 32A to 32D and FIG. 33A. The following description mainly describes differences from the manufacturing method of the TFT substrate 106 described with reference to FIG. 27A to FIG. 30B.

First, as illustrated in FIGS. 34A to 34E and FIGS. 35A and 35B, formed on the dielectric substrate 1 are the gate metal layer 3, the gate insulating film 4, the island-shaped semiconductor layer 5, the contact layers 6S and 6D, the source metal layer 7, and the first insulating film 11. These processes are carried out similarly to the processes described referring to FIGS. 27A to 27E and FIGS. 28A and 28B. However, here, as illustrated in FIG. 34B, a difference from the manufacturing method of the TFT substrate 106 is in that the lower connection section 3px is further formed in the first transfer terminal section formation region in the process of forming the gate metal layer 3.

Figure 35A:
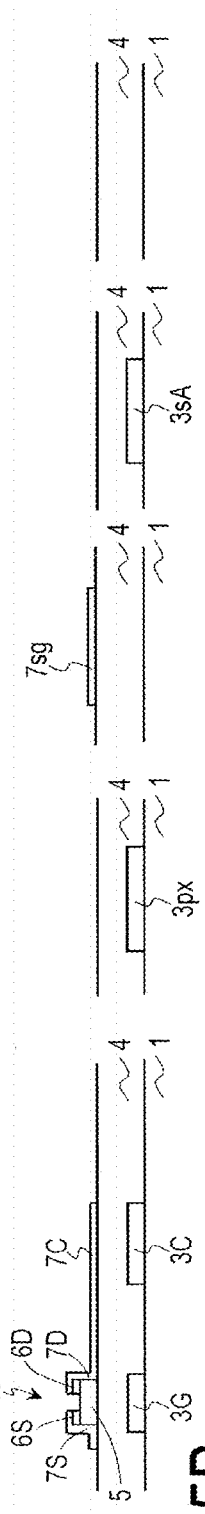
FIGS. 35A to 35D are process cross-sectional views illustrating an example of the manufacturing method of the TFT substrate 107.
Figure 35B:
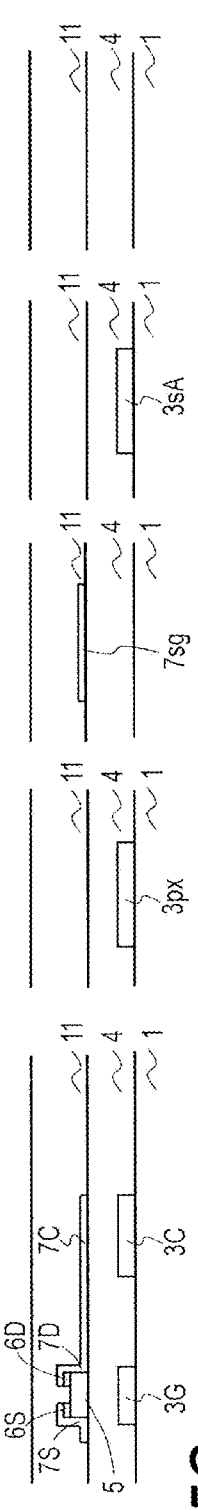
Figure 35C:
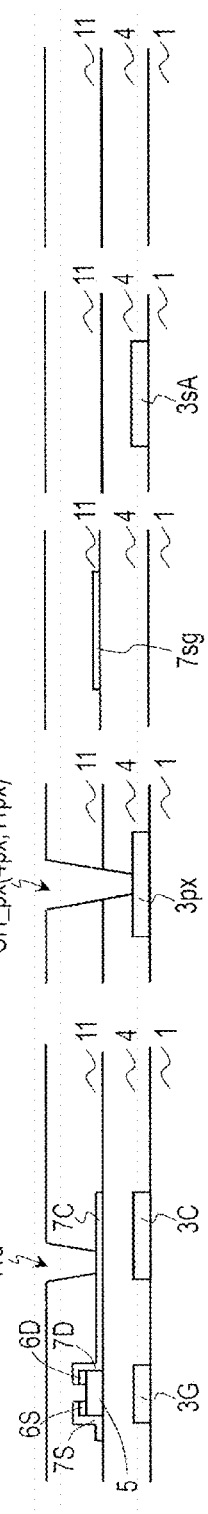

Next, the first insulating film 11 and the gate insulating film 4 are etched through a known photolithography process as illustrated in FIG. 35C. In this manner, the opening 11d at least reaching the portion extending from the drain electrode 7D is formed in the first insulating film 11 in the antenna unit formation region, and the contact hole CH_px at least reaching the lower connection section 3px is formed in the gate insulating film 4 and first insulating film 11 in the first transfer terminal section formation region.

In this process, the opening is not formed in the gate insulating film 4 and first insulating film 11 in the source-gate connection section formation region, the source terminal section formation region, the gate terminal section formation region, the CS terminal section formation region, the second transfer terminal section formation region, and the common-CS connection section formation region.

The first insulating film 11 and the gate insulating film 4 are collectively etched using the same etchant, for example. Here, the first insulating film 11 and the gate insulating film 4 are etched by dry etching using a fluorine gas. The first insulating film 11 and the gate insulating film 4 may be etched using different etchants.

In the first transfer terminal section formation region, the first insulating film 11 and the gate insulating film 4 are collectively etched to form the contact hole CH_px. The contact hole CH_px includes the opening 4px that is formed in the gate insulating film 4 and at least reaches the lower connection section 3px, and the opening 11px that is formed in the first insulating film 11 and overlaps the opening 4px. A side surface of the opening 4px and a side surface of the opening 11px may be aligned on a side surface of the contact hole CH_px.

Figure 35D:
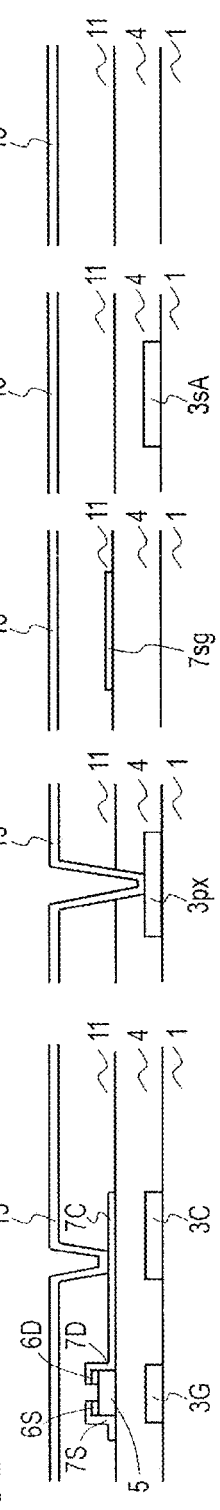

Next, as illustrated in FIG. 35D, a lower conductive film 13' is formed on the first insulating film 11, within the opening 11d, and within the contact hole CH_px by sputtering, for example. The lower conductive film 13' includes an oxide conductive film, for example. Here, an ITO film having a thickness of, for example, 70 nm is formed as the lower conductive film 13'.

Next, the lower conductive film 13' is patterned to form the lower conductive layer 13 as illustrated in FIG. 36A. Specifically, formed are the connection section 13c in contact with a portion extending from the drain electrode 7D within the opening 11d in the antenna unit formation region, and the first conductive portion 13px in contact with the lower connection section 3px within the contact hole CH_px in the first transfer terminal section formation region.

Subsequently, as illustrated in FIG. 36B, a patch conductive film 15' is formed on the lower conductive layer 13 and on the first insulating film 11. This process is carried out similarly to the process described with reference to FIG. 28C.

Next, the patch conductive film 15' is patterned to form the patch metal layer 151 as illustrated in FIG. 36C. This process is carried out similarly to the process described referring to FIG. 29A. Here, specifically, the patch electrode 15 and the connection section 15a are formed in the antenna unit region formation region, the second conductive portion 15px is formed in the first transfer terminal section formation region, and the lower connection section 15p2 is formed in the second transfer terminal section formation region.

The connection section 15a is formed to be connected to the connection section 13c in the antenna unit formation region. Here, the connection section 15a is formed to be in contact with the connection section 13c. The second conductive portion 15px is formed to be connected to the first conductive portion 13px in the first transfer terminal section formation region. Here, the second conductive portion 15px is formed to be in contact with the first conductive portion 13px.

As illustrated in FIG. 36C, in the process of patterning the patch conductive film 15', there is no opening formed in the gate insulating layer 4 and first insulating layer 11 in the source-gate connection section formation region. Specifically, the source bus line connection section 7sg formed in the source-gate connection section formation region is covered by the first insulating layer 11, and the source lower connection wiring line 3sg formed in the source-gate connection section formation region is covered by the gate insulating layer 4 and the first insulating layer 11. Therefore, similarly to the manufacturing method of the TFT substrate 106, in the manufacturing method of the TFT substrate 107 also, the source bus line connection section 7sg and the source lower connection wiring line 3sg scarcely suffer the etching damage in the process of patterning the patch conductive film 15'.

Next, as illustrated in FIG. 37A, the second insulating film 17 is formed on the patch metal layer 151 and on the first insulating layer 11. This process is carried out similarly to the process described referring to FIG. 29B.

Next, the second insulating film 17, the first insulating film 11, and the gate insulating film 4 are etched to form the second insulating layer 17, the first insulating layer 11, and the gate insulating layer 4 as illustrated in FIG. 37B. This process is carried out similarly to the process described with reference to FIG. 29C. Here, a difference from the manufacturing method of the TFT substrate 106 is in that the opening 17px at least reaching the second conductive portion 15px is formed in the second insulating film 17 in the first transfer terminal section formation region.

Figure 38A:
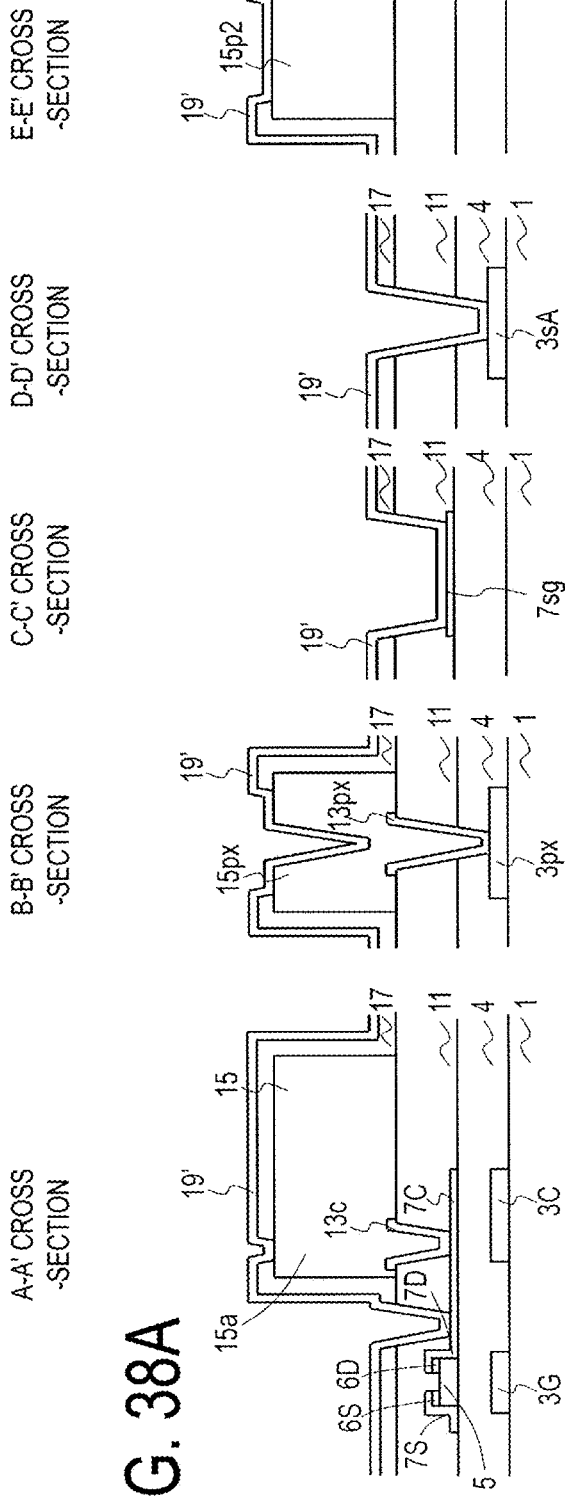
FIGS. 38A and 38B are process cross-sectional views illustrating an example of the manufacturing method of the TFT substrate 107.

Next, as illustrated in FIG. 38A, a conductive film 19' is formed on the second insulating layer 17, within the contact hole CH_a, within the opening 17b, within the contact hole CH_sg1, within the contact hole CH_sg2, within the contact hole CH_s, within the contact hole CH_g, within the contact hole CH_c, within the opening 17px, within the opening 17p2, and within the contact hole CH_cc. This process is carried out similarly to the process described with reference to FIG. 30A.

Figure 38B:
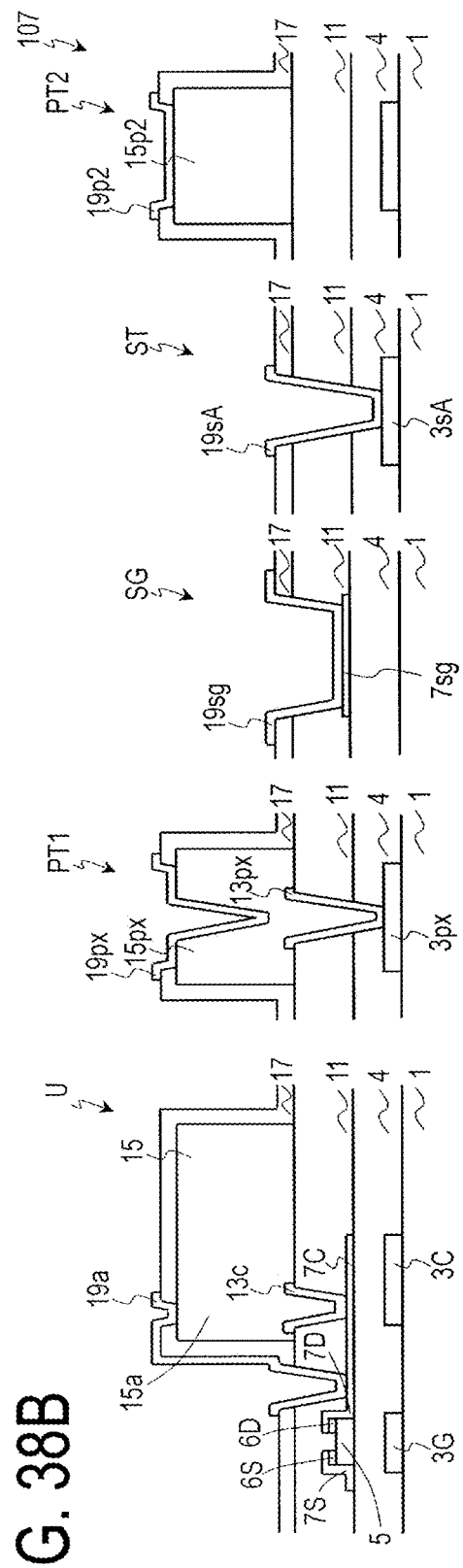

Next, the upper conductive film 19' is patterned to form the upper conductive layer 19 as illustrated in FIG. 38B. This process is carried out similarly to the process described referring to FIG. 30B. Here, the upper connection section 19px in contact with the second conductive portion 15px within the opening 17px is formed in the first transfer terminal section formation region. This provides the antenna unit region U, the source-gate connection section SG, the source terminal section ST, the gate terminal section GT, the CS terminal section CT, the first transfer terminal section PT1, the second transfer terminal section PT2, and the common-CS connection section CC.

In this manner, the TFT substrate 107 is manufactured.

The scanning antenna according to the embodiments of the disclosure is housed in a plastic housing as necessary, for example. It is preferable to use a material having a small dielectric constant $\varepsilon_M$ that does not affect microwave transmission and/or reception in the housing. In addition, the housing may include a through-hole provided in a portion thereof corresponding to the transmission and/or reception region R1. Furthermore, the housing may include a light blocking structure such that the liquid crystal material is not exposed to light. The light blocking structure is, for example, provided so as to block light that propagates through the dielectric substrate 1 and/or 51 from the side surface of the dielectric substrate 1 of the TFT substrate 101 and/or the side surface of the dielectric substrate 51 of the slot substrate 201 and is incident upon the liquid crystal layer. A liquid crystal material having a large dielectric anisotropy $\Delta\varepsilon_M$ may be prone to photodegradation, and as such it is preferable to shield not only ultraviolet rays but also short-wavelength blue light from among visible light. By using a light-blocking tape such as a black adhesive tape, for example, the light blocking structure can be easily formed in necessary locations.

INDUSTRIAL APPLICABILITY

Embodiments according to the disclosure are used in scanning antennas for satellite communication or satellite broadcasting that are mounted on mobile bodies (ships, aircraft, and automobiles, for example) or the manufacture thereof.

REFERENCE SIGNS LIST

1 Dielectric substrate
2 Base insulating film
3 Gate metal layer
3G Gate electrode
3c, 3cc, 3gA, 3px, 3sA Lower connection section
3sg Source lower connection wiring line
4 Gate insulating layer
4c, 4cc, 4g, 4px, 4s, 4sg1 Opening
5 Semiconductor layer
6D Drain contact layer
6S Source contact layer
7 Source metal layer
7D Drain electrode
7S Source electrode
7p Source connection wiring line
7sg Source bus connection section
11 First insulating layer
11a, 11c, 11cc, 11d, 11g, 11px Opening
11s, 11sg1, 11sg2, 11x Opening
13 Lower conductive layer
13c, 13x Connection section
13px First conductive portion
13sg Source bus line upper connection section
15 Patch electrode
151 Patch metal layer
15p Patch connection section
15p1, 15p2 Lower connection section
15px Second conductive portion
15x Connection section
17 Second insulating layer
17a, 17b, 17c, 17cc, 17g, 17p1, 17p2 Opening
17px, 17s, 17sg1, 17sg2 Opening
18g, 18s, 18p Opening
19 Upper conductive layer
19a Patch drain connection section
19g Gate terminal upper connection section
19p Transfer terminal upper connection section
19s Source terminal upper connection section
19c, 19cc, 19gA, 19p1, 19p2, 19px, 19sA Upper connection section
19sg Source bus line upper connection section
21 Alignment mark
23 Protective conductive layer
51 Dielectric substrate
52 Third insulating layer
54 Dielectric layer (air layer)
55 Slot electrode
55L Lower layer
55M Main layer
55U Upper layer
55c Contact surface
57 Slot
58 Fourth insulating layer
60 Upper connection section
65 Reflective conductive plate
67 Adhesive layer
68 Heater resistive film
70 Power feed device
71 Conductive beads
72 Power feed pin
73 Sealing portion
101, 102, 103, 104 TFT substrate
105, 106, 107 TFT substrate
201, 203 Slot substrate
1000 Scanning antenna
CH1, CH2, CH3, CH4, CH5, CH6 Contact hole
CH_a, CH_c, CH_cc, CH_g Contact hole
CH_px, CH_s, CH_sg1, CH_sg2 Contact hole
CH_sgx1, CH_sgx2 Contact hole
GD Gate driver
GL Gate bus line
GT Gate terminal section
SD Source driver
SL Source bus line
ST Source terminal section
PT Transfer terminal section
IT Terminal section
LC Liquid crystal layer
R1 Transmission and/or reception region
R2 Non-transmission and/or reception region
Rs Seal region
U, U1, U2 Antenna unit, Antenna unit region

The invention claimed is:
1. A Thin Film Transistor (TFT) substrate including
a dielectric substrate,
a plurality of antenna unit regions arranged on the dielectric substrate, each of the plurality of antenna unit regions including a TFT and a patch electrode electrically connected to a drain electrode of the TFT,
a transmission and reception region including the plurality of antenna unit regions, and
a non-transmission and non-reception region located in a region other than the transmission and reception region, the TFT substrate comprising:
a gate metal layer supported by the dielectric substrate, and including a gate electrode of the TFT;
a gate insulating layer formed on the gate metal layer;
a source metal layer formed on the gate insulating layer, and including a source electrode of the TFT and the drain electrode;
a first insulating layer formed on the source metal layer;
a patch metal layer formed on the first insulating layer, and including the patch electrode;
a second insulating layer formed on the patch metal layer; and
an upper conductive layer formed on the second insulating layer,
wherein the upper conductive layer includes a patch drain connection section electrically connected to the patch electrode and the drain electrode.

2. The TFT substrate according to claim 1, further comprising:
a lower conductive layer formed between the first insulating layer and the patch metal layer.

3. The TFT substrate according to claim 2,
wherein the lower conductive layer includes a portion in direct contact with the patch metal layer.

4. The TFT substrate according to claim 2,
wherein the lower conductive layer includes an oxide conductive layer.

5. The TFT substrate according to claim 1,
wherein the patch metal layer includes
a first metal layer including at least one element selected from the group including Ti, W, Mo, Ta, and Nb, and
a second metal layer formed on the first metal layer, and including at least one element selected from the group including Cu, Al, Ag, and Au.

6. The TFT substrate according to claim 1,
wherein the upper conductive layer includes
a first conductive layer including a transparent conductive layer, and
a second conductive layer formed under the first conductive layer, and formed of at least one layer selected from a group including a Ti layer, a MoNb layer, a MoNbNi layer, a MoW layer, a W layer, and a Ta layer.

7. The TFT substrate according to claim 1,
wherein the gate metal layer further includes a gate bus line connected to the gate electrode of the TFT,
the source metal layer further includes a source bus line connected to the source electrode of the TFT,
the TFT substrate further includes a source-gate connection section disposed in the non-transmission and non-reception region, and
the source-gate connection section includes
a source lower connection wiring line included in the gate metal layer, and electrically separate from the gate bus line,
a source bus line connection section included in the source metal layer, and electrically connected to the source bus line,
a first contact hole formed in the gate insulating layer, the first insulating layer, and the second insulating layer, and at least reaching the source lower connection wiring line,
a second contact hole formed in the first insulating layer and the second insulating layer, and at least reaching the source bus line connection section, and
a source bus line upper connection section included in the upper conductive layer, connected to the source lower connection wiring line within the first contact hole, and connected to the source bus line connection section within the second contact hole.

8. The TFT substrate according to claim 7, further comprising:
a source terminal section disposed in the non-transmission and non-reception region,
wherein the source terminal section includes
a source terminal lower connection section included in the gate metal layer, and electrically connected to the source lower connection wiring line,
a third contact hole formed in the gate insulating layer, the first insulating layer, and the second insulating layer, and at least reaching the source terminal lower connection section, and
a source terminal upper connection section included in the upper conductive layer, and connected to the source terminal lower connection section within the third contact hole.

9. A manufacturing method of the TFT substrate that is according to claim 7, the manufacturing method comprising:
a step (a) for forming the gate metal layer including the source lower connection wiring line on the dielectric substrate;
a step (b) for depositing a gate insulating film on the gate metal layer;
a step (c) for forming the source metal layer including the source bus line connection section on the gate insulating film;
a step (d) for depositing a first insulating film on the source metal layer;
a step (e) for depositing a patch conductive film on the first insulating film;
a step (f) for patterning the patch conductive film to form the patch metal layer;
a step (g) for depositing a second insulating film on the patch metal layer; and
a step (h) for forming the first contact hole and the second contact hole in the gate insulating film, the first insulating film, and the second insulating film,
wherein in the step (f), the source lower connection wiring line is covered by the gate insulating film and the first insulating film, and the source bus line connection section is covered by the first insulating film.

10. The manufacturing method of the TFT substrate according to claim 9,
wherein the step (h) includes collectively etching the gate insulating film, the first insulating film, and the second insulating film.

11. The TFT substrate according to claim 2,
wherein the transfer terminal section includes a second transfer terminal section, the second transfer terminal section including
a second transfer terminal lower connection section included in the gate metal layer,
a sixth contact hole formed in the gate insulating layer and the first insulating layer, and at least reaching the second transfer terminal lower connection section,
a first conductive portion for second transfer terminal included in the lower conductive layer, and connected to the second transfer terminal lower connection section within the sixth contact hole,
a second conductive portion for second transfer terminal included in the patch metal layer, and formed on the first conductive portion for second transfer terminal,
a seventh contact hole formed in the second insulating layer, and at least reaching the second conductive portion for second transfer terminal, and a second transfer terminal upper connection section included in the upper conductive layer, and connected to the second conductive portion for second transfer terminal within the seventh contact hole.

12. The TFT substrate according to claim 11, wherein the second transfer terminal lower connection section is electrically connected to the CS bus line.

13. The TFT substrate according to claim 11, wherein the CS connecting lower connection section is electrically connected to the second transfer terminal lower connection section, and the CS connecting upper connection section is electrically connected to the second transfer terminal upper connection section.

14. The TFT substrate according to claim 1, wherein each of the plurality of antenna unit regions further includes an upper auxiliary capacitance electrode included in the source metal layer, and electrically connected to the drain electrode, and a lower auxiliary capacitance electrode included in the gate metal layer, and opposite to the upper auxiliary capacitance electrode via the gate insulating layer, the gate metal layer further includes a CS bus line connected to the lower auxiliary capacitance electrode, the TFT substrate further includes a CS terminal section disposed in the non-transmission and non-reception region, and a transfer terminal section, and the CS terminal section includes a CS terminal lower connection section included in the gate metal layer, and electrically connected to the CS bus line, a fourth contact hole formed in the gate insulating layer, the first insulating layer, and the second insulating layer, and at least reaching the CS terminal lower connection section, and a CS terminal upper connection section included in the upper conductive layer, and connected to the CS terminal lower connection section within the fourth contact hole.

15. The TFT substrate according to claim 14, wherein the transfer terminal section includes a first transfer terminal section, the first transfer terminal section including a first transfer terminal lower connection section included in the patch metal layer, a fifth contact hole formed in the second insulating layer, and at least reaching the first transfer terminal lower connection section, and a first transfer terminal upper connection section included in the upper conductive layer, and connected to the first transfer terminal lower connection section within the fifth contact hole.

16. The TFT substrate according to claim 15, wherein the first transfer terminal lower connection section is electrically connected to the CS bus line.

17. The TFT substrate according to claim 15, further comprising:

a common-CS connection section disposed in the non-transmission and non-reception region, wherein the common-CS connection section includes a CS connecting lower connection section included in the gate metal layer, an eighth contact hole formed in the gate insulating layer, the first insulating layer, and the second insulating layer, and at least reaching the CS connecting lower connection section, and a CS connecting upper connection section included in the upper conductive layer, and connected to the CS connecting lower connection section within the eighth contact hole, and the CS connecting lower connection section is electrically connected to the CS bus line, and the CS connecting upper connection section is electrically connected to the first transfer terminal upper connection section.

18. A scanning antenna comprising:

the TFT substrate according to claim 1;

a slot substrate disposed to face the TFT substrate;

a liquid crystal layer provided between the TFT substrate and the slot substrate; and a reflective conductive plate disposed to face a surface of the slot substrate on a side opposite to the liquid crystal layer via a dielectric layer, wherein the slot substrate includes another dielectric substrate and a slot electrode formed on a surface of the another dielectric substrate on a side of the liquid crystal layer, and the slot electrode includes a plurality of slots, the plurality of slots being arranged corresponding to the patch electrodes of the plurality of antenna unit regions of the TFT substrate.

* * * * *